(12) United States Patent
Lee et al.

(10) Patent No.: US 12,174,453 B2
(45) Date of Patent: Dec. 24, 2024

(54) IMAGE SENSOR AND ELECTRONIC APPARATUS INCLUDING THE IMAGE SENSOR

(71) Applicant: SAMSUNG ELECTRONICS CO., LTD., Suwon-si (KR)

(72) Inventors: Sangyun Lee, Yongin-si (KR); Sookyoung Roh, Yongin-si (KR); Seokho Yun, Seoul (KR); Sungmo Ahn, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 262 days.

(21) Appl. No.: 17/947,772

(22) Filed: Sep. 19, 2022

(65) Prior Publication Data

US 2023/0098924 A1    Mar. 30, 2023

(30) Foreign Application Priority Data

Sep. 29, 2021 (KR) .................. 10-2021-0128944
Mar. 29, 2022 (KR) .................. 10-2022-0039179

(51) Int. Cl.
*H04N 25/704* (2023.01)
*G02B 3/00* (2006.01)
(Continued)

(52) U.S. Cl.
CPC ............ *G02B 7/28* (2013.01); *G02B 27/1006* (2013.01); *G02B 27/123* (2013.01); *G03B 13/36* (2013.01);
(Continued)

(58) Field of Classification Search
CPC .... G02B 7/28; G02B 27/1006; G02B 27/123; G02B 3/0043; G03B 13/36; H04N 9/01;
(Continued)

(56) References Cited

U.S. PATENT DOCUMENTS 8,289,422 B2   10/2012  Hiramoto et al.
10,015,426 B2   7/2018  Ishiwata
(Continued)

FOREIGN PATENT DOCUMENTS

CN        105518862 B      4/2019
KR    10-2018-0024604 A    3/2018
(Continued)

OTHER PUBLICATIONS

Communication dated Aug. 22, 2023 issued by the Korean Intellectual Property Office in counterpart Korean Application No. 10-2022-0039179.
(Continued)

*Primary Examiner* — Shahbaz Nazrul
(74) *Attorney, Agent, or Firm* — Sughrue Mion, PLLC

(57) ABSTRACT

An image sensor includes a sensor substrate including first, second, third, and fourth pixels, and a color separating lens array, wherein each of the first pixels includes a first focusing signal region and a second focusing signal region that independently generate focusing signals, and the first focusing signal region and the second focusing signal region are arranged to be adjacent to each other in the first pixel in a first direction, and each of the fourth pixels includes a third focusing signal region and a fourth focusing signal region that independently generate focusing signals, and the third focusing signal region and the fourth focusing signal region are arranged to be adjacent to each other in the fourth pixel in a second direction that is different from the first direction.

31 Claims, 59 Drawing Sheets

(51) Int. Cl.
  *G02B 7/28*    (2021.01)
  *G02B 27/10*   (2006.01)
  *G02B 27/12*   (2006.01)
  *G03B 13/36*   (2021.01)
  *H04N 9/01*    (2023.01)

(52) U.S. Cl.
  CPC ............ H04N 9/01 (2023.01); H04N 25/704 (2023.01); *G02B 3/0043* (2013.01)

(58) Field of Classification Search
  CPC .. H04N 25/704; H04N 23/672; H04N 25/134; H01L 27/14627; H01L 27/1463; H01L 27/14605
  See application file for complete search history.

(56) References Cited

U.S. PATENT DOCUMENTS

| | | | |
|---|---|---|---|
| 10,313,579 B2 | 6/2019 | Kadambala et al. | |
| 2011/0007179 A1 | 1/2011 | Hiramoto et al. | |
| 2012/0206637 A1 | 8/2012 | Hiramoto et al. | |
| 2012/0212656 A1 | 8/2012 | Hiramoto et al. | |
| 2017/0301718 A1 | 10/2017 | Chou et al. | |
| 2017/0366769 A1 | 12/2017 | Mlinar et al. | |
| 2018/0063456 A1 | 3/2018 | Lee | |
| 2020/0186723 A1 | 6/2020 | Kang et al. | |
| 2020/0236313 A1 | 7/2020 | Lee | |
| 2021/0124179 A1 | 4/2021 | Yun et al. | |
| 2021/0126029 A1 | 4/2021 | Roh et al. | |
| 2021/0126030 A1* | 4/2021 | Yun | H01L 27/14607 |
| 2021/0126032 A1* | 4/2021 | Roh | H04N 25/11 |
| 2021/0126035 A1 | 4/2021 | Roh et al. | |
| 2021/0167110 A1* | 6/2021 | Roh | H01L 27/14621 |
| 2022/0137424 A1* | 5/2022 | Lee | H01L 27/1462 257/432 |

FOREIGN PATENT DOCUMENTS

| | | | |
|---|---|---|---|
| KR | 10-2021-0048399 A | 5/2021 | |
| KR | 10-2021-0048401 A | 5/2021 | |
| KR | 10-2021-0048985 A | 5/2021 | |
| KR | 10-2021-0048987 A | 5/2021 | |
| KR | 10-2021-0066705 A | 6/2021 | |
| WO | 2020/175195 A1 | 9/2020 | |

OTHER PUBLICATIONS

Nishiwaki, et al., "Efficient colour splitters for high-pixel-density image sensors", Mar. 2013, Nature Photonics, vol. 7, DOI: 10.1038/NPHOTON.2012.345, 7 pages total.

Communication issued Sep. 29, 2022 by the European Patent Office for European Patent Application No. 22169953.1.

* cited by examiner

FIG. 5A

| 111 | 112 | 111 | 112 |
|-----|-----|-----|-----|
| 113 | 114 | 113 | 114 |
| 111 | 112 | 111 | 112 |
| 113 | 114 | 113 | 114 |

IMAGE SENSOR AND ELECTRONIC APPARATUS INCLUDING THE IMAGE SENSOR

CROSS-REFERENCE TO RELATED APPLICATIONS

This application is based on and claims priority under 35 U.S.C. § 119 to Korean Patent Application No. 10-2021-0128944, filed on Sep. 29, 2021, and Korean Patent Application No. 10-2022-0039179, filed on Mar. 29, 2022, in the Korean Intellectual Property Office, the disclosure of which is incorporated by reference herein in its entirety.

BACKGROUND

1. Field

Provided are an image sensor including a color separating lens array capable of focusing incident light separately according to wavelengths of the incident light, an electronic apparatus including the image sensor, and a method of focusing incident light in the image sensor.

2. Description of the Related Art

Image sensors generally sense the color of incident light by using a color filter. However, a color filter may have low light utilization efficiency because the color filter absorbs light of colors other than the corresponding color of light. For example, when an RGB color filter is used, only ⅓ of the incident light is transmitted therethrough and the other part of the incident light, that is, ⅔ of the incident light, is absorbed. Thus, the light utilization efficiency is only about 33%. Thus, in a color display apparatus or a color image sensor, most light loss occurs in the color filter.

SUMMARY

Provided are an image sensor having improved light utilization efficiency due to use of a color separating lens array capable of focusing incident light separately according to wavelengths of the incident light, an electronic apparatus including the image sensor, and a method of focusing incident light in the image sensor.

Also, provided are an image sensor capable of improving an auto-focusing performance due to inclusion of a color separating lens array, an electronic apparatus including the image sensor, and a method of performing an improved auto-focusing operation.

Additional aspects will be set forth in part in the description which follows and, in part, will be apparent from the description, or may be learned by practice of the presented embodiments of the disclosure.

According to an aspect of the disclosure, there is provided an image sensor including: a sensor substrate including a plurality of first pixels configured to sense light of a first wavelength, a plurality of second pixels configured to sense light of a second wavelength that is different from the first wavelength, a plurality of third pixels configured to sense light of a third wavelength that is different from the first wavelength and the second wavelength, and a plurality of fourth pixels configured to sense the light of the first wavelength; and a color separating lens array configured to: condense the light of the first wavelength onto each of the first pixel and each of the fourth pixels by changing a phase of the light of the first wavelength, condense the light of the second wavelength onto each of the second pixels by changing a phase of the light of the second wavelength, and condense the light of the third wavelength onto each of the third pixels by changing a phase of the light of the third wavelength, wherein each of the first pixels includes a first focusing signal region configured to generate a first focusing signal and a second focusing signal region configured to generate a second focusing signal, wherein the first focusing signal region and the second focusing signal region independently generate the first focusing signal and the second focusing signal, and the first focusing signal region and the second focusing signal region are arranged to be adjacent to each other in the first pixel in a first direction, and each of the fourth pixels includes a third focusing signal region configured to generate a third focusing signal and a fourth focusing signal region configured to generate a fourth focusing signal, wherein the third focusing signal region and the fourth focusing signal region independently generate the third focusing signal and the fourth focusing signal, and the third focusing signal region and the fourth focusing signal region are arranged to be adjacent to each other in the fourth pixel in a second direction that is different from the first direction.

The sensor substrate includes a plurality of unit patterns, and in each of the unit patterns, the first pixels and the fourth pixels are arranged in a first diagonal direction and the second pixels and the third pixels are arranged in a second diagonal direction that is different from the first diagonal direction.

Each of the first pixels includes a first photosensitive cell and a second photosensitive cell that are configured to independently sense light, and the first photosensitive cell and the second photosensitive cell are arranged to divide each of the first pixels into two in the second direction, and wherein the first focusing signal of the first focusing signal region is an output from the first photosensitive cell and the second focusing signal of the second focusing signal region is an output from the second photosensitive cell.

Each of the fourth pixels includes a third photosensitive cell and a fourth photosensitive cell that are configured to independently sense light, and the third photosensitive cell and the fourth photosensitive cell are arranged to divide each of the fourth pixels into two in the first direction, and the third focusing signal of the third focusing signal region is an output from the third photosensitive cell and the fourth focusing signal of the fourth focusing signal region is an output from the fourth photosensitive cell.

Each of the first pixels includes a first photosensitive cell, a second photosensitive cell, a third photosensitive cell, and a fourth photosensitive cell that are configured to independently sense light, and the first photosensitive cell, the second photosensitive cell, the third photosensitive cell and fourth photosensitive cell are respectively arranged in quadrants into which the first pixel is divided in a 2×2 array, and the first focusing signal of the first focusing signal region is a sum of an output from the first photosensitive cell and an output from the third photosensitive cell, and wherein the second focusing signal of the second focusing signal region is a sum of an output from the second photosensitive cell and an output from the fourth photosensitive cell.

Each of the fourth pixels includes a fifth photosensitive cell, a sixth photosensitive cell, a seventh photosensitive cell, and an eighth photosensitive cell that are configured to independently sense light, and the fifth photosensitive cell, the sixth photosensitive cell, the seventh photosensitive cell and the eighth photosensitive cell are respectively arranged in quadrants into which the fourth pixel is divided in a 2×2 array, and the third focusing signal of the third focusing signal region is a sum of an output from the fifth photosensitive cell and an output from the sixth photosensitive cell, and the fourth focusing signal of the fourth focusing signal region is a sum of an output from the seventh photosensitive cell and an output from the eighth photosensitive cell.

The sensor substrate further includes a pixel isolation layer that separates separating the first pixels, the second pixels, the third pixels, and the fourth pixels from each other, and each of the first pixels further includes a first cell isolation layer that separates the first focusing signal region and the second focusing signal region from each other, and each of the fourth pixels further includes a second cell isolation layer that separates the third focusing signal region and the fourth focusing signal region from each other.

The first cell isolation layer extends in the first pixel in the second direction and the second cell isolation layer extends in the fourth pixel in the first direction.

In the first pixels and the fourth pixels located on a center portion of the sensor substrate, the first cell isolation layer is located to pass through a center of the first pixel and the second cell isolation layer is located to pass through a center of the fourth pixel.

In a first pixel, among the first pixels, located at a periphery portion of the sensor substrate in the first direction, the first cell isolation layer is shifted in the first direction toward the center portion of the sensor substrate, and in a fourth pixel, among the fourth pixels, located at the periphery portion of the sensor substrate in the second direction, the second cell isolation layer is shifted in the second direction toward the center portion of the sensor substrate.

Each of the first isolation layer and the second cell isolation layer includes a first direction isolation layer extending in the first direction, and a second direction isolation layer extending in the second direction and intersecting with the first direction isolation layer.

In the first pixels and the fourth pixels located at the center portion of the sensor substrate, a cross point between the first direction isolation layer and the second direction isolation layer is located at the center of the first pixel or the fourth pixel.

In the first pixels and the fourth pixels located at the periphery portion of the sensor substrate in the first direction, a first cross point between the first direction isolation layer and the second direction isolation layer is shifted in the first direction toward the center portion of the sensor substrate, and in the first pixels and the fourth pixels located on a periphery portion of the sensor substrate in the second direction, a second cross point between the first direction isolation layer and the second direction isolation layer is shifted in the second direction toward the center portion of the sensor substrate.

A first height of the first isolation layer and the second cell isolation layer is less than a height of the pixel isolation layer.

The height of the first and second cell isolation layers is about ¼ to about ½ of the height of the pixel isolation layer.

Each of the second pixels includes a fifth focusing signal region configured to generate fifth focusing signal and a sixth focusing signal region configured to generate sixth focusing signal, wherein the fifth focusing signal region and the sixth focusing signal region independently generate the fifth focusing signal and the sixth focusing signal, and the fifth focusing signal region and the sixth focusing signal region are arranged to be adjacent to each other in a first diagonal direction, and each of the third pixels includes a seventh focusing signal region configured to generate seventh focusing signal and an eighth focusing signal region configured to generate eighth focusing signal, wherein the seventh focusing signal region and the eighth focusing signal region independently generate the seventh focusing signal and the eighth focusing signal, and the seventh focusing signal region and the eighth focusing signal region are arranged to be adjacent to each other in the first diagonal direction.

Each of the second pixels includes a first photosensitive cell and a second photosensitive cell that are configured to independently sense light, and the first and second photosensitive cells are arranged to divide each of the second pixels into two in the first diagonal direction, and the fifth focusing signal of the fifth focusing signal region is an output from the first photosensitive cell and the sixth focusing signal of the sixth focusing signal region is an output from the second photosensitive cell.

Each of the third pixels includes a third photosensitive cell and a fourth photosensitive cell that are configured to independently sense light, and the third and fourth photosensitive cells are arranged to divide each of the third pixels into two in the first diagonal direction, and the seventh focusing signal of the seventh focusing signal region is an output from the third photosensitive cell and the eighth focusing signal of the eighth focusing signal region is an output from the fourth photosensitive cell.

Each of the second pixels includes a first photosensitive cell, a second photosensitive cell, a third photosensitive cell, and a fourth photosensitive cell that are configured to independently sense light, and the first photosensitive cell, the second photosensitive cell, the third photosensitive cell, and the fourth photosensitive cell are respectively arranged in quadrants into which the second pixel is divided in a 2×2 array, and the fifth focusing signal of the fifth focusing signal region is an output from the second photosensitive cell and the sixth focusing signal of the sixth focusing signal region is an output from the third photosensitive cell, or the fifth focusing signal of the fifth focusing signal region is an output from the first photosensitive cell and the sixth focusing signal of the sixth focusing signal region is an output from the fourth photosensitive cell.

Each of the third pixels includes a fifth photosensitive cell, a sixth photosensitive cell, a seventh photosensitive cell, and an eighth photosensitive cell that are configured to independently sense light, and the fifth photosensitive cell, the sixth photosensitive cell, the seventh photosensitive cell, and the eighth photosensitive cell are respectively arranged in quadrants into which the third pixel is divided in a 2×2 array, and the seventh focusing signal of the seventh focusing signal region is an output from the sixth photosensitive cell and the eighth focusing signal of the eighth focusing signal region is an output from the seventh photosensitive cell, or the seventh focusing signal of the seventh focusing signal region is an output from the fifth photosensitive cell and the eighth focusing signal of the eighth focusing signal region is an output from the eighth photosensitive cell.

The sensor substrate further includes a pixel isolation layer that separates the first pixels, the second pixels, the third pixels and the fourth pixels from each other, and each of the second pixels further includes a third cell isolation layer that separates the fifth focusing signal region and the sixth focusing signal region from each other, and each of the third pixels further includes a fourth cell isolation layer for separating the seventh focusing signal region and the eighth focusing signal region from each other.

Each of the third cell isolation layer and fourth cell isolation layer extend in the first diagonal direction.

In the second pixels and the third pixels located on a center portion of the sensor substrate, the third cell isolation layer is located to pass through a center of the second pixel and the fourth cell isolation layer is located to pass through a center of the third pixel.

In the second pixels and the third pixels located on the periphery portion of the sensor substrate in a second diagonal direction intersecting with the first diagonal direction, the third cell isolation layer and the fourth cell isolation layer are shifted in the second diagonal direction toward the center portion of the sensor substrate.

The color separating lens array includes a plurality of first pixel corresponding regions corresponding to the plurality of first pixels, a plurality of second pixel corresponding regions corresponding to the plurality of second pixels, a plurality of third pixel regions corresponding to the plurality of third pixels, and a plurality of fourth pixel corresponding regions corresponding to the plurality of fourth pixels, each of the plurality of first pixel corresponding regions, the plurality of second pixel corresponding regions, the plurality of third pixel corresponding regions and the plurality of fourth pixel corresponding regions includes a plurality of nanoposts, the nanoposts in the plurality of second pixel corresponding regions and the plurality of third pixel corresponding regions are arranged in a 4-fold symmetry, and the nanoposts in the plurality of first corresponding regions and the plurality of fourth pixel corresponding regions are arranged in a 2-fold symmetry.

According to an aspect of the disclosure, there is provided an electronic apparatus including: an image sensor configured to convert an optical image into an electrical signal; a processor configured to control operations of the image sensor and to store and output a signal generated by the image sensor; and a lens assembly for providing light from an object to the image sensor, wherein the image sensor includes: a sensor substrate including a plurality of first pixels configured to sense light of a first wavelength, a plurality of second pixels configured to sense light of a second wavelength that is different from the first wavelength, a plurality of third pixels configured to sense light of a third wavelength that is different from the first wavelength and the second wavelength, and a plurality of fourth pixels configured to sense the light of the first wavelength; and a color separating lens array configured to: condense the light of the first wavelength onto each of the first pixel and each of the fourth pixels by changing a phase of the light of the first wavelength, condense the light of the second wavelength onto each of the second pixels by changing a phase of the light of the second wavelength, and condense the light of the third wavelength onto each of the third pixels by changing a phase of the light of the third wavelength, wherein each of the first pixels includes a first focusing signal region configured to generate a first focusing signal and a second focusing signal region configured to generate a second focusing signal, wherein the first focusing signal region and the second focusing signal region independently generate the first focusing signal and the second focusing signal, and the first focusing signal region and the second focusing signal region are arranged to be adjacent to each other in the first pixel in a first direction, and each of the fourth pixels includes a third focusing signal region configured to generate a third focusing signal and a fourth focusing signal region configured to generate a fourth focusing signal, wherein the third focusing signal region and the fourth focusing signal region independently generate the third focusing signal and the fourth focusing signal, and the third focusing signal region and the fourth focusing signal region are arranged to be adjacent to each other in the fourth pixel in a second direction that is different from the first direction.

According to an aspect of the disclosure, there is provided an image sensor including: a sensor substrate including a plurality of first pixels configured to sense light of a first wavelength, a plurality of second pixels configured to sense light of a second wavelength that is different from the first wavelength, a plurality of third pixels configured to sense light of a third wavelength that is different from the first wavelength and the second wavelength, and a plurality of fourth pixels configured to sense the light of the first wavelength; and a color separating lens array configured to: direct the light of the first wavelength onto each of the first pixel and each of the fourth pixels by changing a phase of the light of the first wavelength, direct the light of the second wavelength onto each of the second pixels by changing a phase of the light of the second wavelength, and direct the light of the third wavelength onto each of the third pixels by changing a phase of the light of the third wavelength, wherein at least one of the first pixels, the second pixels, the third pixels or the fourth pixels includes a first focusing signal region configured to generate a first focusing signal and a second focusing signal region configured to generate a second focusing signal.

The first focusing signal and the second focusing signal region configured to generate the first focusing signal and the second focusing signal independently of each other.

In the first pixels the first focusing signal region and the second focusing signal region are arranged adjacent to each other in a first direction, and in the fourth pixels the first focusing signal region and the second focusing signal region are arranged adjacent to each other in a second direction different from the first direction.

In the second pixels or the third pixels, the first focusing signal region and the second focusing signal region are arranged adjacent to each other in a third direction different from the first direction and the second direction.

The first direction is perpendicular to the second direction.

According to an aspect of the disclosure, there is provided an image sensor including: a sensor substrate including a plurality of first pixels configured to sense light of a first wavelength, a plurality of second pixels configured to sense light of a second wavelength that is different from the first wavelength, a plurality of third pixels configured to sense light of a third wavelength that is different from the first wavelength and the second wavelength, and a plurality of fourth pixels configured to sense the light of the first wavelength; and a color separating lens array including a plurality of first pixel corresponding regions corresponding to the plurality of first pixels, a plurality of second pixel corresponding regions corresponding to the plurality of second pixels, a plurality of third pixel regions corresponding to the plurality of third pixels, and a plurality of fourth pixel corresponding regions corresponding to the plurality of fourth pixels, wherein the plurality of first pixel corresponding regions and the plurality of fourth pixel regions include a plurality of nanoposts, an arrangement of the plurality of nanoposts in the plurality of first pixel corresponding regions being rotated by 90° with respect to an arrangement of the plurality of nanoposts in the plurality of fourth pixel corresponding regions, each of the first pixels includes a first focusing signal region and a second focusing signal region that generate focusing signals independently from each other, and the first focusing signal region and the second focusing signal region are arranged to be adjacent to each other in a first direction in the first pixel, and each of the fourth pixels includes a third focusing signal region and a fourth focusing signal region that generate focusing signals independently from each other, and the third focusing signal region and the fourth focusing signal region are arranged to be adjacent to each other in a second direction that is perpendicular to the first direction in the fourth pixel.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
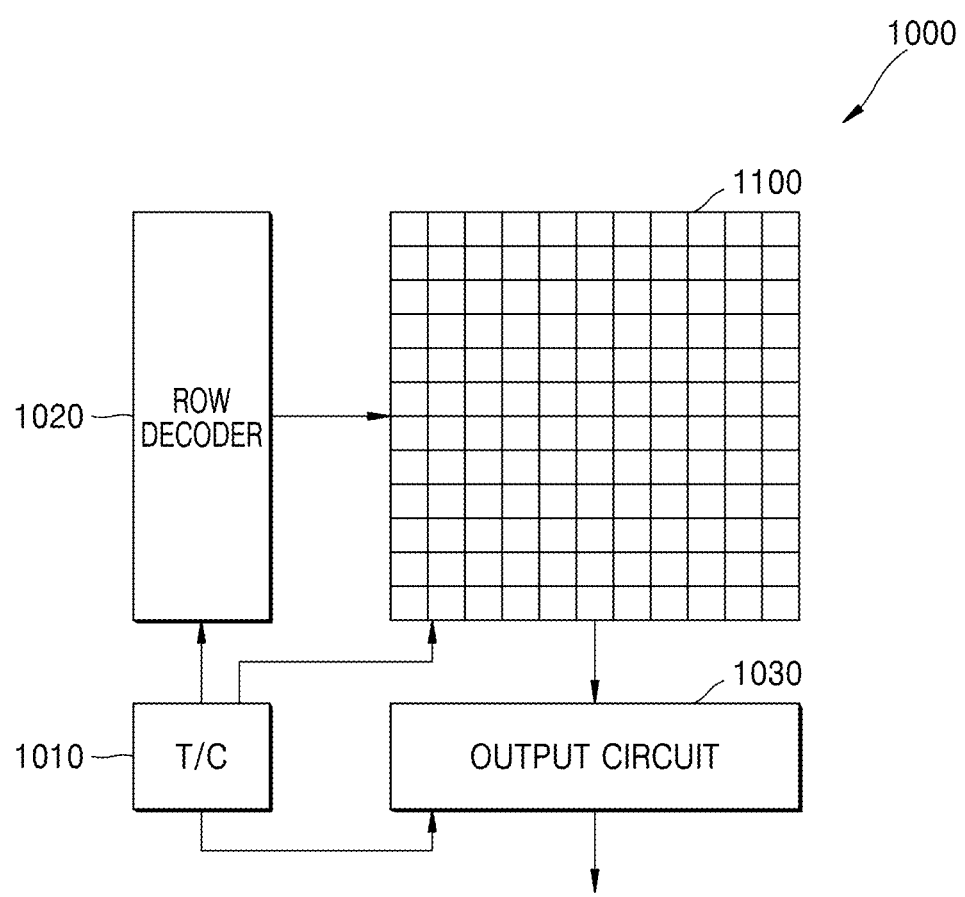
FIG. 1 is a block diagram of an image sensor according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, an image sensor including a color separating lens array, an electronic apparatus including the image sensor, and method for focusing the light in the electronic apparatus will be described in detail with reference to accompanying drawings. The example embodiments of the disclosure are capable of various modifications and may be embodied in many different forms. In the drawings, like reference numerals denote like components, and sizes of components in the drawings may be exaggerated for convenience of explanation.

When a layer, a film, a region, or a panel is referred to as being "on" another element, it may be directly on/under/at left/right sides of the other layer or substrate, or intervening layers may also be present.

It will be understood that although the terms "first," "second," etc. may be used herein to describe various components, these components should not be limited by these terms. These components are only used to distinguish one component from another. These terms do not limit that materials or structures of components are different from one another.

An expression used in the singular encompasses the expression of the plural, unless it has a clearly different meaning in the context. It will be further understood that when a portion is referred to as "comprises" another component, the portion may not exclude another component but may further comprise another component unless the context states otherwise.

In addition, the terms such as " . . . unit", "module", etc. provided herein indicates a unit performing at least one function or operation, and may be realized by hardware, software, or a combination of hardware and software.

The use of the terms of "the above-described" and similar indicative terms may correspond to both the singular forms and the plural forms.

Also, the steps of all methods described herein may be performed in any suitable order unless otherwise indicated herein or otherwise clearly contradicted by context. Also, the use of all exemplary terms (for example, etc.) is only to describe a technical spirit in detail, and the scope of rights is not limited by these terms unless the context is limited by the claims.

FIG. 1 is a block diagram of an image sensor 1000 according to an example embodiment. Referring to FIG. 1, the image sensor 1000 may include a pixel array 1100, a timing controller (T/C) 1010, a row decoder 1020, and an output circuit 1030. The image sensor 1000 may include a charge-coupled device (CCD) image sensor or a complementary metal oxide semiconductor (CMOS) image sensor.

The pixel array 1100 includes pixels that are two-dimensionally arranged in a plurality of rows and columns. The row decoder 1020 selects one of the rows in the pixel array 1100 in response to a row address signal output from the timing controller 1010. The output circuit 1030 outputs a photosensitive signal, in a column unit, from a plurality of pixels arranged in the selected row. To this end, the output circuit 1030 may include a column decoder and an analog-to-digital converter (ADC). For example, the output circuit 1030 may include a column decoder and a plurality of ADCs provided respectively for the columns in the pixel array 1100 or one ADC provided at an output end of the column decoder. Alternatively, the output circuit 1030 may output photosensitive signals simultaneously from all the pixels in the pixel array 1100. The timing controller 1010, the row decoder 1020, and the output circuit 1030 may be implemented as one chip or in separate chips. A processor for processing an image signal output from the output circuit 1030 may be implemented as one chip with the timing controller 1010, the row decoder 1020, and the output circuit 1030. According to an example embodiment, the image sensor may include other components in additional to the pixel array 1100, the timing controller (T/C) 1010, the row decoder 1020, and the output circuit 1030.

Figure 2:
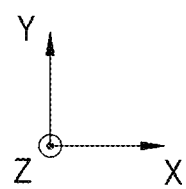
FIG. 2 is a diagram showing an example of a pixel arrangement in a pixel array of an image sensor.

The pixel array 1100 may include a plurality of pixels that sense light of different wavelengths. The pixel arrangement may be implemented in various ways. For example, FIG. 2 shows an example of a pixel arrangement in the pixel array 1100 of the image sensor 1000. FIG. 2 shows a Bayer pattern that is generally adopted in the image sensor 1000. Referring to FIG. 2, one unit pattern includes four quadrant regions, in which, a first quadrant may be the blue pixel B, a second quadrant may be the green pixel G, a third quadrant may be the red pixel R, and a fourth quadrant may be the green pixel G. Otherwise, one unit pattern may be referred to as a pixel, and first to fourth quadrants in the pixel may be respectively referred to as a blue sub-pixel, a green sub-pixel, a red sub-pixel, and a green sub-pixel. Hereinafter, for consistency of terminologies, it will be described that a minimum unit outputting an image signal for each color is referred to as a pixel, and four pixels arranged adjacent to the first to fourth quadrants, that is, the blue pixel B, the green pixel G, the red pixel R, and the green pixel G, form unit pattern. The unit patterns may be repeatedly and two-dimensionally arranged in a first direction (X direction) and a second direction (Y direction). In other words, two green pixels G are arranged in one diagonal direction and one blue pixel B and one red pixel R are arranged in another diagonal direction in a unit pattern of a 2×2 array. In the entire arrangement of pixels, a first row in which a plurality of green pixels G and a plurality of blue pixels B are alternately arranged in the first direction and a second row in which a plurality of red pixels R and a plurality of green pixels G are alternately arranged in the first direction are repeatedly arranged in a second direction. Hereinafter, it will be described that the pixel array 1100 of the image sensor 1000 has a Bayer pattern, but the operating principles may be applied to other patterns of pixel arrangement than the Bayer pattern.

Figure 3A:
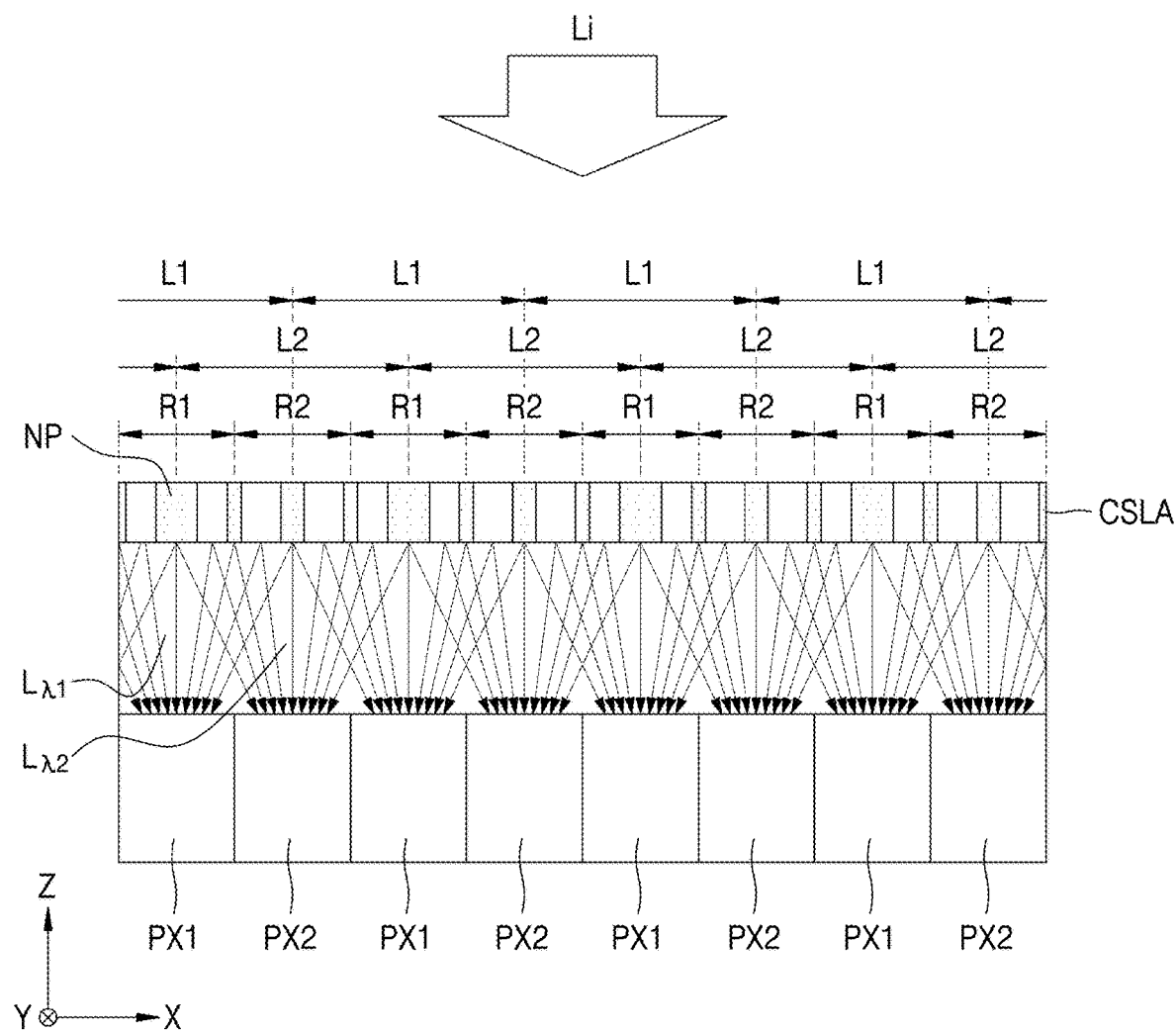
FIGS. 3A and 3B are conceptual diagrams showing a structure and operations of a color separating lens array according to an example embodiment.
Figure 3B:
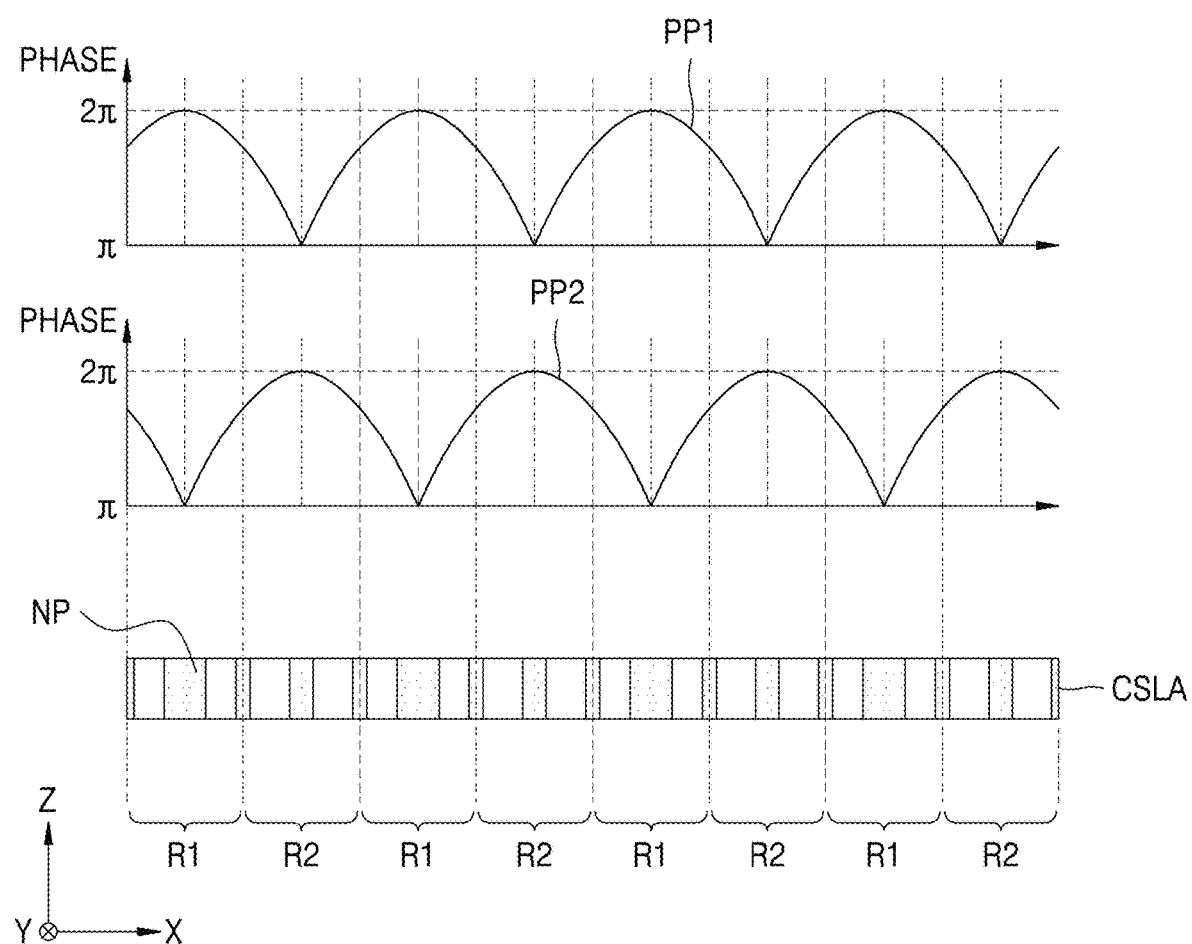

The image sensor 1000 may include a color separating lens array for condensing light of a color corresponding to a certain pixel in the pixel array 1100. FIGS. 3A and 3B are diagrams showing a structure and operations of the color separating lens array.

Referring to FIG. 3A, a color separating lens array CSLA may include a plurality of nanoposts NP that change a phase of incident light Li differently according to a location in an individual pixel corresponding region that will be described later. The color separating lens array CSLA may be partitioned in various ways. For example, the color separating lens array CSLA may be partitioned as a first pixel corresponding region R1 corresponding to a first pixel PX1 on which first wavelength light $L_{\lambda1}$ included in the incident light Li is condensed, and a second pixel corresponding region R2 corresponding to a second pixel PX2 on which second wavelength light $L_{\lambda2}$ included in the incident light Li is condensed. Each of the first and second pixel corresponding regions R1 and R2 may include one or more nanoposts NP, and the first and second pixel corresponding regions R1 and R2 may respectively face the first and second pixels PX1 and PX2. In another example, the color separating lens array CSLA may be partitioned as a first wavelength light condensing region L1 for condensing the first wavelength light $L_{\lambda 1}$ onto the first pixel PX1 and a second wavelength light condensing region L2 for condensing the second wavelength light $L_{\lambda 2}$ onto the second pixel PX2. The first and second wavelength light condensing regions L1 and L2 may partially overlap each other.

The color separating lens array CSLA may generate different phase profiles of the first wavelength light $L_{\lambda 1}$ and the second wavelength light $L_{\lambda 2}$ included in the incident light Li so that the first wavelength light $L_{\lambda 1}$ may be condensed onto the first pixel PX1 and the second wavelength light $L_{\lambda 2}$ may be condensed onto the second pixel PX2.

For example, referring to FIG. 3B, the color separating lens array CSLA may allow the first wavelength light $L_{\lambda 1}$ to have a first phase profile PP1 and the second wavelength light $L_{\lambda 2}$ to have a second phase profile PP2 at a position immediately after passing through the color separating lens array CSLA, e.g., on a lower surface of the color separating lens array CSLA, such that the first wavelength light $L_{\lambda 1}$ and the second wavelength light $L_{\lambda 2}$ may be respectively condensed on the corresponding first pixel PX1 and the second pixel PX2. In detail, the first wavelength light $L_{\lambda 1}$ that has passed through the color separating lens array CSLA may have the first phase profile PP1 that is largest at the center of the first pixel corresponding region R1 and reduces away from the center of the first pixel corresponding region R1, that is, toward the second pixel corresponding regions R2. Such a phase profile is similar to a phase profile of light converging to one point after passing through a convex lens, e.g., a micro-lens having a convex center in the first wavelength light condensing region L1, and the first wavelength light $L_{\lambda 1}$ may be condensed onto the first pixel PX1. Also, the second wavelength light $L_{\lambda 2}$ that has passed through the color separating lens array CSLA has the second phase profile PP2 that is largest at the center of the second pixel corresponding region R2 and reduces away from the center of the second pixel corresponding region R2, e.g., toward the first pixel corresponding regions R1, and thus, the second wavelength light $L_{\lambda 2}$ may be condensed onto the second pixel PX2.

Because a refractive index of a material varies depending on a wavelength of light, and as shown in FIG. 3B, the color separating lens array CSLA may provide different phase profiles with respect to the first and second wavelength light $L_{\lambda 1}$ and $L_{\lambda 2}$. In other words, because the same material has a different refractive index according to the wavelength of light reacting with the material and a phase delay of the light that passes through the material is different according to the wavelength, the phase profile may vary depending on the wavelength. For example, a refractive index of the first pixel corresponding region R1 with respect to the first wavelength light $L_{\lambda 1}$ and a refractive index of the first pixel corresponding region R1 with respect to the second wavelength light $L_{\lambda 2}$ may be different from each other, and the phase delay of the first wavelength light $L_{\lambda 1}$ that passed through the first pixel corresponding region R1 and the phase delay of the second wavelength light $L_{\lambda 2}$ that passed through the first pixel corresponding region R1 may be different from each other. Therefore, when the color separating lens array CSLA is designed based on the characteristics of light, different phase profiles may be provided with respect to the first wavelength light $L_{\lambda 1}$ and the second wavelength light $L_{\lambda 2}$.

The color separating lens array CSLA may include nanoposts NP that are arranged according to a certain rule such that the first and second wavelength light $L_{\lambda 1}$ and $L_{\lambda 2}$ may respectively have the first and second phase profiles PP1 and PP2. Here, the rule may be applied to parameters, such as the shape of the nanoposts NP, sizes (width and height), a distance between the nanoposts NP, and the arrangement form thereof, and these parameters may be determined according to a phase profile to be implemented by the color separating lens array CSLA.

A rule in which the nanoposts NP are arranged in the first pixel corresponding region R1, and a rule in which the nanoposts NP are arranged in the second pixel corresponding region R2 may be different from each other. In other words, sizes, shapes, intervals, and/or arrangement of the nanoposts NP in the first pixel corresponding region R1 may be different from those of the nanoposts NP in the second pixel corresponding region R2.

A cross-sectional diameter of the nanoposts NP may have sub-wavelength dimension. Here, the sub-wavelength refers to a wavelength that is less than a wavelength band of light to be branched. The nanoposts NP may have a dimension that is less than a shorter wavelength of the first wavelength and the second wavelength. When the incident light Li is a visible ray, the cross-sectional diameter of the nanoposts NP may be less than, for example, 400 nm, 300 nm, or 200 nm. In addition, a height of the nanoposts NP may be about 500 nm to about 1500 nm, which is greater than the cross-sectional diameter of the nanopost. Although not shown in the drawings, the nanoposts NP may be obtained by combining two or more posts stacked in a third direction, e.g., a height direction (Z direction).

The nanoposts NP may include a material having a higher refractive index than that of a peripheral material. For example, the nanoposts NP may include c-Si, p-Si, a-Si and a Group III-V compound semiconductor (GaP, GaN, GaAs etc.), SiC, $TiO_2$, SiN, and/or a combination thereof. The nanoposts NP having a different refractive index from the refractive index of the peripheral material may change the phase of light that passes through the nanoposts NP. This is caused by phase delay that occurs due to the shape dimension of the sub-wavelength of the nanoposts NP, and a degree at which the phase is delayed, may be determined by a detailed shape dimension and arrangement shape of the nanoposts NP. A peripheral material of the nanoposts NP may include a dielectric material having a less refractive index than that of the nanoposts NP. For example, the peripheral material may include $SiO_2$ or air.

A first wavelength λ1 and a second wavelength λ2 may be in a wavelength band of infrared rays and visible rays. However, one or more embodiments are not limited thereto, and a variety of wavelength bands may be implemented according to the rule of arrays of the plurality of nanoposts NP. Also, two wavelengths are branched and condensed as an example. However, embodiments are not limited thereto. The incident light may be branched into three directions or more according to wavelengths and condensed.

Also, the color separating lens array CSLA includes one single layer, but the color separating lens array CSLA may have a structure in which a plurality of layers are stacked.

Hereinafter, an example in which the color separating lens array CSLA described above is applied to the pixel array 1100 of the image sensor 1000.

Figure 4A:
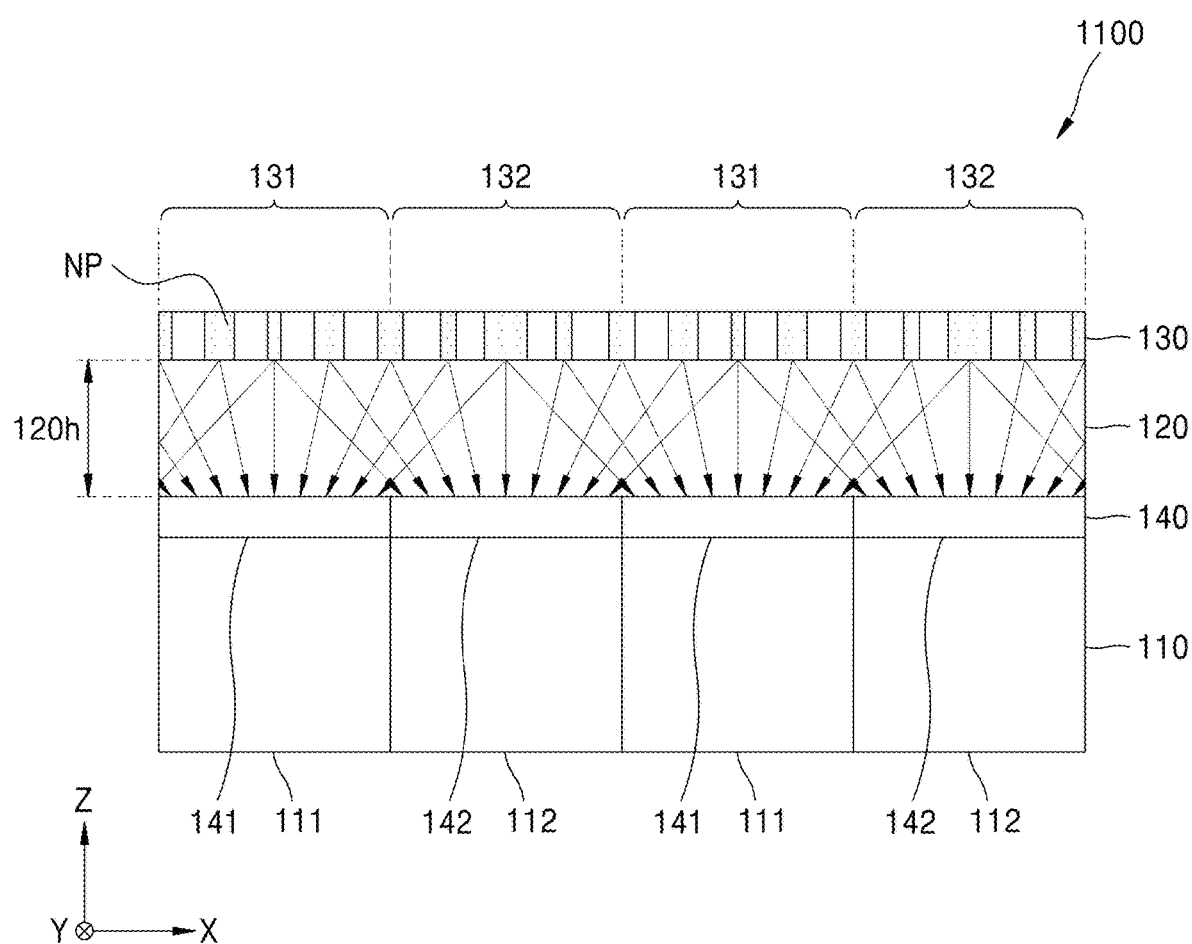
FIGS. 4A and 4B are cross-sectional views of different cross-sections of a pixel array in an image sensor according to an example embodiment.
Figure 4B:
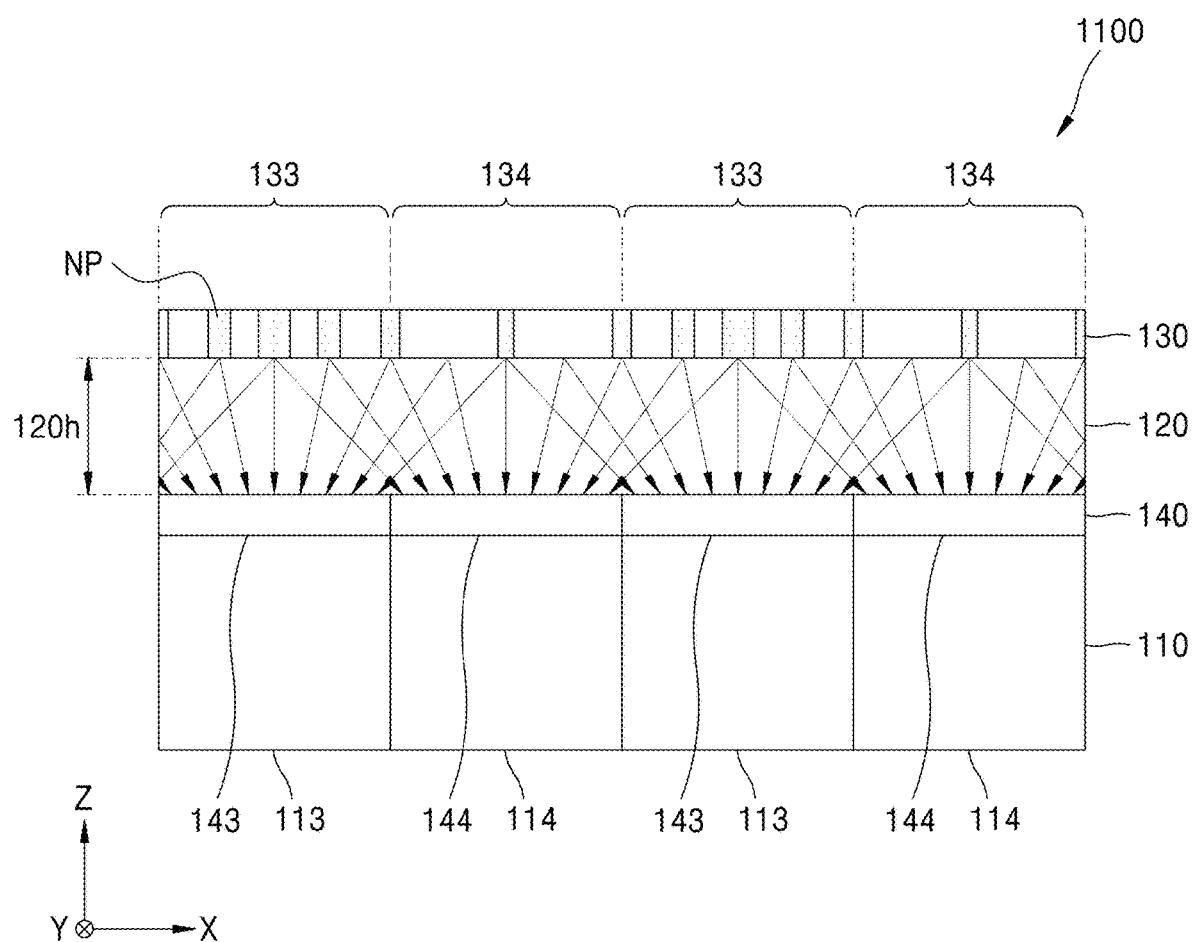

FIGS. 4A and 4B are cross-sectional views of the pixel array 1100 in the image sensor 1000 seen from different sections, FIG. 5A is a plan view showing an arrangement of pixels in the pixel array 1100 of the image sensor 1000, FIG.

Figure 5B:
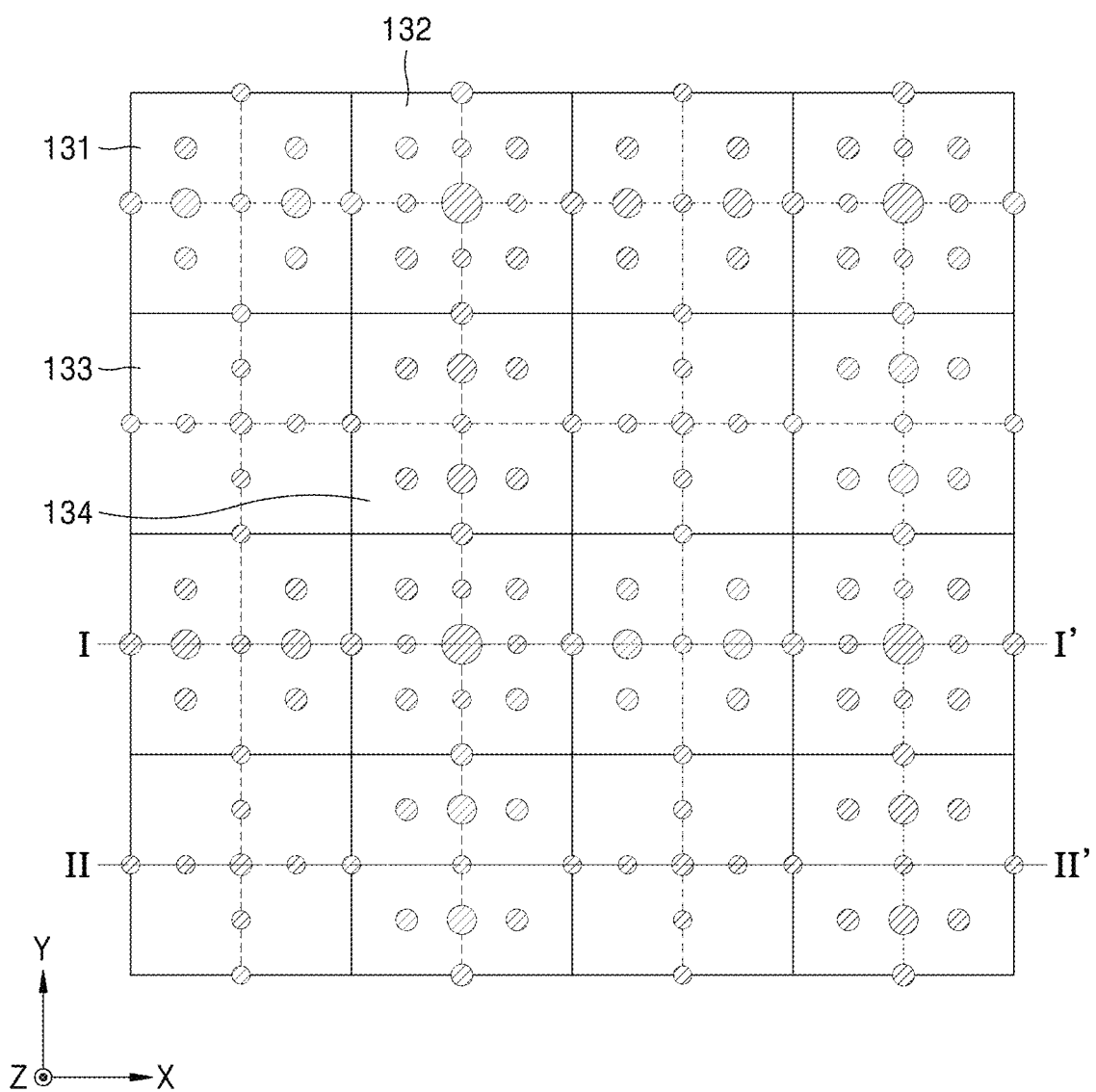
FIG. 5B is a plan view showing an example of arranging a plurality of nanoposts in a plurality of regions of a color separating lens array.
Figure 5C:
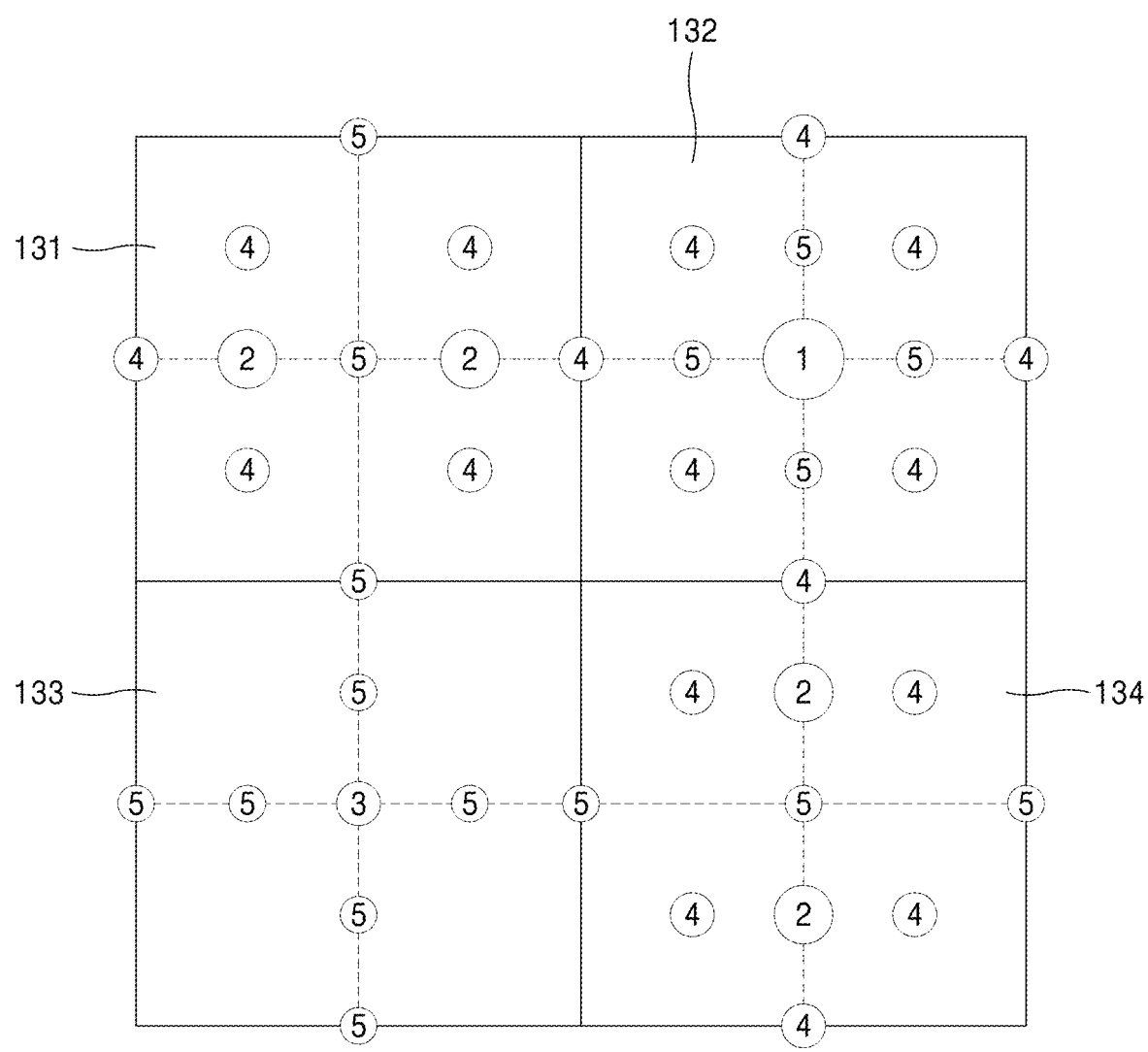
FIG. 5C is a plan view showing an enlarged view of a part in FIG. 5B, and FIGS. 5D and 5E are plan views showing examples of other various shapes of the color separating lens array.

5B is a plan view showing an example in which a plurality of nanoposts are arranged in a plurality of regions of the color separating lens array in the pixel array 1100 of the image sensor 1000, and FIG. 5C is a plan view showing an enlarged view of a part in FIG. 5B.

Referring to FIGS. 4A and 4B, the pixel array 1100 of the image sensor 1000 includes a sensor substrate 110 including a plurality of pixels 111, 112, 113, and 114 for sensing light, a spacer layer 120 that is transparent and disposed on the sensor substrate 110, and a color separating lens array 130 on the spacer layer 120. The sensor substrate 110 may include a first pixel 111, a second pixel 112, and a third pixel 113, and a fourth pixel 114 that convert light into electrical signals. As shown in FIG. 4A, the first pixel 111 and the second pixel 112 may be alternately arranged in the first direction (X-direction). In a cross-section in which y-direction location is different from FIG. 4A, the third pixel 113 and the fourth pixel 114 may be alternately arranged, as shown in FIG. 4B. Although not shown in the drawings, a pixel isolation layer for separating pixels may be further formed on a boundary between pixels.

FIG. 5A shows the arrangement of pixels when the pixel array 1100 of the image sensor 1000 has the Bayer pattern arrangement as shown in FIG. 2. The above arrangement is provided for separately sensing the incident light with unit patterns such as the Bayer pattern. For example, the first and fourth pixels 111 and 114 may sense green light, the second pixel 112 may sense blue light, and the third pixel 113 may sense red light. Two green pixels, e.g., the first pixel 111 and the fourth pixel 114, are arranged in one diagonal direction, and the blue pixel and the red pixel, e.g., the second pixel 112 and the third pixel 113, may be arranged in another diagonal direction in a unit pattern of a 2×2 array.

Also, the pixel array 1100 of the image sensor 1000 may further include a color filter array 140 between the sensor substrate 110 and the spacer layer 120. In this case, the color filter array 140 is arranged on the sensor substrate 110, and the spacer layer 120 may be on the color filter array 140. The color filter array 140 may include a first color filter 141 on the first pixel 111, a second color filter 142 on the second pixel 112, a third color filter 143 on the third pixel 113, and a fourth color filter 144 on the fourth pixel 114. For example, the first color filter 141 and the fourth color filter 144 may be green color filters only transmitting the green light, the second color filter 142 may be a blue color filter only transmitting the blue light, and the third color filter 143 may be a red color filter only transmitting the red light. Because the light that has been substantially color-separated by the color separating lens array 130 proceeds toward the first to fourth pixels 111, 112, 113, and 114, there may be a little light loss even when the color filter array 140 is used. When the color filter array 140 is used, a color purity of the image sensor 1000 may be further improved. However, the color filter array 140 is not an essential element, and may be omitted provided that a color separating efficiency of the color separating lens array 130 is sufficiently high.

The spacer layer 120 is disposed between the sensor substrate 110 and the color separating lens array 130 in order to maintain a distance between the sensor substrate 110 and the color separating lens array 130 constant. The spacer layer 120 may include a material transparent with respect to the visible ray, for example, a dielectric material having a lower refractive index than that of the nanoposts NP and low absorption coefficient in the visible ray band, e.g., $SiO_2$, siloxane-based spin on glass (SOG), etc. A thickness $120h$ of the spacer layer 120 may be determined based on a focal distance of the light condensed by the color separating lens array 130, for example, may be about ½ of a focal distance of the light of a reference wavelength $\lambda_0$. A focal distance f of the reference wavelength light $\lambda_0$ condensed by the color separating lens array 130 may be expressed by equation 1 below, when a refractive index of the spacer layer 120 with respect to the reference wavelength $\lambda_0$ is n and a pitch between pixels is p.

$$f = \frac{np^2}{\lambda_0} - \frac{\lambda_0}{4n} \qquad \text{[Equation 1]}$$

Assuming that the reference wavelength $\lambda_0$ is 540 nm, e.g., green light, the pitch of the pixels 111, 112, 113, and 114 is 0.8 μm, and a refractive index n of the spacer layer 120 at the wavelength of 540 nm is 1.46, the focal distance f of the green light, that is, a distance between a lower surface of the color separating lens array 130 and a point where the green light is converged, is about 1.64 μm and a thickness $120h$ of the spacer layer 120 may be about 0.82 μm. In another example, assuming that the reference wavelength $\lambda_0$ is 540 nm, e.g., green light, the pitch of the pixels 111, 112, 113, and 114 is 1.2 μm, and a refractive index n of the spacer layer 120 at the wavelength of 540 nm is 1.46, the focal distance f of the green light is about 3.80 μm and the thickness $120h$ of the spacer layer 120 may be about 1.90 μm. In other words, the thickness $120h$ of the spacer layer 120 described above may be about 70% to about 120% of the pixel pitch when the pixel pitch is about 0.5 μm to about 0.9 μm, and may be about 110% to about 180% of the pixel pitch when the pixel pitch is about 0.9 μm to about 1.3 μm.

The color separating lens array 130 may include the nanoposts NP supported by the spacer layer 120 and changing a phase of the incident light, and a dielectric material between the nanoposts NP and having a refractive index less than that of the nanoposts NP, e.g., air or $SiO_2$.

Referring to FIG. 5B, the color separating lens array 130 may be partitioned into four pixel corresponding regions 131, 132, 133, and 134 corresponding to the pixels 111, 112, 113, and 114 of FIG. 5A. A first pixel corresponding region 131 corresponds to the first pixel 111 and may be on the first pixel 111 in a vertical direction, a second pixel corresponding region 132 corresponds to the second pixel 112 and may be on the second pixel 112 in the vertical direction, a third pixel corresponding region 133 corresponds to the third pixel 113 and may be on the third pixel 113 in the vertical direction, and a fourth pixel corresponding region 134 corresponds to the fourth pixel 114 and may be on the fourth pixel 114 in the vertical direction. That is, the first to fourth pixel corresponding regions 131, 132, 133, and 134 of the color separating lens array 130 may be arranged to face the corresponding first to fourth pixels 111, 112, 113, and 114 of the sensor substrate 110 in the vertical direction. The first to fourth pixel corresponding regions 131, 132, 133, and 134 may be two-dimensionally arranged in the first direction (X-direction) and the second direction (Y-direction), such that a first row in which the first pixel corresponding region 131 and the second pixel corresponding region 132 are alternately arranged and a second row in which the third pixel corresponding region 133 and the fourth pixel corresponding region 134 are alternately arranged are alternately repeated. The color separating lens array 130 includes a plurality of unit patterns that are two-dimensionally arranged like the pixel array of the sensor substrate 110, and each of the unit patterns includes the pixel corresponding regions (e.g., first green pixel corresponding region, blue pixel corresponding region, red pixel corresponding region, and a second green pixel corresponding region) 131, 132, 133, and 134 arranged in a 2×2 array.

In addition, similar to the above description with reference to FIG. 3B, the color separating lens array 130 may be partitioned as a green light condensing region for condensing the green light, a blue light condensing region for condensing the blue light, and a red light condensing region for condensing the red light.

The color separating lens array 130 may include the nanoposts NP, of which sizes, shapes, intervals, and/or arrangements are defined, such that the green light is separately condensed to the first and fourth pixels 111 and 114, the blue light is separately condensed to the second pixel 112, and the red light is separately condensed to the third pixel 113. In addition, a thickness of the color separating lens array 130 in a third direction (Z direction) may be similar to heights of the nanoposts NP, and may be about 500 nm to about 1500 nm.

Referring to FIG. 5B, the first to fourth pixel corresponding regions 131, 132, 133, and 134 may include the nanoposts NP having cylindrical shapes each having a circular cross-section. In a center portion of each region, the nanoposts NP having different cross-sectional areas are disposed, and the nanoposts NP may be also disposed at the center on a boundary between pixels and a crossing point between the pixel boundaries.

FIG. 5C shows the arrangement of the nanoposts NP included in partial regions of FIG. 5B, that is, the pixel corresponding regions 131, 132, 133, and 134 in the unit pattern. In FIG. 5C, the nanoposts NP are indicated by 1 to 5 according to sizes of the cross-section of the unit pattern. Referring to FIG. 5C, from among the nanoposts NP, a nanopost 1 having the largest cross-sectional area is at the center of the second pixel corresponding region 132, and nanoposts 5 having the smallest cross-sectional area may be arranged around the nanopost 1 and nanoposts 3 and at centers of the first and fourth pixel corresponding regions 131 and 134. However, one or more embodiments are not limited to the above example, and if necessary, the nanoposts NP having various shapes, sizes, and arrangement may be applied.

The nanoposts NP included in the first and fourth pixel corresponding regions 131 and 134 may have different distribution rules in the first direction (X direction) and the second direction (Y direction). For example, the nanoposts NP arranged in the first and fourth pixel corresponding regions 131 and 134 may have different size arrangement in the first direction (X direction) and the second direction (Y direction). As shown in FIG. 5C, from among the nanoposts NP, a cross-sectional area of a nanopost 4 located at a boundary between the first pixel corresponding region 131 and the second pixel corresponding region 132 that is adjacent to the first pixel corresponding region 131 in the first direction (X direction) is different from that of the nanoposts 5 located at a boundary between the first pixel corresponding region 131 and the third pixel corresponding region 133 that is adjacent to the first pixel corresponding region 131 in the second direction (Y direction). Likewise, a cross-sectional area of the nanopost 5 located at a boundary between the fourth pixel corresponding region 134 and the third pixel corresponding region 133 that is adjacent to the fourth pixel corresponding region 134 in the first direction (X direction) is different from that of the nanopost 4 located at a boundary between the fourth pixel corresponding region 134 and the second pixel corresponding region 132 that is adjacent to the fourth pixel corresponding region 134 in the second direction (Y direction).

On the other hand, the nanoposts NP arranged in the second pixel corresponding region 132 and the third pixel corresponding region 133 may have symmetrical arrangement rules along the first direction (X direction) and the second direction (Y direction). As shown in FIG. 5C, from among the nanoposts NP, the cross-sectional area of the nanoposts 4 at a boundary between the second pixel corresponding region 132 and adjacent pixels in the first direction (X direction) and the cross-sectional areas of the nanoposts 4 at a boundary between the second pixel corresponding region 132 and the adjacent pixels in the second direction (Y direction) are the same as each other, and in the third pixel corresponding region 133, the cross-sectional areas of the nanoposts 5 at a boundary between adjacent pixels in the first direction (X direction) and the cross-sectional areas of the nanoposts 5 at a boundary between the adjacent pixels in the second direction (Y direction) are the same as each other.

The above distribution is caused due to the pixel arrangement in the Bayer pattern. Pixels adjacent to the second pixel 112 and the third pixel 113 in the first direction (X-direction) and the second direction (Y-direction) are the same, e.g., the green pixels. However, a pixel adjacent to the first pixel 111 in the first direction (X-direction) is a blue pixel and a pixel adjacent to the first pixel 111 in the second direction (Y-direction) is a red pixel, and a pixel adjacent to the fourth pixel 114 in the first direction (X-direction) is a red pixel and a pixel adjacent to the fourth pixel 114 in the second direction (Y-direction) is a blue pixel. In addition, adjacent pixels to the first and fourth pixels 111 and 114 in four diagonal directions are green pixels, adjacent pixels to the second pixel 112 in the four diagonal directions are the red pixels, and adjacent pixels to the third pixel 113 in the four diagonal directions are the blue pixels. Therefore, in the second and third pixel corresponding regions 132 and 133, the nanoposts NP are arranged in a 4-fold symmetry, and in the first and fourth pixel corresponding regions 131 and 134, the nanoposts NP may be arranged in a 2-fold symmetry. In particular, the first pixel corresponding region 131 and the fourth pixel corresponding region 134 are rotated by 90° angle with respect to each other.

The plurality of nanoposts NP have symmetrical circular cross-sectional shapes in FIGS. 5B and 5C. However, some nanoposts having asymmetrical cross-sectional shapes may be included. For example, the first and fourth pixel corresponding regions 131 and 134 may adopt the nanoposts having asymmetrical cross-sections, each of which has different widths in the first direction (X direction) and the second direction (Y direction), and the second and third pixel corresponding regions 132 and 133 may adopt the nanoposts having symmetrical cross-sections, each of which has the same widths in the first direction (X direction) and the second direction (Y direction). The arrangement rule of the nanoposts NP is an example, and is not limited thereto.

The color separating lens array 130 shown in FIGS. 5B and 5C is an example, and the color separating lens arrays of various shapes may be obtained through the above-described optimized design according to the size and thickness of the color separating lens array, a color characteristic, the pixel pitch of the image sensor to which the color separating lens array is to be applied, a distance between the color separating lens array and the image sensor, an incident angle of the incident light, etc. Also, the color separating lens array may be implemented by other various patterns, instead of the nanoposts. For example, FIG. 5D is a plan view exemplarily showing a shape of a unit pattern in a color separating lens array according to another embodiment, which may be applied to an image sensor of Bayer pattern type, and FIG. 5E is a plan view exemplarily showing a shape of a unit pattern in a color separating lens array according to another embodiment.

Figure 5D:
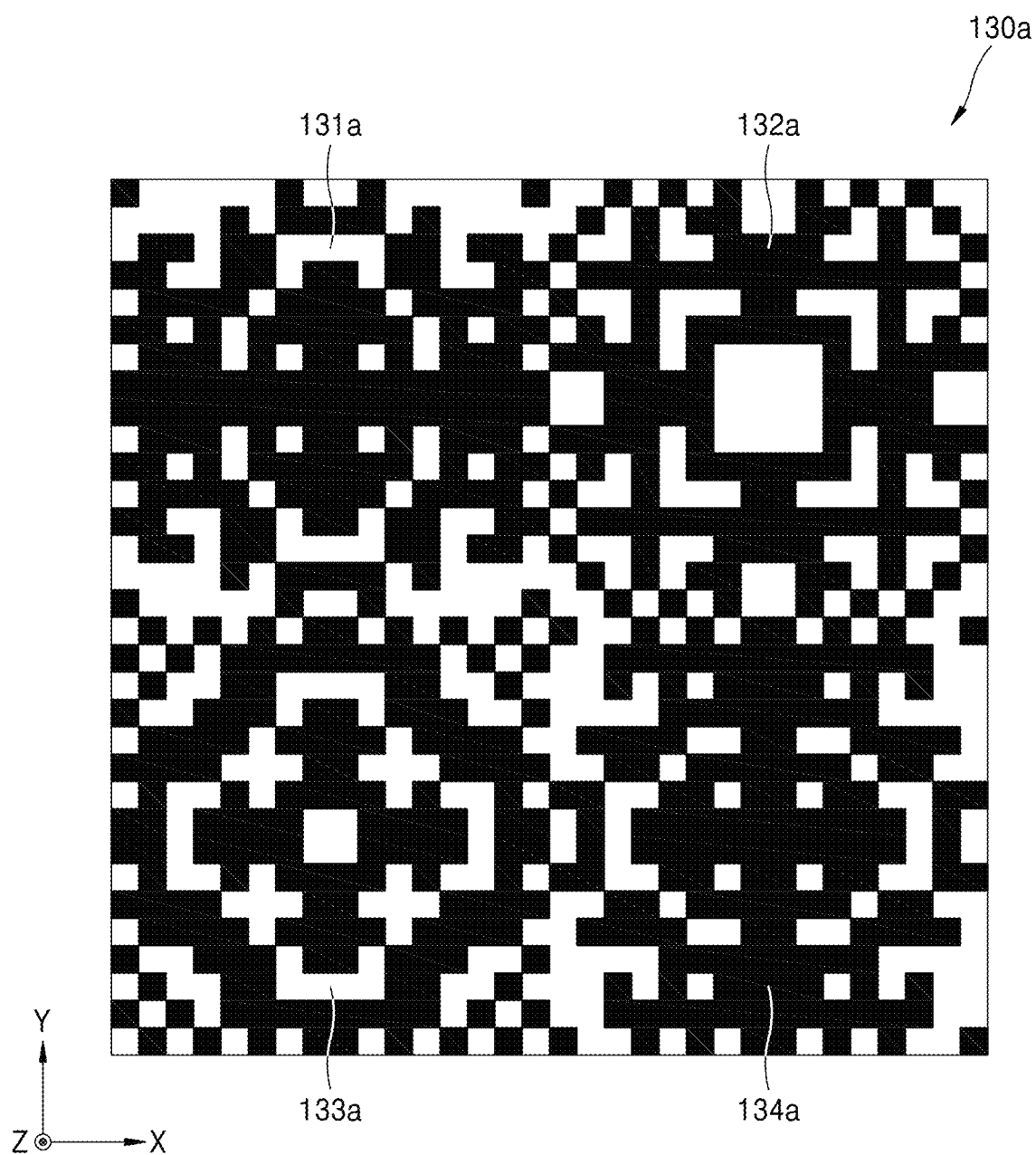
FIG. 5A is a plan view showing a pixel arrangement in a pixel array.
Figure 5E:
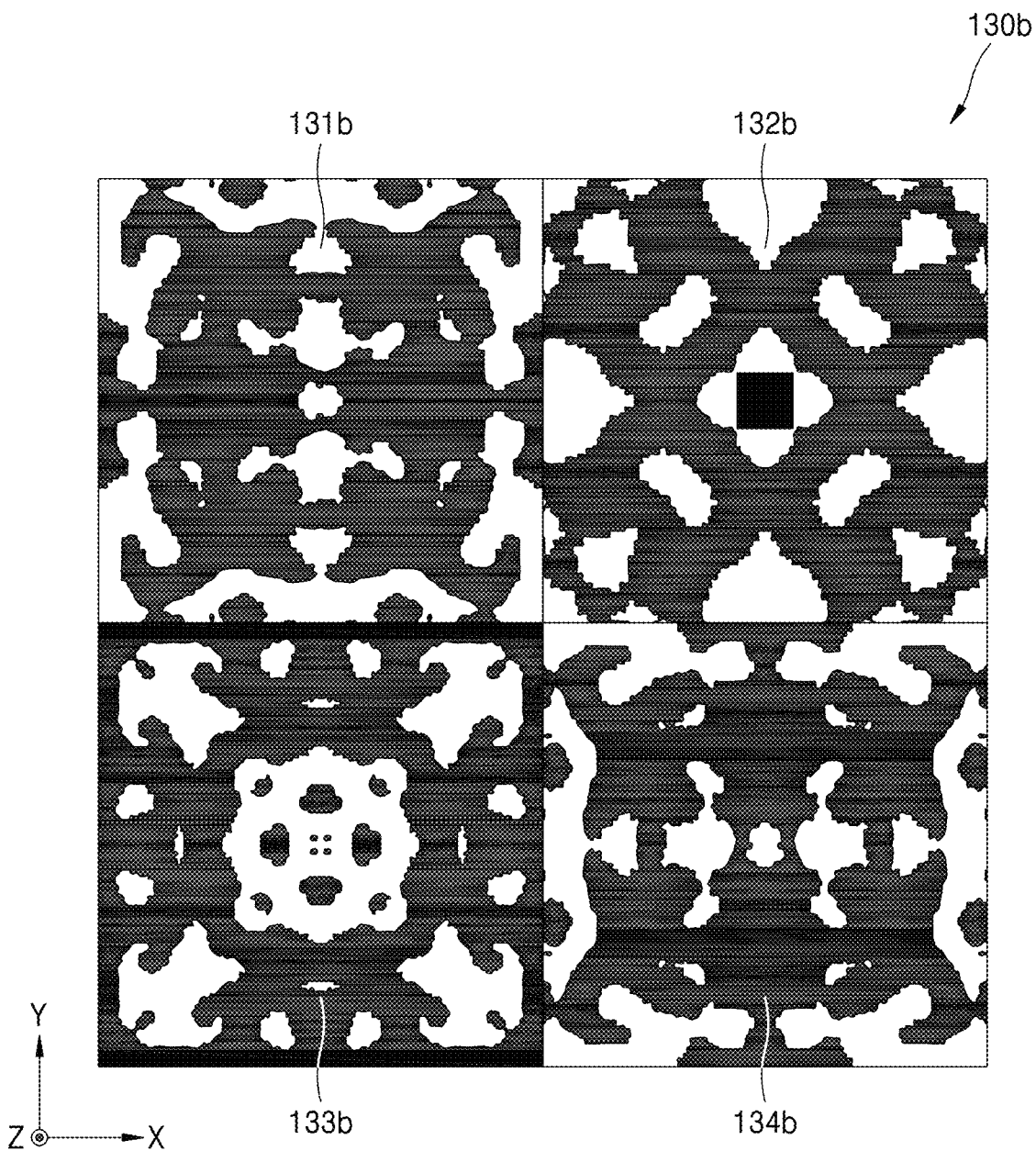

Each of first to fourth pixel corresponding regions 131a, 132a, 133a, and 134a in a color separating lens array 130a shown in FIG. 5D is optimized in a digitalized binary form of 16×16 rectangular arrays, and the unit pattern of FIG. 5D has a shape of 32×32 rectangular arrays. Unlike the above example, each of first to fourth pixel corresponding regions 131b, 132b, 133b, and 134b in a color separating lens array 130b shown in FIG. 5E may be optimized in a non-digitalized continuous curve shape.

Figure 6A:
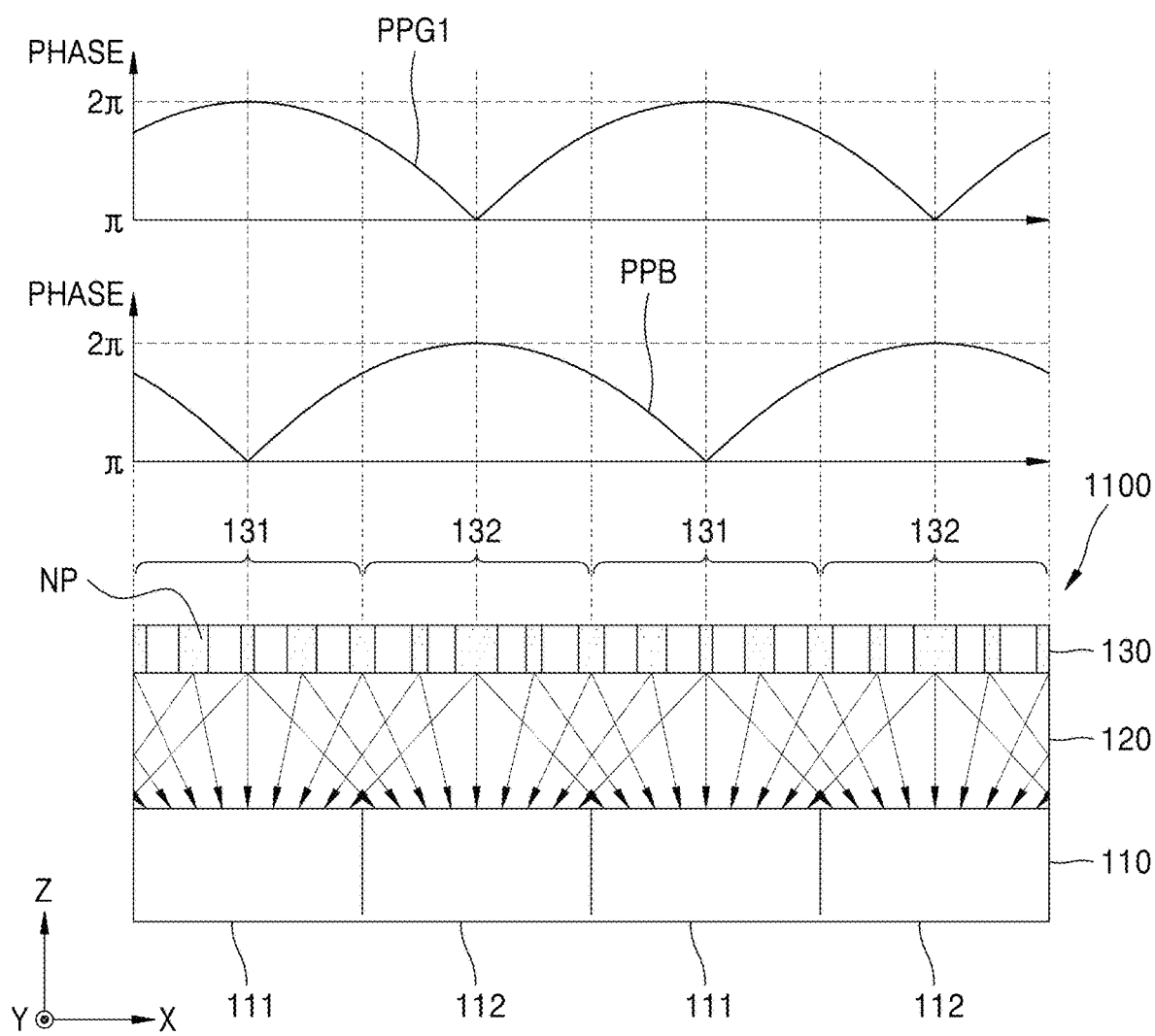
FIG. 6A is a diagram showing phase profiles of green light and blue light that have passed through a color separating lens array along line I-I' of FIG. 5B.
Figure 6B:
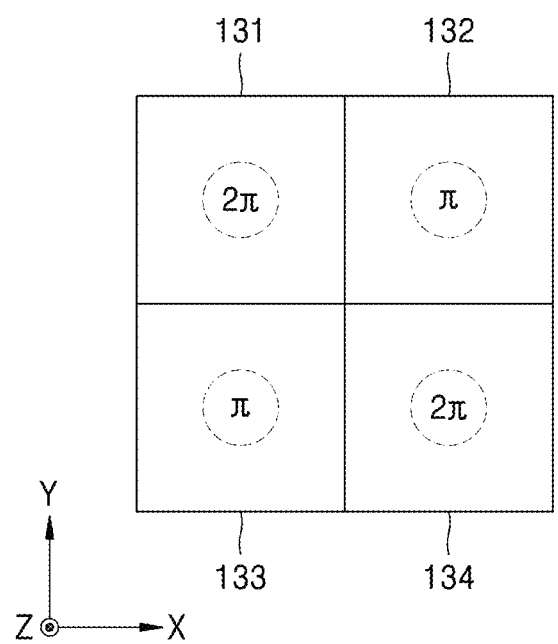
FIG. 6B is a diagram showing a phase of the green light that has passed through the color separating lens array at a center of pixel corresponding regions.
Figure 6C:
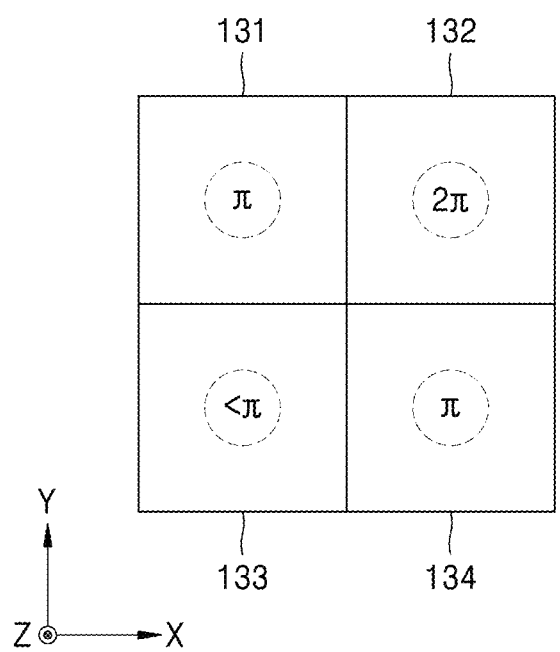
FIG. 6C is a diagram showing a phase of blue light that has passed through the color separating lens array at the center of pixel corresponding regions.

FIG. 6A shows phase profiles of the green light and the blue light that have passed through the color separating lens array 130 in line I-I' of FIG. 5B, FIG. 6B shows the phase of the green light that has passed through the color separating lens array 130 at centers of the pixel corresponding regions 131, 132, 133, and 134, and FIG. 6C shows the phase of the blue light that has passed through the color separating lens array 130 at the centers of the pixel corresponding regions 131, 132, 133, and 134. In FIG. 6A, the color filter array 140 is omitted for convenience' sake. The phase profiles of the green light and the blue light shown in FIG. 6A are similar to those of the first and second wavelength light exemplary shown in FIG. 3B.

Referring to FIGS. 6A and 6B, the green light that has passed through the color separating lens array 130 may have a first green light phase profile PPG1 that is the largest at the center of the first pixel corresponding region 131 and is reduced away from the center of the first pixel corresponding region 131. In detail, immediately after passing through the color separating lens array 130, that is, at a lower surface of the color separating lens array 130 or an upper surface of the spacer layer 120, the phase of the green light is the largest at the center of the first pixel corresponding region 131 and reduced as a concentric circle away from the center of the first pixel corresponding region 131. Thus, the phase is the smallest at the centers of the second and third pixel corresponding regions 132 and 133 in the X and Y directions, and at contact points between the first pixel corresponding region 131 and the fourth pixel corresponding region 134 in the diagonal direction.

When a phase of the green light is set as 2π based on the phase of light emitted from the center of the first pixel corresponding region 131, the light having a phase of about 0.9π to about 1.1π may be emitted from the centers of the second and third corresponding regions 132 and 133, and the green light having a phase of about 1.1π to about 1.5π may be emitted from a contact point between the first pixel corresponding region 131 and the fourth pixel corresponding region 134. Therefore, a difference between the phase of the green light that has passed through the center of the first pixel corresponding region 131 and the phase of the green light that has passed through the centers of the second and third pixel corresponding regions 132 and 133 may be about 0.9π to about 1.1π.

In addition, the first green light phase profile PPG1 does not denote that the phase delay amount of the light that has passed through the center of the first pixel corresponding region 131 is the largest, but when the phase of light that has passed through the first pixel corresponding region 131 is 2π and a phase delay amount of the light that has passed through another point is greater and has a phase value of 2π or greater, the first green light phase profile PPG1 may denote a value remaining after subtracting 2nπ, that is, wrapped phase profile. For example, when the phase of light that has passed through the first pixel corresponding region 131 is 2π and the phase of light that has passed through the center of the second pixel corresponding region 132 is 3π, the phase in the second pixel corresponding region 132 may be remaining π after subtracting π (n=1) from 3π.

Referring to FIGS. 6A and 6C, the blue light that has passed through the color separating lens array 130 may have a blue light phase profile PPB that is the largest at the center of the second pixel corresponding region 132 and is reduced away from the center of the second pixel corresponding region 132. In detail, immediately after passing through the color separating lens array 130, the phase of the blue light is the largest at the center of the second pixel corresponding region 132 and reduced as a concentric circle away from the center of the second pixel corresponding region 132, the phase is the smallest at the centers of the first and fourth pixel corresponding regions 131 and 134 in the X direction and the Y direction and the smallest at the center of the third pixel corresponding region 133 in the diagonal direction. When the phase of the blue light at the center of the second pixel corresponding region 132 is 2π, the phase at the centers of the first and fourth pixel corresponding regions 131 and 134 may be about, for example, about 0.9π to about 1.1π, and the phase at the center of the third pixel corresponding region 133 may be less than that at the centers of the first and fourth pixel corresponding regions 131 and 134, for example, about 0.5π to about 0.9π.

Figure 6D:
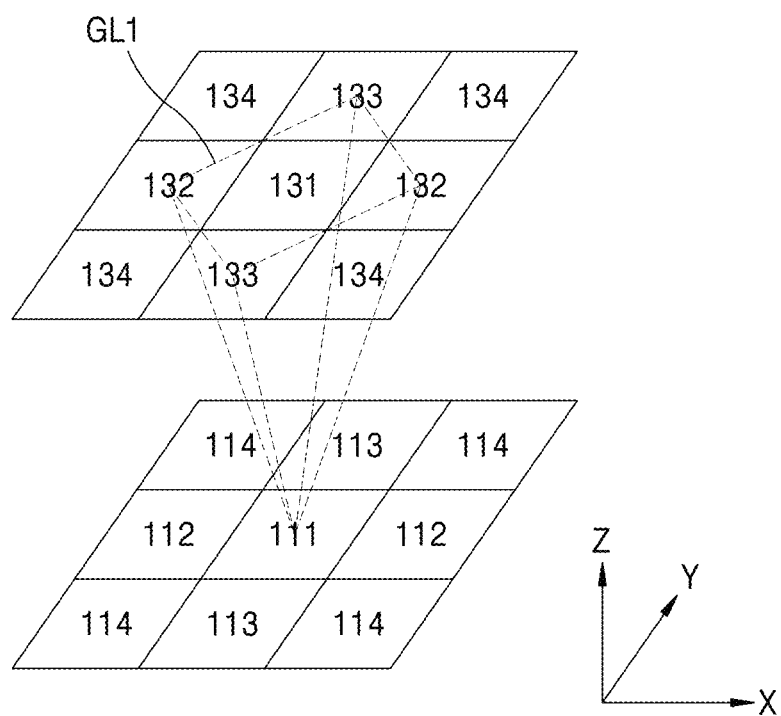
FIG. 6D is a diagram showing an example of a traveling direction of green light incident on a first green light condensing region.
Figure 6E:
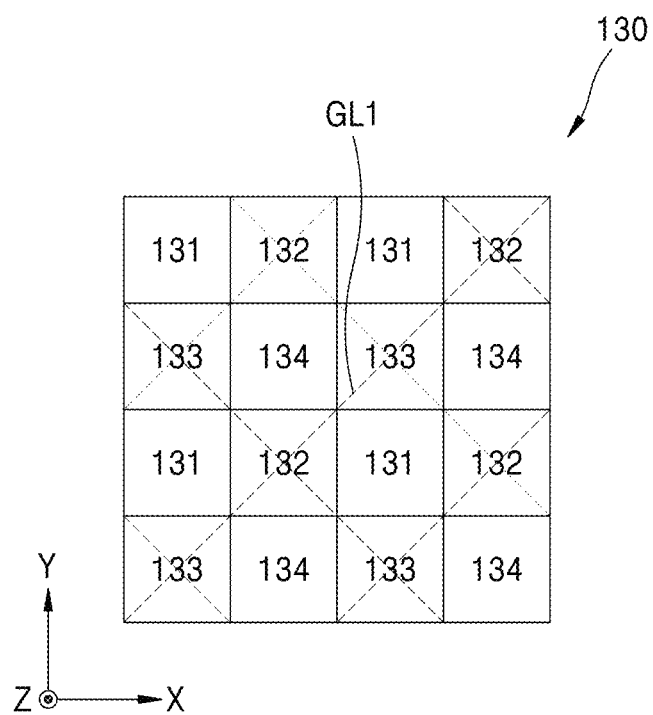
FIG. 6E is a diagram showing an example of an array of the first green light condensing region.

FIG. 6D shows an example of a traveling direction of green light incident on a first light condensing region, and FIG. 6E shows an example of an array of the first light condensing region.

As shown in FIG. 6D, the green light incident on the vicinity of the first pixel corresponding region 131 is condensed to the first pixel 111 by the color separating lens array 130, and the green light from the second and third pixel corresponding regions 132 and 133, in addition to the first pixel corresponding region 131, is also incident on the first pixel 111. That is, according to the phase profile of the green light described above with reference to FIGS. 6A and 6B, the green light that has passed through a first green light condensing region GL1 that is obtained by connecting centers of two second pixel corresponding regions 132 and two third pixel corresponding regions 133 that are adjacent to the first pixel corresponding region 131 is condensed onto the first pixel 111. Therefore, as shown in FIG. 6E, the color separating lens array 130 may operate as a first green light condensing region GL1 array for condensing the green light onto the first pixel 111. The first green light condensing region GL1 may have a greater area than that of the corresponding first pixel 111, e.g., may be 1.2 times to two times greater than that of the first pixel 111.

Figure 6F:
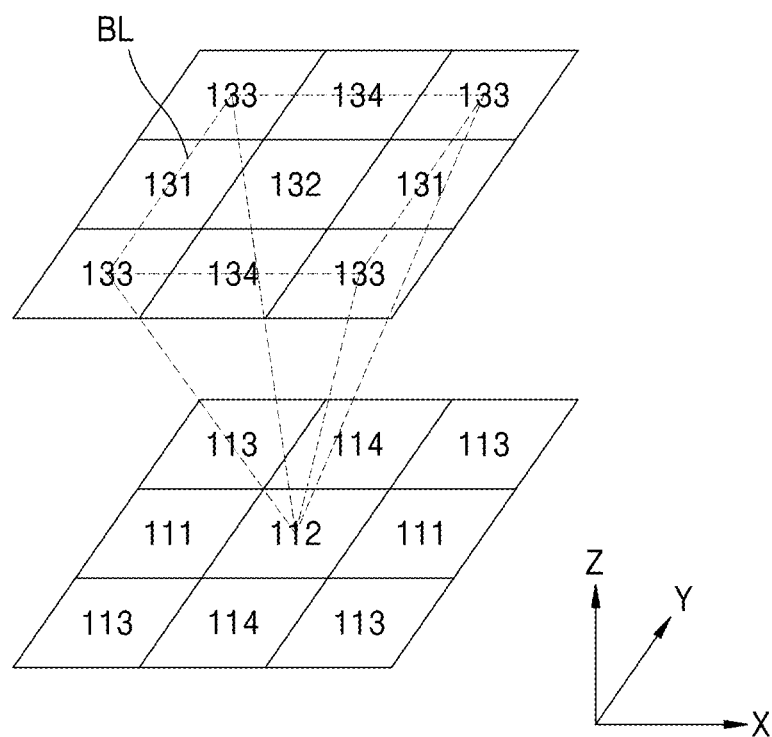
FIG. 6F is a diagram showing an example of a traveling direction of blue light incident on a blue light condensing region.
Figure 6G:
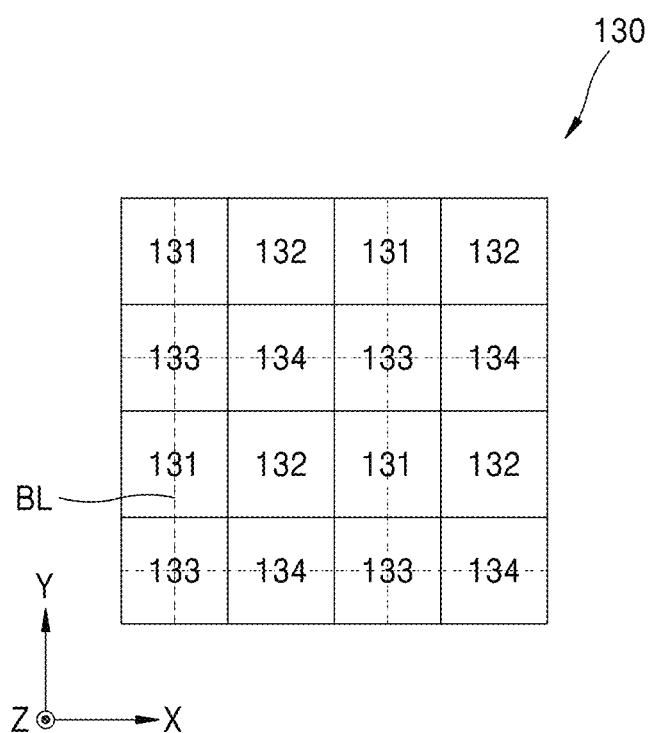
FIG. 6G is a diagram showing an example of an array of the blue light condensing region.

FIG. 6F shows an example of a traveling direction of blue light incident on a first blue light condensing region, and FIG. 6G shows an example of an array of the blue light condensing region.

The blue light is condensed onto the second pixel 112 by the color separating lens array 130 as shown in FIG. 6F, and the blue light from the pixel corresponding regions 131, 132, 133, and 134 is incident on the second pixel 112. In the phase profile of the blue light described above with reference to FIGS. 6A and 6C, the blue light that has passed through a blue light condensing region BL that is obtained by connecting centers of four third pixel corresponding regions 133 adjacent to the second pixel corresponding region 132 at apexes is condensed onto the second pixel 112. Therefore, as shown in FIG. 6G, the color separating lens array 130 may operate as a blue light condensing region array for condensing the blue light to the second pixel 112. The blue light condensing region BL has an area greater than that of the second pixel 112, e.g., may be 1.5 to 4 times greater. The blue light condensing region BL may partially overlap the first green light condensing region GL1 described above, and a second green light condensing region GL2 and a red light condensing region RL.

Figure 7A:
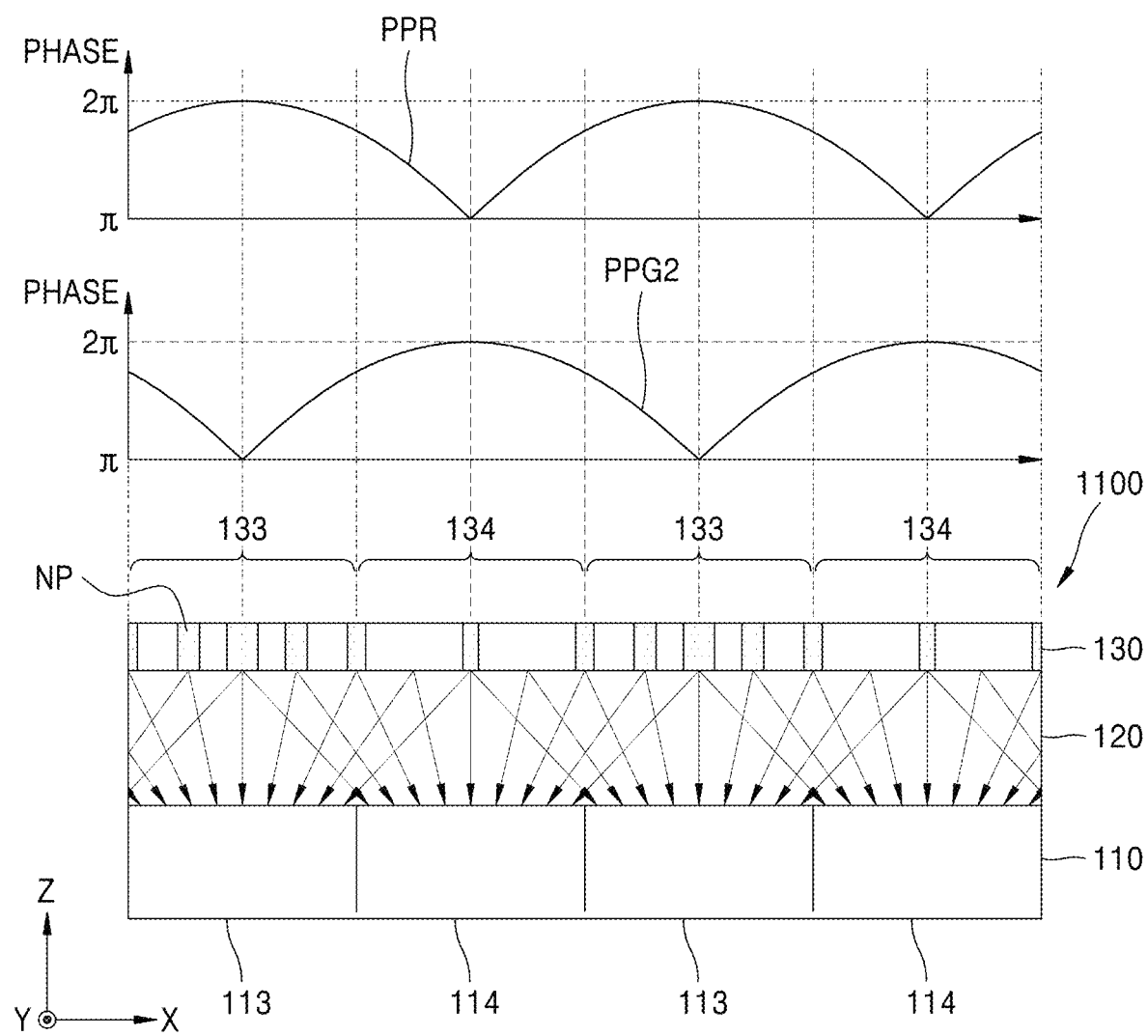
FIG. 7A is a diagram showing phase distributions of red light and green light that have passed through a color separating lens array along line II-II' of FIG. 5B.
Figure 7B:
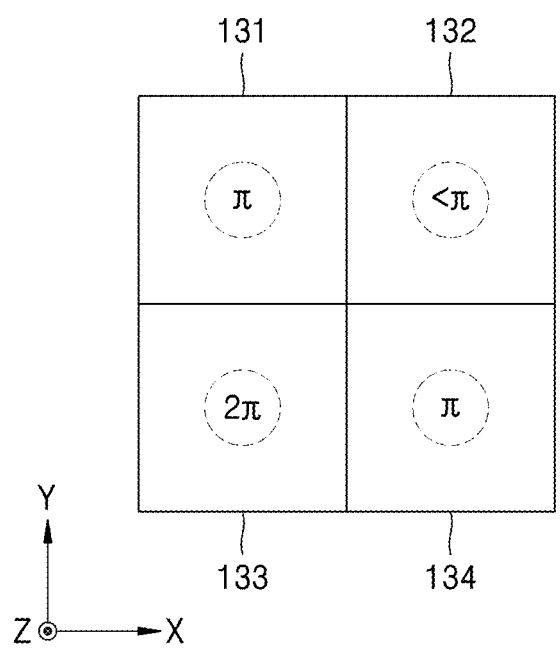
FIG. 7B is a diagram showing a phase of the red light that has passed through the color separating lens array at a center of pixel corresponding regions.
Figure 7C:
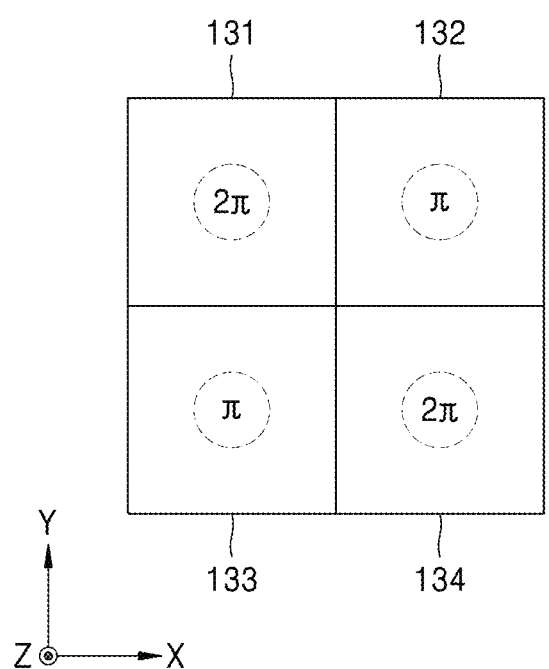
FIG. 7C is a diagram showing a phase of green light that has passed through the color separating lens array at the center of pixel corresponding regions.

FIG. 7A shows phase profiles of the red light and the green light that have passed through the color separating lens array 130 in line II-II' of FIG. 5B, FIG. 7B shows the phase of the red light that has passed through the color separating lens array 130 at centers of the pixel corresponding regions 131, 132, 133, and 134, and FIG. 7C shows the phase of the green light that has passed through the color separating lens array 130 at the centers of the pixel corresponding regions 131, 132, 133, and 134.

Referring to FIGS. 7A and 7B, the red light that has passed through the color separating lens array 130 may have a red light phase profile PPR that is the largest at the center of the third pixel corresponding region 133 and is reduced away from the center of the third pixel corresponding region 133. In detail, immediately after passing through the color separating lens array 130, the phase of the red light is the largest at the center of the third pixel corresponding region 133 and reduced as a concentric circle away from the center of the third pixel corresponding region 133, the phase is the smallest at the centers of the first and fourth pixel corresponding regions 131 and 134 in the X direction and the Y direction and the smallest at the center of the second pixel corresponding region 132 in the diagonal direction. When the phase of the red light at the center of the third pixel corresponding region 133 is $2\pi$, the phase at the centers of the first and fourth pixel corresponding regions 131 and 134 may be about, for example, about $0.9\pi$ to about $1.1\pi$, and the phase at the center of the second pixel corresponding region 132 may be less than that at the centers of the first and fourth pixel corresponding regions 131 and 134, for example, about $0.5\pi$ to about $0.9\pi$.

Referring to FIGS. 7A and 7C, the green light that has passed through the color separating lens array 130 may have a second green light phase profile PPG2 that is the largest at the center of the fourth pixel corresponding region 134 and is reduced away from the center of the fourth pixel corresponding region 134. When comparing the first green light phase profile PPG1 of FIG. 6A with the second green light phase profile PPG2 of FIG. 7A, the second green light phase profile PPG2 is obtained by moving in parallel with the first green light phase profile PPG1 by one-pixel pitch in the X-direction and the Y-direction. That is, the first green light phase profile PPG1 has the largest phase at the center of the first pixel corresponding region 131, but the second green light phase profile PPG2 has the largest phase at the center of the fourth pixel corresponding region 134 that is apart by one-pixel pitch from the center of the first pixel corresponding region 131 in the X-direction and the Y-direction. The phase profiles in FIGS. 6B and 7C showing the phases at the centers of the pixel corresponding regions 131, 132, 133, and 134 may be the same as each other. Regarding the phase profile of the green light based on the fourth pixel corresponding region 134, when the phase of the green light emitted from the center of the fourth pixel corresponding region 134 is set as 27, the light having the phase of about $0.9\pi$ to about $1.1\pi$ may be emitted from the centers of the second and third pixel corresponding regions 132 and 133 and the light having the phase of about $1.1\pi$ to about $1.5\pi$ may be emitted from the contact point between the first pixel corresponding region 131 and the fourth pixel corresponding region 134.

Figure 7D:
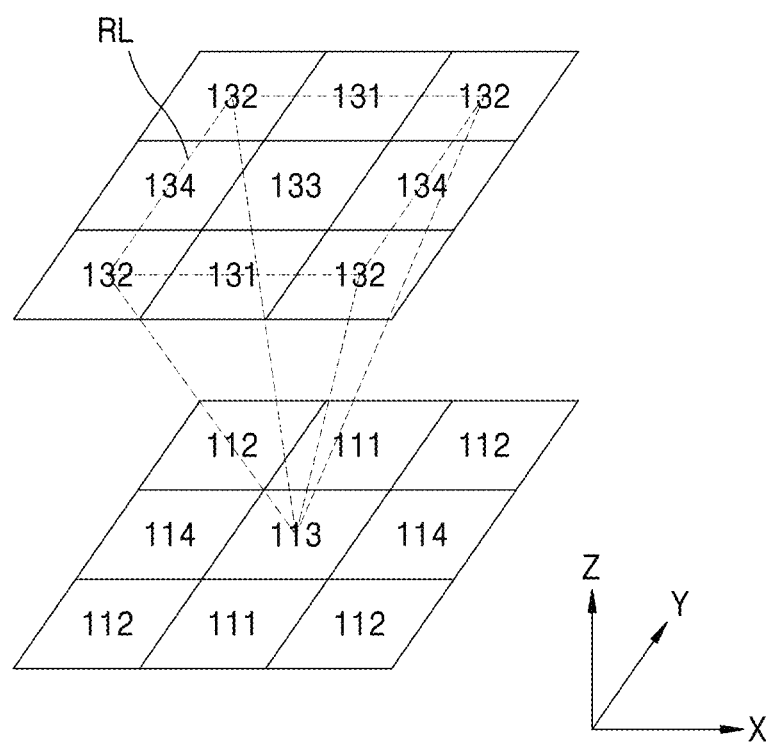
FIG. 7D is a diagram showing an example of a proceeding direction of red light incident on a red light condensing region.
Figure 7E:
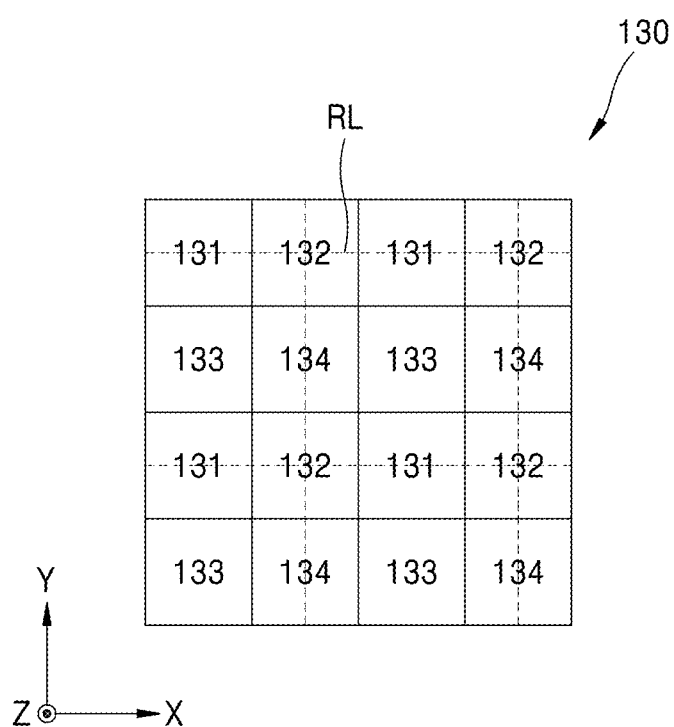
FIG. 7E is a diagram showing an example of an array of the red light condensing region.

FIG. 7D shows an example of a proceeding direction of red light incident on a red light condensing region, and FIG. 7E shows an example of an array of the red light condensing region.

The red light is condensed onto the third pixel 113 by the color separating lens array 130 as shown in FIG. 7D, and the red light from the pixel corresponding regions 131, 132, 133, and 134 is incident on the third pixel 113. In the phase profile of the red light described above with reference to FIGS. 7A and 7B, the red light that has passed through a red light condensing region RL that is obtained by connecting centers of four second pixel corresponding regions 132 adjacent to the third pixel corresponding region 133 at apexes is condensed onto the third pixel 113. Therefore, as shown in FIG. 7E, the color separating lens array 130 may operate as a red light condensing region array for condensing the red light to the third pixel 113. The red light condensing region RL has an area greater than that of the third pixel 113, e.g., may be 1.5 to 4 times greater. The red light condensing region RL may partially overlap the first and second green light condensing regions GL1 and GL2 and the blue light condensing region BL.

Figure 7F:
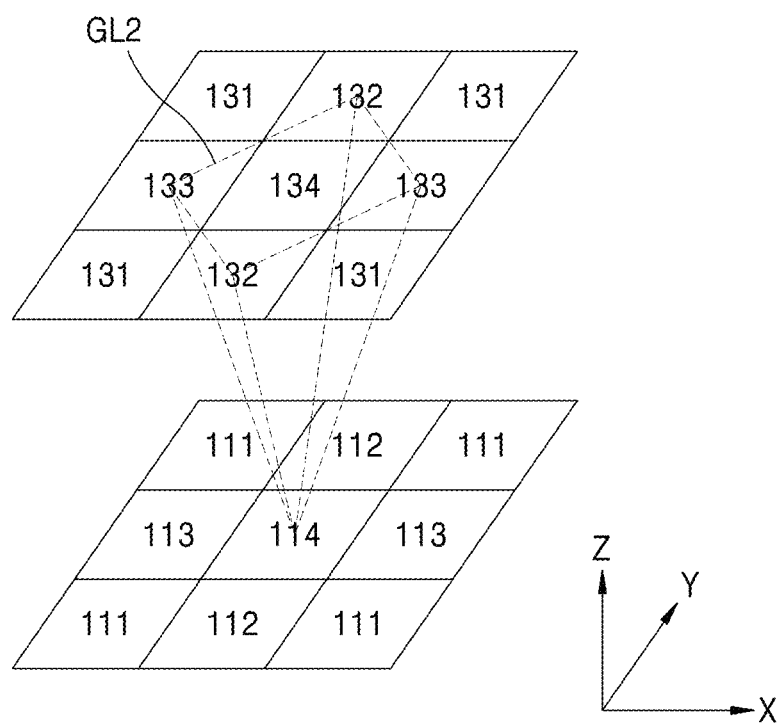
FIG. 7F is a diagram showing an example of a proceeding direction of green light incident on a second green light condensing region.
Figure 7G:
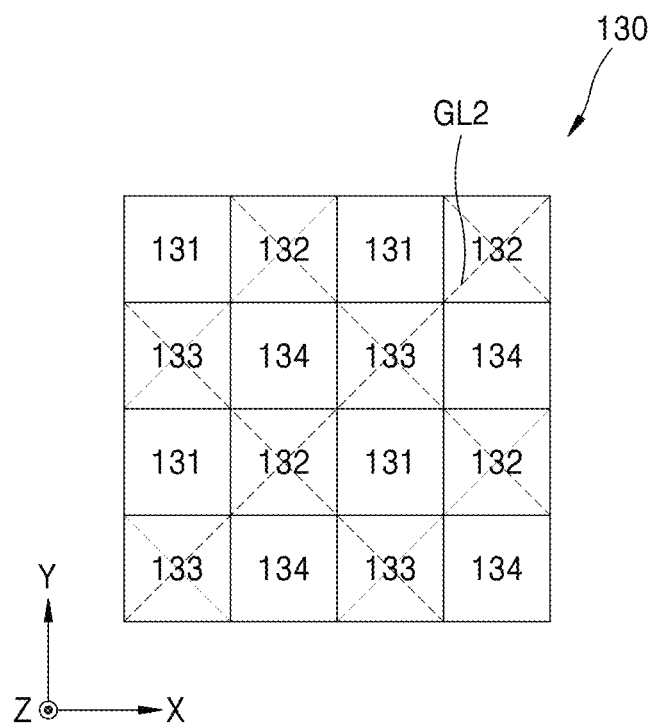
FIG. 7G is a diagram showing an example of an array of the second green light condensing region.

Referring to FIGS. 7F and 7G, the green light incident on the vicinity of the fourth pixel corresponding region 134 proceeds similarly to the green light incident on the vicinity of the first pixel corresponding region 131, and as shown in FIG. 7F, the green light is condensed onto the fourth pixel 114. Therefore, as shown in FIG. 7G, the color separating lens array 130 may operate as a second green light condensing region array for condensing the green light onto the fourth pixel 114. The second green light condensing region GL2 may have a greater area than that of the corresponding fourth pixel 114, e.g., may be 1.2 times to twice greater.

The color separating lens array 130 satisfying the above phase profile and performance described above may be automatically designed through various types of computer simulations. For example, the structures of the pixel corresponding regions 131, 132, 133, and 134 may be optimized through a nature-inspired algorithm such as a genetic algorithm, a particle swarm optimization algorithm, an ant colony optimization algorithm, etc., or a reverse design based on an adjoint optimization algorithm.

The structures of the green, blue, red, and infrared-ray pixel corresponding regions may be optimized while evaluating performances of a plurality of candidate color separating lens arrays based on evaluation factors such as color separation spectrum, optical efficiency, signal-to-noise ratio, etc. when designing the color separating lens array. For example, the structures of the green, blue, red, and infrared-ray pixel corresponding regions may be optimized in a manner that a target numerical value of each evaluation factor is determined in advance and the sum of the differences between actual evaluation values and the target numerical values of the candidate color separating lens array with respect to a plurality of evaluation factors is reduced. Alternatively, the performance may be indexed for each evaluation factor, and the structures of the green, blue, red, and infrared-ray pixel corresponding regions may be optimized so that a value representing the performance may be maximized.

In addition, some or all of the first to fourth pixels 111, 112, 113, and 114 of the pixel array 1100 may include two or more independent photosensitive cells, and two or more photosensitive cells included in one pixel may share the condensing region of the color separating lens array 130. When a plurality of photosensitive cells that may independently sense light are included in one pixel, a resolution of the image sensor 1000 may be improved. In addition, an auto-focusing function of the image sensor 1000 and/or a camera device including the image sensor 1000 may be implemented by using differences among signals obtained from the photosensitive cells.

For example, a phase-detection auto-focusing method implements an auto-focusing function by using a difference between intensities of light respectively incident on two independent photosensitive cells in one pixel. For example, when a focus of a lens assembly of a camera is exactly located on a surface of the pixel array 1100, light beams that respectively pass through opposite edges of the lens assembly are collected on one point on the surface of the pixel array 1100. Then, the intensities of the light respectively incident on the two independent photosensitive cells in one pixel are equal to each other. However, when the focus of the lens assembly of the camera is not located on the surface of the pixel array 1100, the light beam that has passed through one edge of the lens assembly is incident on each pixel in the pixel array 1100, more than the light beam that has passed through another edge. Also, in this case, the incident angle of the light beam incident on each pixel in the pixel array 1100 may be more inclined than a chief ray angle (CRA). Then, the intensities of the light respectively incident on the two independent photosensitive cells in one pixel are different from each other. Therefore, the auto-focusing function may be implemented by comparing two focusing signals obtained respectively from two independent photosensitive cells in one pixel.

In the above phase-detection auto-focusing method, the auto-focusing performance may be improved as a contrast ratio between two focusing signals increases. In order to improve the auto-focusing performance in the image sensor 1000 including the color separating lens array 130, a direction in which the photosensitive cells are arranged may be optimized so as to increase the contrast ratio of the auto-focusing signals with respect to each pixel. For example, FIG. 8A shows an example of a direction in which one pixel is divided into two photosensitive cells in order to provide the auto-focusing signal in the phase-detection auto-focusing method, and FIG. 8B is a graph exemplarily showing a variation in the contrast ratio of an auto-focusing signal according to a dividing direction of the photosensitive cell.

Figure 8A:
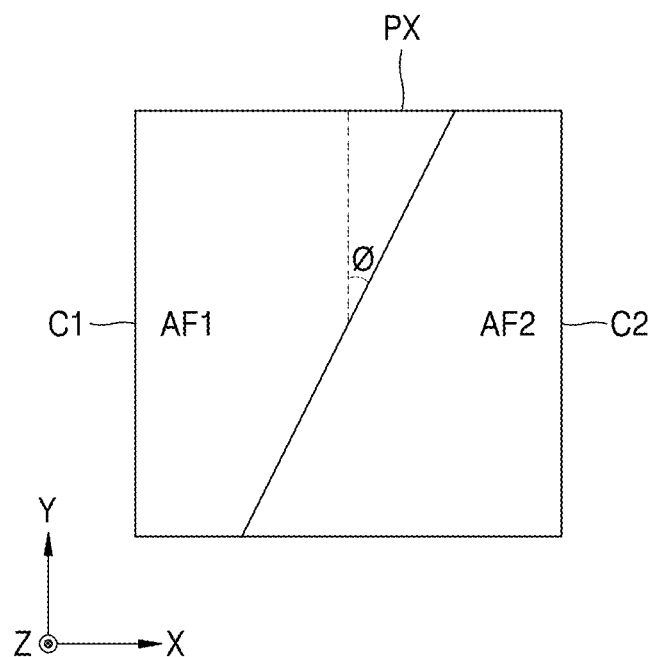
FIG. 8A is a diagram showing an example of a direction in which one pixel is divided into two photosensitive cells in order to provide an auto-focusing signal in a phase-detection auto-focusing manner.

Referring to FIG. 8A, one pixel PX may be divided into two independent photosensitive cells C1 and C2. According to an example embodiment, a direction in which the contrast ratio of the auto-focusing signal is the largest may be identified by changing the direction of dividing the pixel PX. That is, the direction in which the contrast ratio of the auto-focusing signal is the largest may be identified by changing the direction in which two photosensitive cells C1 and C2 are arranged. For example, in FIG. 8A, an azimuth angle φ denotes an angle formed by a boundary line between two photosensitive cells C1 and C2 and the second direction (Y direction). In FIG. 8B, a graph indicated as Gb shows a result of measuring the contrast ratio of the auto-focusing signal with respect to the first pixel 111 (e.g., the first green pixel), a graph indicated as B shows a result of measuring the auto-focusing signal with respect to the second pixel 112 (e.g., the blue pixel), a graph indicated as R shows a result of measuring the contrast ratio of the auto-focusing signal with respect to the third pixel 113 (e.g., the red pixel), and a graph indicated as Gr shows a result of measuring the contrast ratio of the auto-focusing signal with respect to the fourth pixel 114 (e.g., the second green pixel). An azimuth angle Φ denotes an angle formed by a boundary line between two photosensitive cells C1 and C2 and the second direction (Y direction). It is assumed that a CRA θ of the light incident on the pixel array 1100 is about 10°.

Figure 8B:
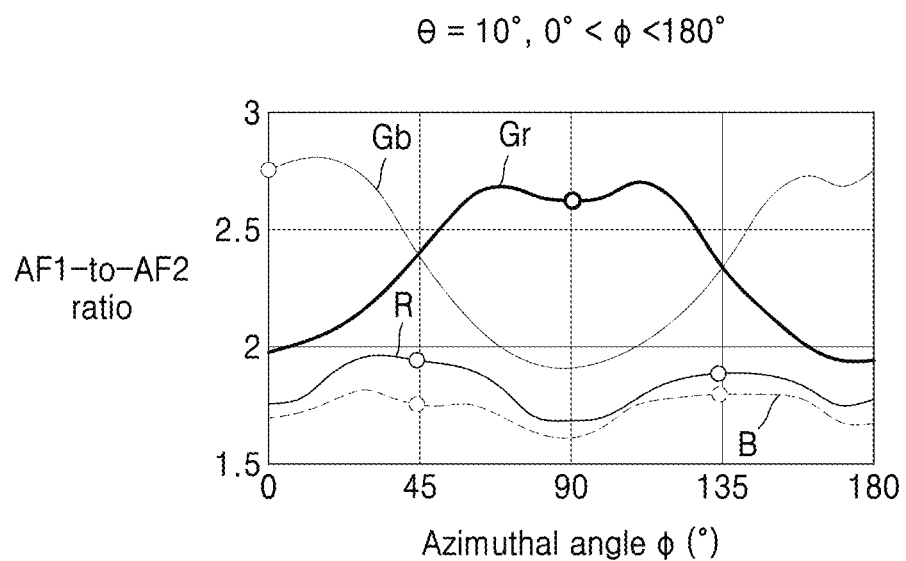
FIG. 8B is a graph showing an example of a change in a contrast ratio of the auto-focusing signal according to a dividing direction of the photosensitive cell.

As shown in FIG. 8B, in the first pixel 111, the contrast ratio of the auto-focusing signal is the largest around where the azimuth angle Φ is 0° or 180°, in the second pixel 112 and the third pixel 113, the contrast ratio of the auto-focusing signal is the largest around where the azimuth angle Φ is 45° or 135°, and in the fourth pixel 114, the contrast ratio of the auto-focusing signal is the largest around where the azimuth angle Φ is 90°. According to an example embodiment, in the fourth pixel 114, the contrast ratio of the auto-focusing signal maybe be the largest around where the azimuth angle Φ is 90° and 270°. The above result may be deducted from that the first pixel corresponding region 131 and the fourth pixel corresponding region 134 of the color separating lens array 130 are rotated by 90° with respect to each other and the second pixel corresponding region 132 and the third pixel corresponding region 133 are in a 4-fold symmetry. Therefore, when the color separating lens array 130 is used, the auto-focusing performance may be improved by dividing the first pixel 111 in the second direction (Y direction), dividing the second pixel 112 and the third pixel 113 in the diagonal direction, and dividing the fourth pixel 114 in the first direction (X direction).

Figure 9A:
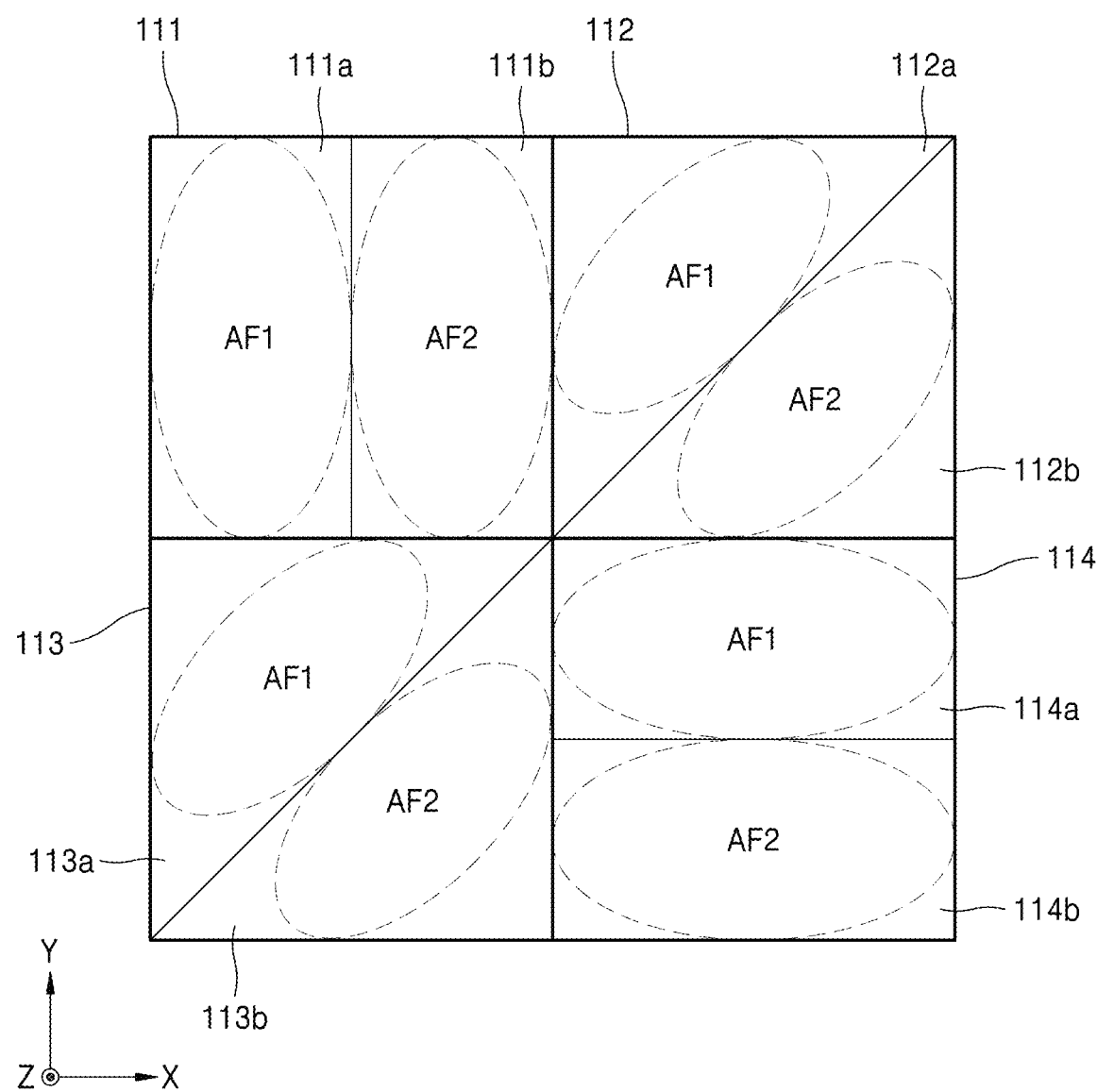
FIGS. 9A, 9B and 9C are plan views showing exemplary structures of a pixel array in an image sensor having a dual cell structure for providing an auto-focusing signal in the phase-detection auto-focusing manner.
Figure 9B:
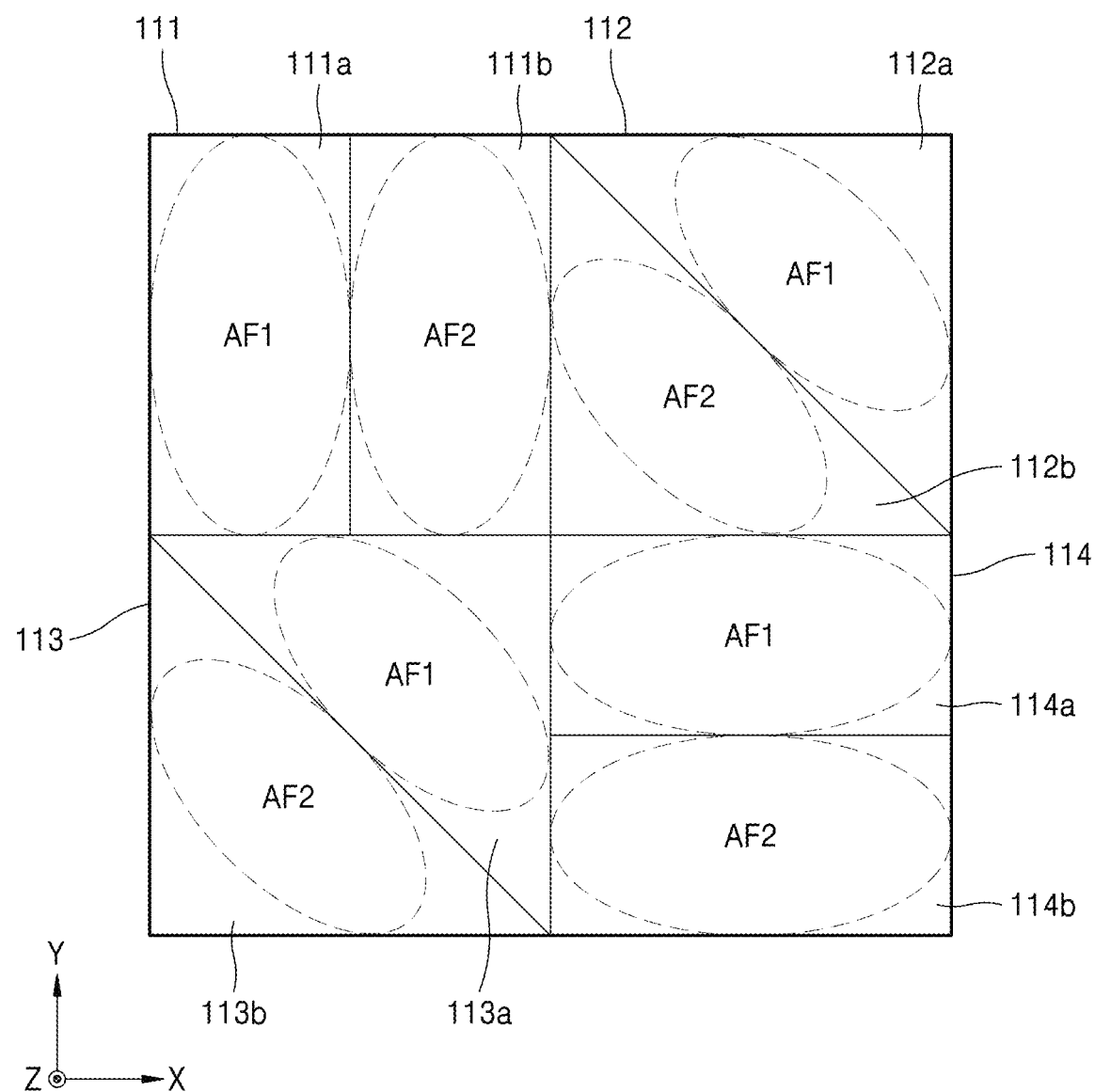
Figure 9C:
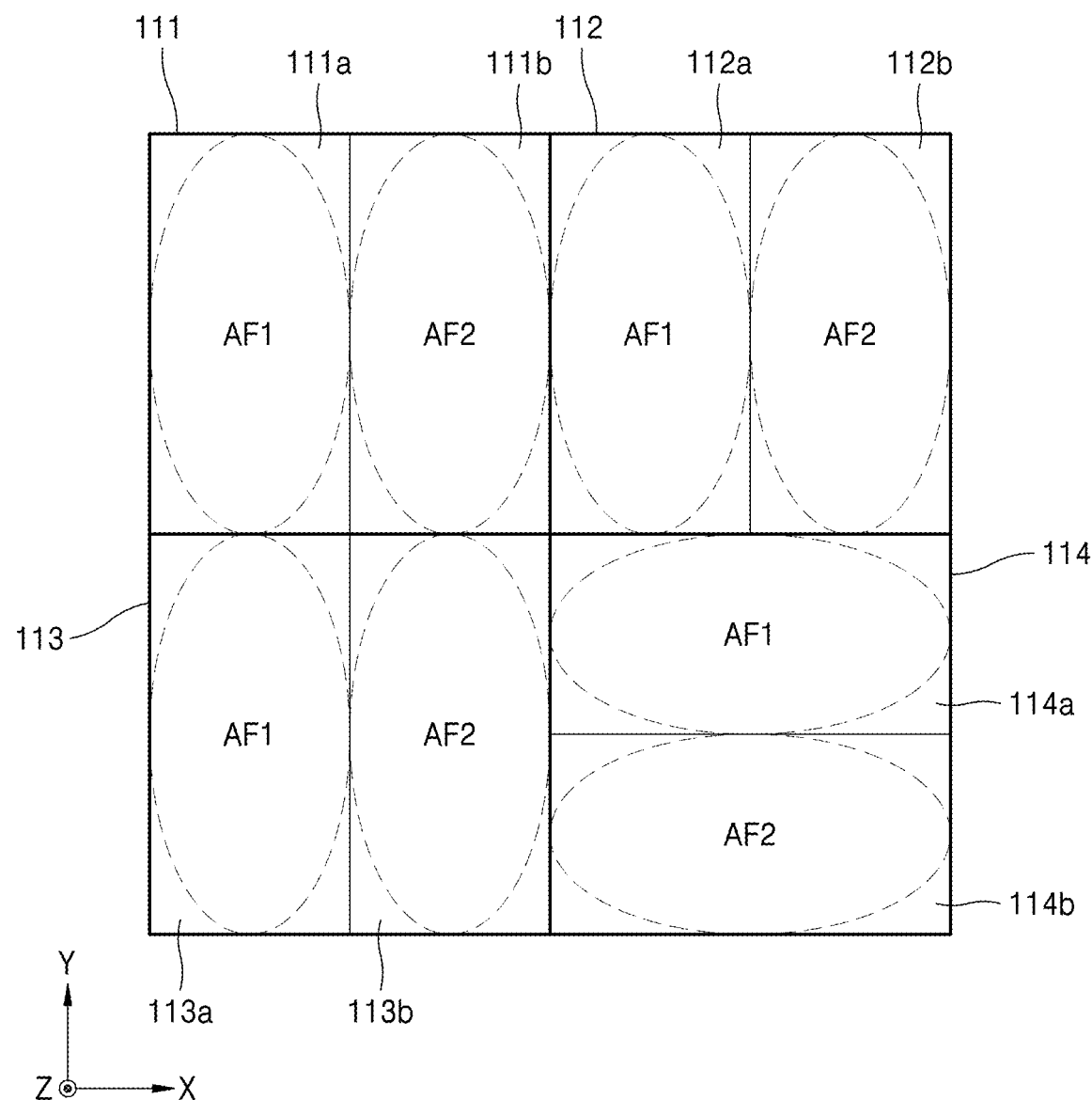

For example, FIGS. 9A to 9C are plan views showing exemplary structures of a pixel array in an image sensor having a dual cell structure for providing an auto-focusing signal in the phase-detection auto-focusing method.

Referring to FIG. 9A, the first pixel 111 may include a 1-1st photosensitive cell 111a and a 1-2nd photosensitive cell 111b that are obtained by dividing the first pixel 111 in the second direction (Y direction). In other words, the 1-1st photosensitive cell 111a and the 1-2nd photosensitive cell 111b may be arranged adjacent to each other in the first direction (X direction) in the first pixel 111. The second pixel 112 includes a 2-1st photosensitive cell 112a and a 2-2nd photosensitive cell 112b that are obtained by dividing the second pixel 112 in a 45° diagonal direction, and the third pixel 113 may include a 3-1st photosensitive cell 113a and a 3-2nd photosensitive cell 113b that are obtained by dividing the third pixel 113 in the 45° diagonal direction. That is, a boundary line between the 2-1st photosensitive cell 112a and the 2-2nd photosensitive cell 112b is provided at a 45° angle with respect to the first direction (X direction), and a boundary line between the 3-1st photosensitive cell 113a and the 3-2nd photosensitive cell 113b is provided at a 45° angle with respect to the first direction (X direction). In other words, the 2-1st photosensitive cell 112a and the 2-2nd photosensitive cell 112b are arranged adjacent to each other in a 135° diagonal direction in the second pixel 112, and the 3-1st photosensitive cell 113a and the 3-2nd photosensitive cell 113b are arranged adjacent to each other in the 135° diagonal direction in the third pixel 113. The fourth pixel 114 may include a 4-1st photosensitive cell 114a and a 4-2nd photosensitive cell 114b that are obtained by dividing the fourth pixel 114 in the first direction (X direction). In other words, the 4-1st photosensitive cell 114a and the 4-2nd photosensitive cell 114b are arranged adjacent to each other in the second direction (Y direction) in the fourth pixel 114. Although FIG. 9A illustrates that the boundary line between the 2-1st photosensitive cell 112a and the 2-2nd photosensitive cell 112b is provided at a 45° angle with respect to the first direction (X direction), the disclosure is not limited thereto. As such, according to another example embodiment, the angle of the boundary line with respect to the first direction may be different than 45°.

The 1-1st photosensitive cell 111a and the 1-2nd photosensitive cell 111b of the first pixel 111 may independently output photosensitive signals, and the auto-focusing signal with respect to the first pixel 111 may be obtained from the difference between the photosensitive signal of the 1-1st photosensitive cell 111a and the photosensitive signal of the 1-2nd photosensitive cell 111b in the phase-detection auto-focusing method. In this point of view, the 1-1st photosensitive cell 111a may be a first focusing signal region for generating a first focusing signal of the first pixel 111, and the 1-2nd photosensitive cell 111b may be a second focusing signal region for generating a second focusing signal of the first pixel 111. In other words, the focusing signal of the first focusing signal region in the first pixel 111 is output from the 1-1st photosensitive cell 111a, the focusing signal of the second focusing signal region in the first pixel 111 is output from the 1-2nd photosensitive cell 111b, and the first focusing signal region and the second focusing signal region of the first pixel 111 may independently generate the focusing signals. Also, a general image signal of the first pixel 111 may be obtained by summing the photosensitive signal of the 1-1st photosensitive cell 111a and the photosensitive signal of the 1-2nd photosensitive cell 111b.

Likewise, the 2-1st photosensitive cell 112a and the 2-2nd photosensitive cell 112b may independently output photosensitive signals, and may be respectively a first focusing signal region for generating a first focusing signal and a second focusing signal region for generating a second focusing signal of the second pixel 112. The photosensitive signal of the 2-1st photosensitive cell 112a and the photosensitive signal of the 2-2nd photosensitive cell 112b are added to obtain the general image signal of the second pixel 112. The 3-1st photosensitive cell 113a and the 3-2nd photosensitive cell 113b may independently output photosensitive signals, and may be respectively a first focusing signal region for generating a first focusing signal and a second focusing signal region for generating a second focusing signal of the third pixel 113. The photosensitive signal of the 3-1st photosensitive cell 113a and the photosensitive signal of the 3-2nd photosensitive cell 113b are added to obtain the general image signal of the third pixel 113. Likewise, the 4-1st photosensitive cell 114a and the 4-2nd photosensitive cell 114b may independently output photosensitive signals, and may be respectively a first focusing signal region for generating a first focusing signal and a second focusing signal region for generating a second focusing signal of the fourth pixel 114. The photosensitive signal of the 4-1st photosensitive cell 114a and the photosensitive signal of the 4-2nd photosensitive cell 114b are added to obtain the general image signal of the fourth pixel 114.

Referring to FIG. 9B, the first pixel 111 and the fourth pixel 114 are the same as those of FIG. 9A. In FIG. 9B, the second pixel 112 includes the 2-1st photosensitive cell 112a and the 2-2nd photosensitive cell 112b that are divided in the 135° diagonal direction, and the third pixel 113 includes the 3-1st photosensitive cell 113a and the 3-2nd photosensitive cell 113b that are divided in the 135° diagonal direction. That is, a boundary line between the 2-1st photosensitive cell 112a and the 2-2nd photosensitive cell 112b is provided at a 135° angle with respect to the first direction (X direction), and a boundary line between the 3-1st photosensitive cell 113a and the 3-2nd photosensitive cell 113b is provided at a 135° angle with respect to the first direction (X direction). In other words, the 2-1st photosensitive cell 112a and the 2-2nd photosensitive cell 112b are arranged adjacent to each other in the 45° diagonal direction in the second pixel 112, and the 3-1st photosensitive cell 113a and the 3-2nd photosensitive cell 113b are arranged adjacent to each other in the 45° diagonal direction in the third pixel 113.

Referring to FIG. 9C, the first pixel 111 and the fourth pixel 114 are the same as those of the example in FIG. 9A, and the direction in which the 2-1st photosensitive cell 112a and the 2-2nd photosensitive cell 112b of the second pixel 112 are arranged and the direction in which the 3-1st photosensitive cell 113a and the 3-2nd photosensitive cell 113b of the third pixel 113 are arranged are the same as the direction in which the 1-1st photosensitive cell 111a and the 1-2nd photosensitive cell 111b of the first pixel 111 are arranged. In other words, the 2-1st photosensitive cell 112a and the 2-2nd photosensitive cell 112b are arranged adjacent to each other in the first direction (X direction) in the second pixel 112, and the 3-1st photosensitive cell 113a and the 3-2nd photosensitive cell 113b are arranged adjacent to each other in the first direction (X direction) in the third pixel 113. As shown in the graph of FIG. 8B, in the second pixel 112 and the third pixel 113, the change in the contrast ratio of the auto-focusing signal according to the direction of arranging the photosensitive cell is less than that in the first pixel 111 and the fourth pixel 114. Therefore, for the convenience of the manufacturing processes, the direction in which the photosensitive cells of the second pixel 112 and the third pixel 113 are arranged may coincide with the direction in which the photosensitive cells of the first pixel 111 or the fourth pixel 114 are arranged. In FIG. 9C, the direction in which the photosensitive cells of the second pixel 112 and the third pixel 113 are arranged matches to the direction in which the photosensitive cells of the first pixel 111 are arranged, but may match to the direction in which the photosensitive cells of the fourth pixel 114 are arranged.

Figure 10A:
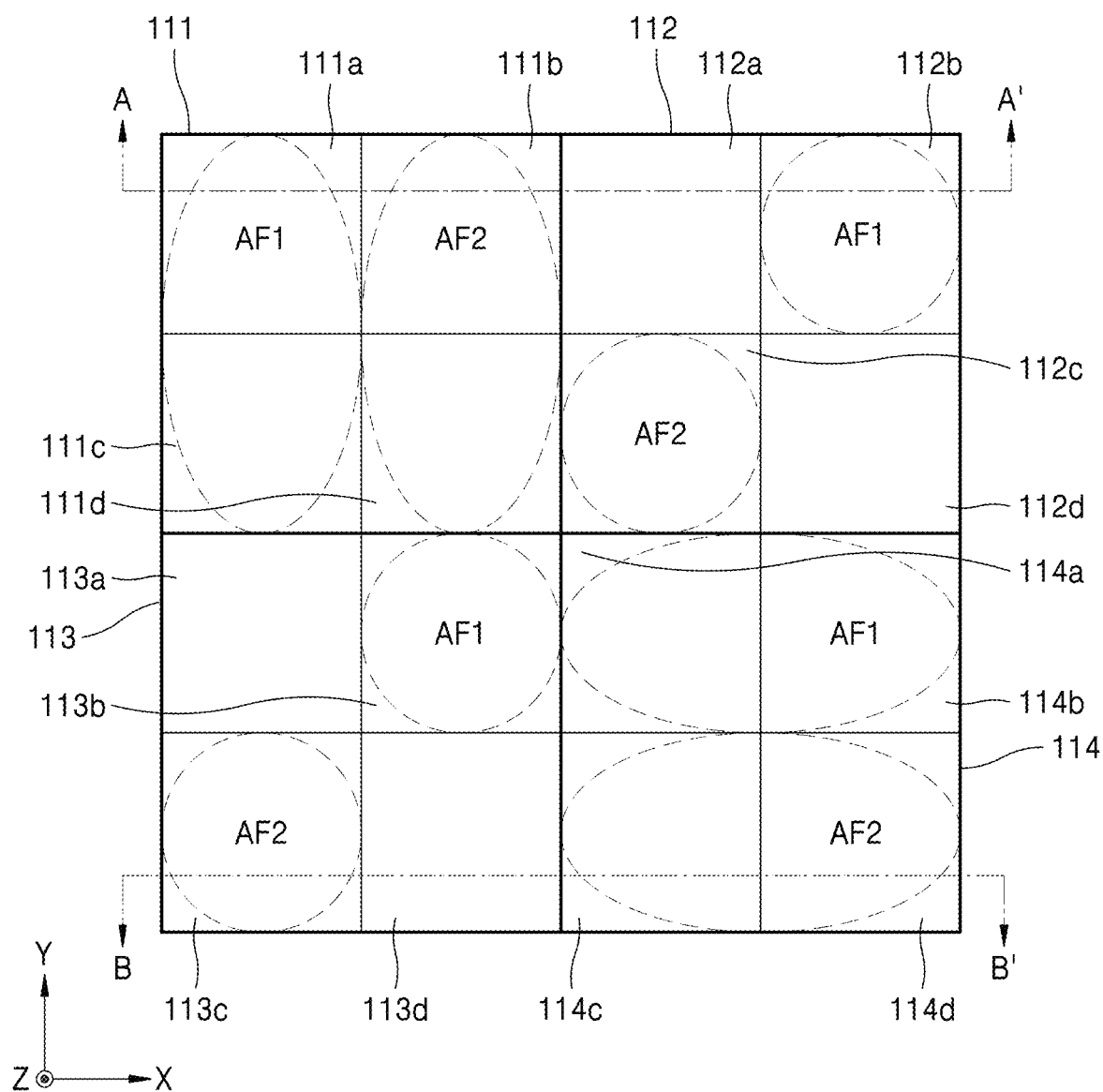
FIGS. 10A, 10B and 10O are plan views showing exemplary structures of a pixel array in an image sensor having a tetra cell structure for providing an auto-focusing signal in the phase-detection auto-focusing manner.
Figure 10B:
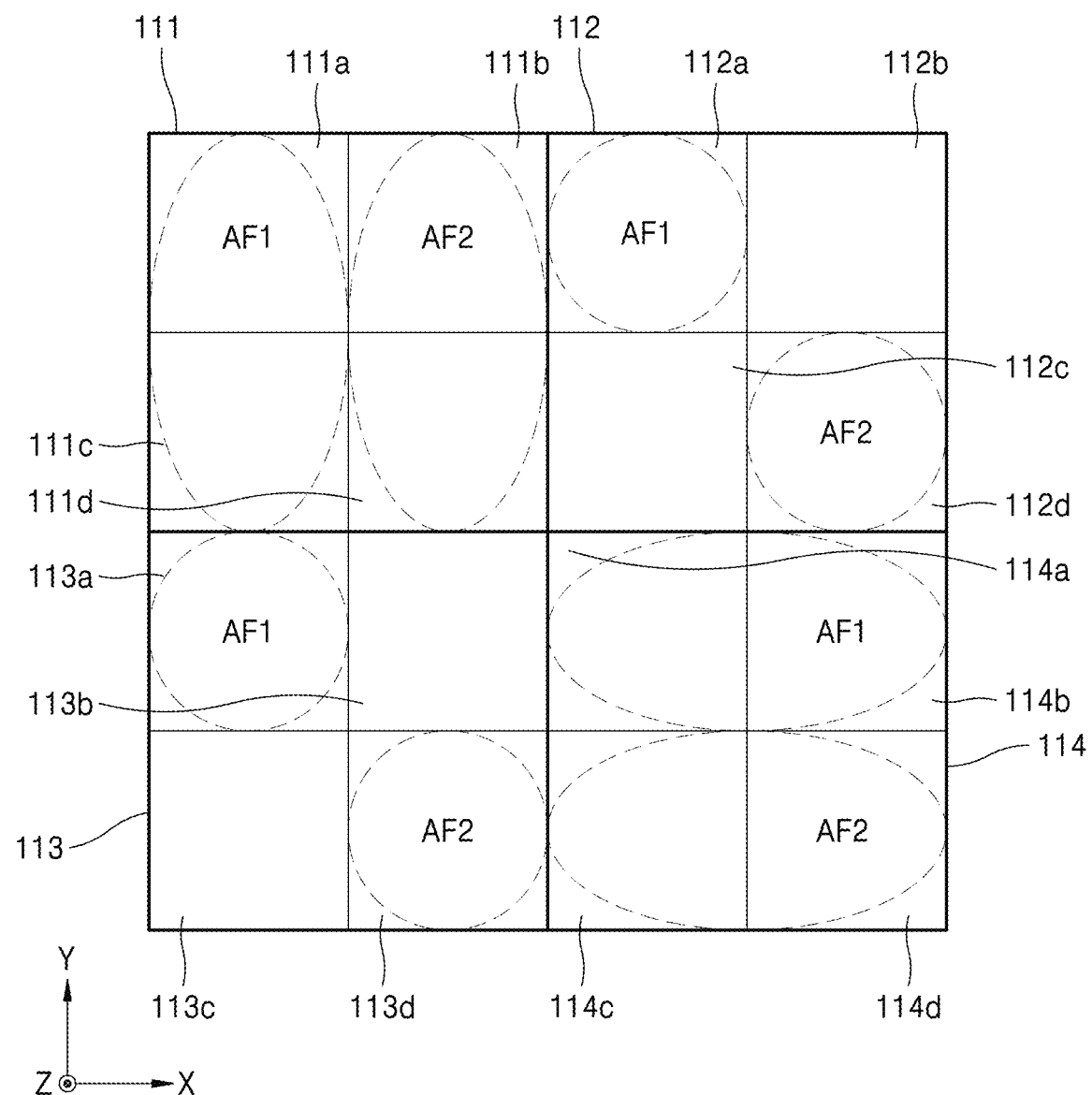
Figure 10C:
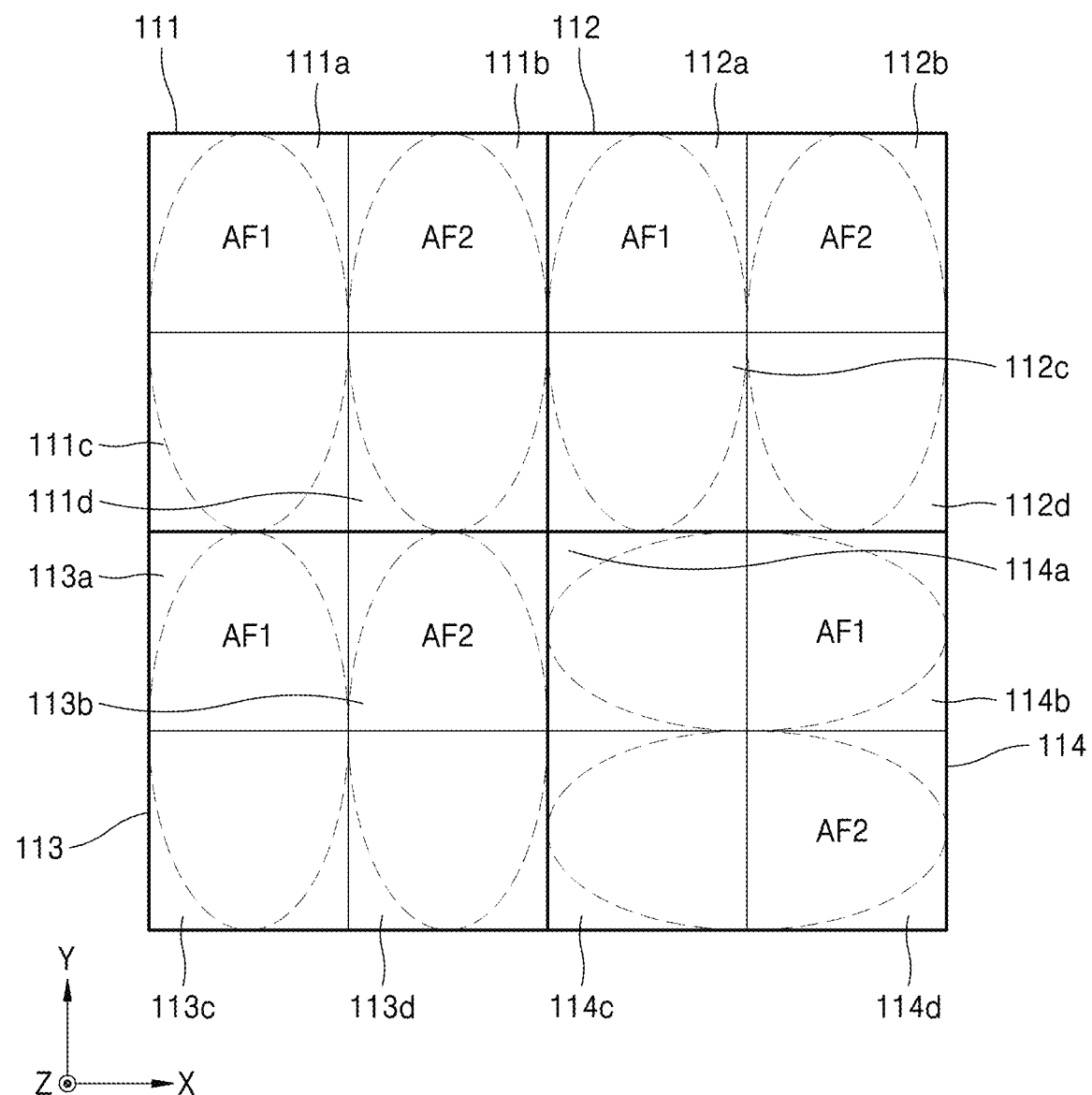

FIGS. 10A, 10B and 100 are plan views showing exemplary structures of a pixel array in an image sensor having a tetra cell structure for providing an auto-focusing signal in the phase-detection auto-focusing manner.

Referring to FIG. 10A, the first pixel 111 may include the 1-1st photosensitive cell 111a, the 1-2nd photosensitive cell 111b, a 1-3rd photosensitive cell 111c, and a 1-4th photosensitive cell 111d that are obtained by dividing the first pixel 111 into four in the first direction (X direction) and the second direction (Y direction). The 1-1st photosensitive cell 111a, the 1-2nd photosensitive cell 111b, the 1-3rd photosensitive cell 111c, and the 1-4th photosensitive cell 111d may independently output photosensitive signals, and may be respectively arranged on quadrants that are four parts into which the first pixel 111 has been divided in a 2×2 array shape. In this case, the 1-1st photosensitive cell 111a and the 1-3rd photosensitive cell 111c that are adjacent to each other in the second direction (Y direction) are the first focusing signal region of the first pixel 111, and the 1-2nd photosensitive cell 111b and the 1-4th photosensitive cell 111d that are adjacent to each other in the second direction (Y direction) are the second focusing signal region of the first pixel 111. Therefore, a focusing signal of the first focusing signal region of the first pixel 111 is a sum of an output from the 1-1st photosensitive cell 111a and an output from the 1-3rd photosensitive cell 111c, and a focusing signal of the second focusing signal region of the first pixel 111 is a sum of an output from the 1-2nd photosensitive cell 111b and an output from the 1-4th photosensitive cell 111d. A general image signal of the first pixel 111 may be obtained by summing up the outputs from the 1-1st photosensitive cell 111a, the 1-2nd photosensitive cell 111b, the 1-3rd photosensitive cell 111c and the 1-4th photosensitive cell 111d.

Also, the second pixel 112 may include the 2-1st photosensitive cell 112a, the 2-2nd photosensitive cell 112b, a 2-3rd photosensitive cell 112c, and a 2-4th photosensitive cell 112d that are obtained by dividing the second pixel 112 into four in the first direction (X direction) and the second direction (Y direction). The 2-1st photosensitive cell 112a, the 2-2nd photosensitive cell 112b, the 2-3rd photosensitive cell 112c, and the 2-4th photosensitive cell 112d may independently output photosensitive signals, and may be respectively arranged on quadrants that are four parts into which the second pixel 112 has been divided in a 2×2 array shape. In the second pixel 112, the 2-2nd photosensitive cell 112b and the 2-3rd photosensitive cell 112c that are adjacent to each other in the 45° diagonal direction are the first focusing signal region and the second focusing signal region of the second pixel 112. Therefore, the focusing signal of the first focusing signal region of the second pixel 112 is an output from the 2-2nd photosensitive cell 112b, and the focusing signal of the second focusing signal region of the second pixel 112 is an output from the 2-3rd photosensitive cell 112c. A general image signal of the second pixel 112 may be obtained by summing up the outputs from the 2-1st photosensitive cell 112a, the 2-2nd photosensitive cell 112b, the 2-3rd photosensitive cell 112c and the 2-4th photosensitive cell 112d.

Also, the third pixel 113 may include the 3-1st photosensitive cell 113a, the 3-2nd photosensitive cell 113b, a 3-3rd photosensitive cell 113c, and a 3-4th photosensitive cell 113d that are obtained by dividing the third pixel 113 into four in the first direction (X direction) and the second direction (Y direction). The 3-1st photosensitive cell 113a, the 3-2nd photosensitive cell 113b, the 3-3rd photosensitive cell 113c, and the 3-4th photosensitive cell 113d may independently output photosensitive signals, and may be respectively arranged on quadrants that are four parts into which the third pixel 113 has been divided in a 2×2 array shape. Like the second pixel 112, in the third pixel 113, the 3-2nd photosensitive cell 113b and the 3-3rd photosensitive cell 113c that are adjacent to each other in the 45° diagonal direction are the first focusing signal region and the second focusing signal region of the third pixel 113. Therefore, the focusing signal of the first focusing signal region of the third pixel 113 is an output from the 3-2nd photosensitive cell 113b, and the focusing signal of the second focusing signal region of the third pixel 113 is an output from the 3-3rd photosensitive cell 113c. A general image signal of the third pixel 113 may be obtained by summing up the outputs from the 3-1st photosensitive cell 113a, the 3-2nd photosensitive cell 113b, the 3-3rd photosensitive cell 113c and the 3-4th photosensitive cell 113d.

The fourth pixel 114 may include the 4-1st photosensitive cell 114a, the 4-2nd photosensitive cell 114b, a 4-3rd photosensitive cell 114c, and a 4-4th photosensitive cell 114d that are obtained by dividing the fourth pixel 114 into four in the first direction (X direction) and the second direction (Y direction). The 4-1st photosensitive cell 114a, the 4-2nd photosensitive cell 114b, the 4-3rd photosensitive cell 114c, and the 4-4th photosensitive cell 114d may independently output photosensitive signals, and may be respectively arranged on quadrants that are four parts into which the fourth pixel 114 has been divided in a 2×2 array shape. In the fourth pixel 114, the (4-1st photosensitive cell 114a and the 4-2nd photosensitive cell 114b that are adjacent to each other in the first direction (X direction) are the first focusing signal region of the fourth pixel 114, and the 4-3rd photosensitive cell 114c and the 4-4 photosensitive cell 1114d that are adjacent to each other in the first direction (X direction) are the second focusing signal region of the fourth pixel 114. Therefore, a focusing signal of the first focusing signal region of the fourth pixel 114 is a sum of an output from the 4-1st photosensitive cell 114a and an output from the 4-2nd photosensitive cell 114b, and a focusing signal of the second focusing signal region of the fourth pixel 114 is a sum of an output from the 4-3rd photosensitive cell 114c and an output from the 4-4th photosensitive cell 114d. A general image signal of the fourth pixel 114 may be obtained by summing up the outputs from the 4-1st photosensitive cell 114a, the 4-2nd photosensitive cell 114b, the 4-3rd photosensitive cell 114c and the 4-4th photosensitive cell 114d.

Referring to FIG. 10B, the first pixel 111 and the fourth pixel 114 are the same as those of FIG. 10A. In FIG. 10B, the 2-1st photosensitive cell 112a and the 2-4th photosensitive cell 112d that are adjacent to each other in the 135° diagonal direction are the first focusing signal region and the second focusing signal region of the second pixel 112. Therefore, the focusing signal of the first focusing signal region of the second pixel 112 is an output from the 2-1st photosensitive cell 112a, and the focusing signal of the second focusing signal region of the second pixel 112 is an output from the 2-4th photosensitive cell 112d. Likewise, the 3-1st photosensitive cell 113a and the 3-4th photosensitive cell 113d that are adjacent to each other in the 135° diagonal direction are the first focusing signal region and the second focusing signal region of the third pixel 113. Therefore, the focusing signal of the first focusing signal region of the third pixel 113 is an output from the 3-1st photosensitive cell 113a, and the focusing signal of the second focusing signal region of the third pixel 113 is an output from the 3-4th photosensitive cell 113d.

According to an example embodiment, in the second pixel 112 and the third pixel 113 in which the contrast ratio of the auto-focusing signal according to the arrangement direction of the focusing signal regions does not largely changes, the focusing signal regions may be configured in the same direction as that of the first pixel 111 or the fourth pixel 114. Referring to FIG. 10O, the 2-1st photosensitive cell 112a and the 2-3rd photosensitive cell 112c that are adjacent to each other in the second direction (Y direction) are the first focusing signal region of the second pixel 112, the 2-2nd photosensitive cell 112b and the 2-4th photosensitive cell 112d that are adjacent to each other in the second direction (Y direction) are the second focusing signal region of the second pixel 112, the 3-1st photosensitive cell 113a and the 3-3rd photosensitive cell 113c that are adjacent to each other in the second direction (Y direction) are the first focusing signal region of the third pixel 113, and the 3-2nd photosensitive cell 113b and the 3-4th photosensitive cell 113d that are adjacent to each other in the second direction (Y direction) are the second focusing signal region of the third pixel 113. Therefore, the focusing signal of the first focusing signal region of the second pixel 112 is a sum of the output from the 2-1st photosensitive cell 112a and the output from the 2-3rd photosensitive cell 112c, the focusing signal of the second focusing signal region of the second pixel 112 is a sum of the output from the 2-2nd photosensitive cell 112b and the 2-4th photosensitive cell 112d, the focusing signal of the first focusing signal region of the third pixel 113 is a sum of the output from the 3-1st photosensitive cell 113a and the 3-3rd photosensitive cell 113c, and the focusing signal of the second focusing signal region of the third pixel 113 is a sum of the output from the 3-2nd photosensitive cell 113b and the 3-4th photosensitive cell 113d.

Figure 11A:
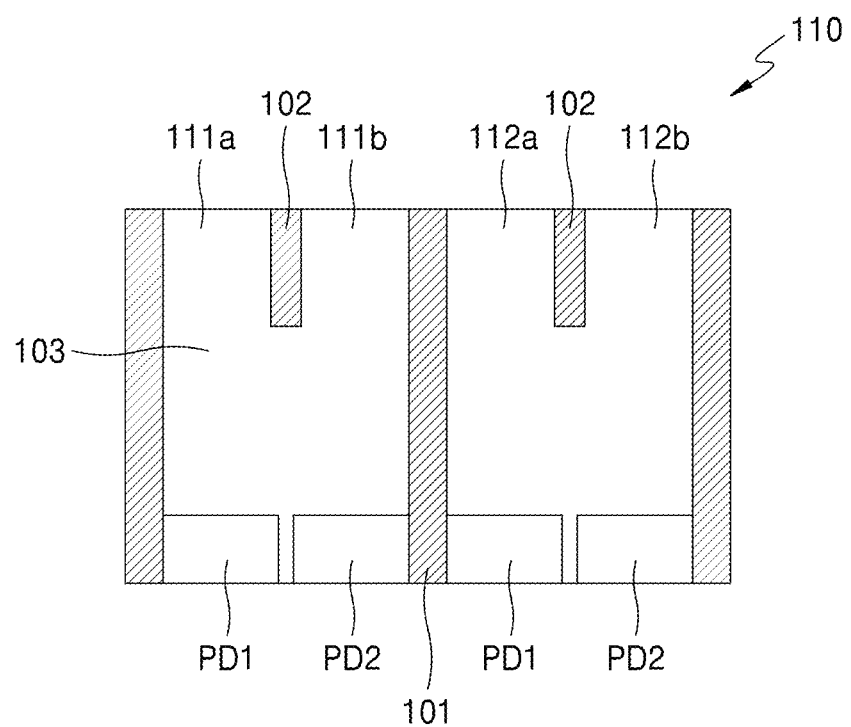
FIGS. 11A and 11B are cross-sectional views showing an exemplary structure of a pixel array in an image sensor showing a pixel isolation layer and a cell isolation layer.
Figure 11B:
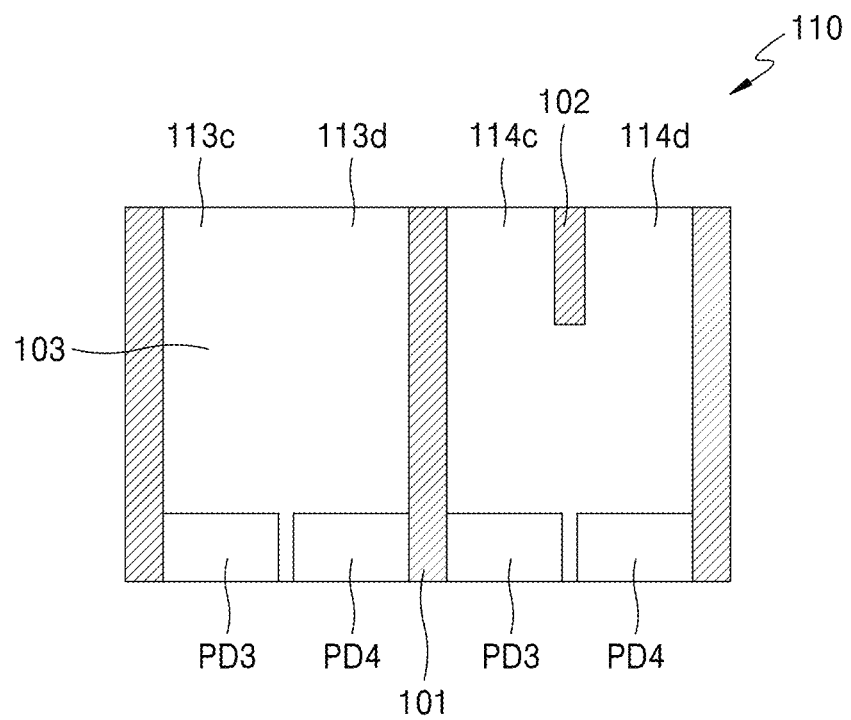

FIGS. 11A and 11B are cross-sectional views showing exemplary structures of the pixel array in an image sensor having a pixel isolation layer and a cell isolation layer, wherein FIG. 11A is a cross-sectional view taken along line A-A' of FIG. 10A and FIG. 11B is a cross-sectional view taken along line B-B' of FIG. 10A.

Referring to FIG. 11A and FIG. 11B, the sensor substrate 110 may include a pixel isolation layer 101 for separating the first pixel 111, the second pixel 112, the third pixel 113 and the fourth pixel 114 from each other. Although FIG. 11A only shows the pixel isolation layer 101 separating the first pixel 111 and the second pixel 112, and FIG. 11B shows the pixel isolation layer 101 separating the third pixel 113 and the fourth pixel 114, the disclosure is not limited thereto. As such, the pixel isolation layer 101 may further separate the first pixel 111 and the third pixel 113, and the second pixel 112 and the fourth pixel 114 in another cross-section taken along a different direction. The pixel isolation layer 101 may extend in the third direction (Z direction) from an upper surface of the sensor substrate 110 to lower surfaces of photodiodes PD1 and PD2 under the sensor substrate 110.

Also, the sensor substrate 110 may further include a cell isolation layer 102 for separating adjacent focusing signal regions or adjacent photosensitive cells. The cell isolation layer 102 may have a height that is less than that of the pixel isolation layer 101. For example, the height of the cell isolation layer 102 may be about ¼ to ½ of the height of the pixel isolation layer 101. The cell isolation layer 102 may extend in the third direction (Z direction) from the upper surface of the sensor substrate 110 to an intermediate portion in a light transferring layer 103 of the sensor substrate 110. The cell isolation layer 102 may reduce a cross-talk generating between the adjacent focusing signal regions or between adjacent photosensitive cells, so as to improve the contrast ratio of the auto-focusing signal. However, the cell isolation layer 102 may absorb/reflect the light and generate loss of light, and thus, may be omitted as necessary. For example, in the third pixel 113 that is the red pixel having a relatively low quantum efficiency, the cell isolation layer 102 may not be arranged. Also, the cell isolation layer 102 may be provided in the examples shown in FIGS. 9A to 9C.

A plurality of photodiodes PD1, PD2, PD3, and PD4 may be under the light transferring layer 103 of the sensor substrate 110. For example, four photodiodes PD1, PD2, PD3, and PD4 may be arranged to divide each of the first to fourth pixels 111, 112, 113, and 114 into four, and may have the same area as one another. The four photodiodes PD1, PD2, PD3, and PD4 may respectively correspond to four photosensitive cells in the first to fourth pixels 111, 112, 113, and 114. In FIGS. 11A and 11B, each of the first to fourth pixels 111, 112, 113, and 114 includes four photodiodes PD1, PD2, PD3, and PD4, but in the examples shown in FIGS. 9A to 9C, each of the first to fourth pixels 111, 112, 113, and 114 may only include two photodiodes PD1 and PD2.

Figure 12A:
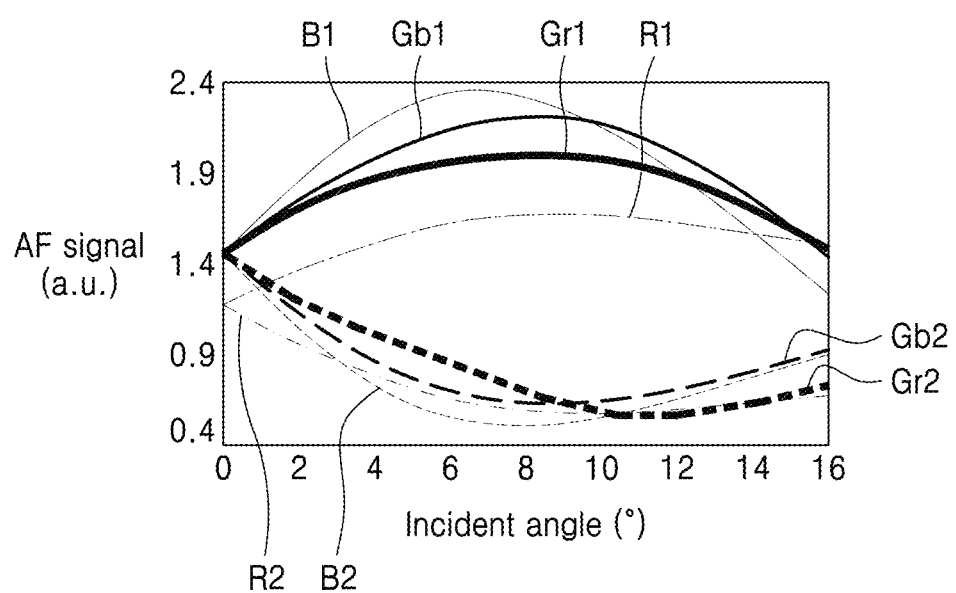
FIGS. 12A and 12B are graphs showing examples of change in an intensity of an auto-focusing signal and change in a contrast ratio of an auto-focusing signal according to an incident angle of light in a comparative example, in which directivity of the color separating lens array is not considered.
Figure 12B:
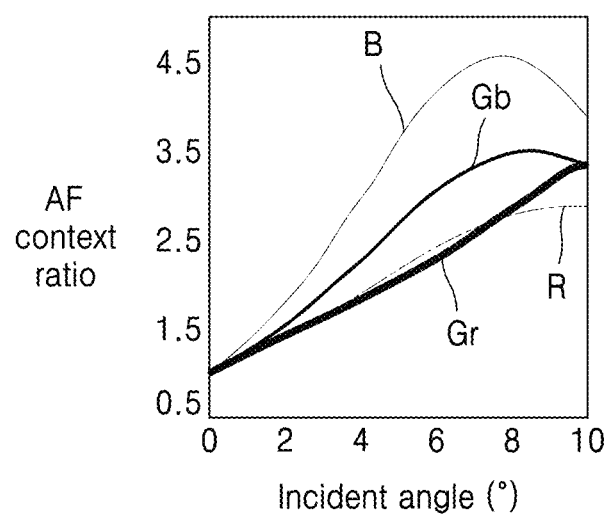

FIGS. 12A and 12B are graphs showing examples of change in the intensity of the auto-focusing signal and change in the contrast ratio of the auto-focusing signal according to the incident angle of light in a comparative example, in which directivity of the color separating lens array 130 is not considered. In FIG. 12A, graphs indicated as Gb1 and Gb2 denote two focusing signals of the first pixel 111, graphs indicated as B1 and B2 denote two focusing signals of the second pixel 112, graphs indicated as R1 and R2 are two focusing signals of the third pixel 113, and graphs indicated as Gr1 and Gr2 denote two focusing signals of the fourth pixel 114. Also, an angle indicated on the horizontal axis of FIGS. 12A and 12B denotes a deviation of the incident light from the CRA. In FIG. 12B, a graph indicated as Gb denotes a contrast ratio of the auto-focusing signal of the first pixel 111, a graph indicated as B denotes a contrast ratio of the auto-focusing signal of the second pixel 112, a graph indicated as R denotes a contrast ratio of the auto-focusing signal of the third pixel 113, and a graph indicated as Gr denotes a contrast ratio of the auto-focusing signal of the fourth pixel 114 Referring to FIGS. 12A and 12B, the focusing signals of the two green pixels, e.g., the first pixel 111 and the fourth pixel 114, are different from each other.

Figure 13A:
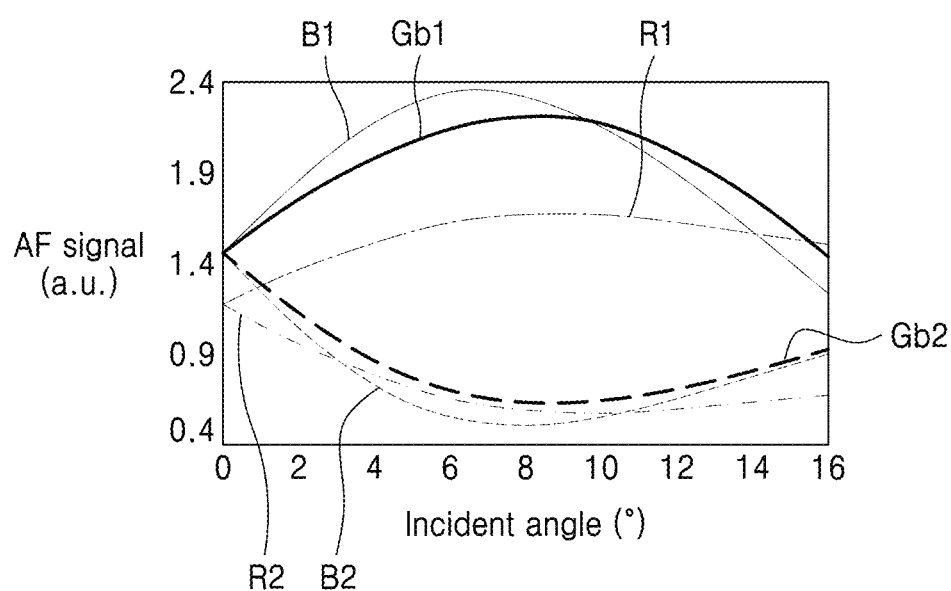
FIGS. 13A and 13B are graphs showing examples of change in an intensity of an auto-focusing signal and change in a contrast ratio of an auto-focusing signal according to an incident angle of light in an embodiment, in which directivity of the color separating lens array is considered.
Figure 13B:
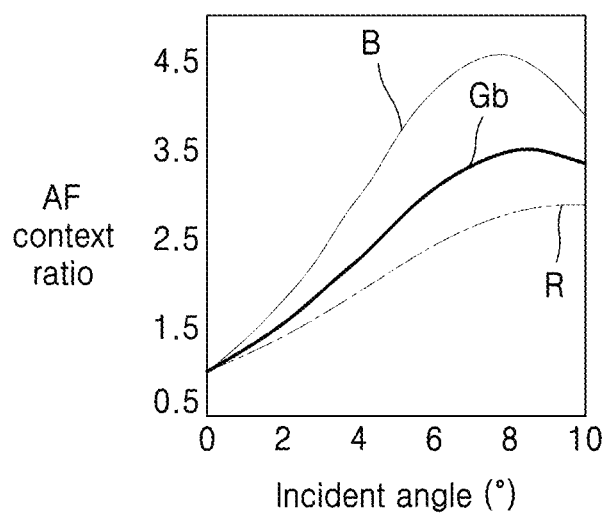

FIGS. 13A and 13B are graphs showing examples of change in the intensity of the auto-focusing signal and change in the contrast ratio of the auto-focusing signal according to the incident angle of light in an example embodiment, in which directivity of the color separating lens array 130 is considered. The graphs of FIGS. 13A and 13B are obtained only by taking into account the directivity of the first and fourth pixels 111 and 114. The focusing signal regions of the second and third pixels 112 and 113 are assumed to be arranged identically to the focusing signal regions of the first pixel 111, as shown in FIG. 9C. Referring to FIGS. 13A and 13B, the focusing signals are converged to one having higher contrast ratio between the focusing signals of the two green pixels, e.g., the first pixel 111 and the fourth pixel 114 in comparison with the focusing signals of the comparative example. In other words, focusing signals of the fourth pixel 114, which are indicated as Gr1 and Gr2 in FIG. 12A, become equal to focusing signals of the first pixel 111, which are indicated as Gb1 and Gb2. Also, a contrast ratio of an automatic focusing signal of the fourth pixel 111, which is indicated as Gr in FIG. 12B, becomes equal to that of an automatic focusing signal of the first pixel 111, which is indicated as Gb. This results from that a 4-1st photosensitive cell 114a and a 4-2nd photosensitive cell 114b are arranged so that the fourth pixel 114 is divided in a direction rotated by 90° (that is, first direction) with respect to a direction of dividing the first pixel 111 (that is, second direction) in consideration of the directionality of the color separating lens array 130. Therefore, the contrast ratio of the auto-focusing signal may be entirely improved in the image sensor 1000.

In addition, the CRA of the light that is incident on, from one point of an object, the image sensor 1000, the pixel array 1100, or the sensor substrate 110 after passing through the lens assembly of the camera varies depending on a location on the image sensor 1000, the pixel array 1100, or the sensor substrate 110. For example, the CRA of the incident light that is incident on a center of the image sensor 1000, the pixel array 1100, or the sensor substrate 110 is 0°, and increases gradually away from the center. When the CRA varies, the contrast ratio of the auto-focusing signal may also vary. Therefore, the position of the cell isolation layer 102 may be adjusted according to the CRA.

Figure 14A:
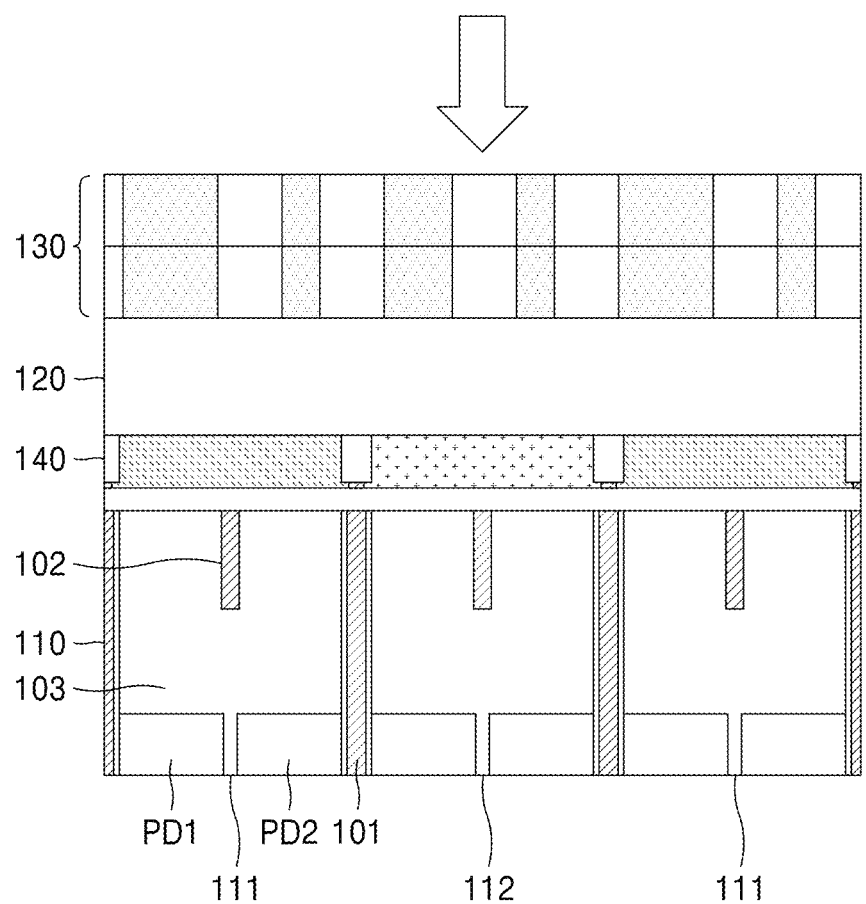
FIG. 14A is a cross-sectional view showing an exemplary structure of a pixel array at a center portion of an image sensor.
Figure 14B:
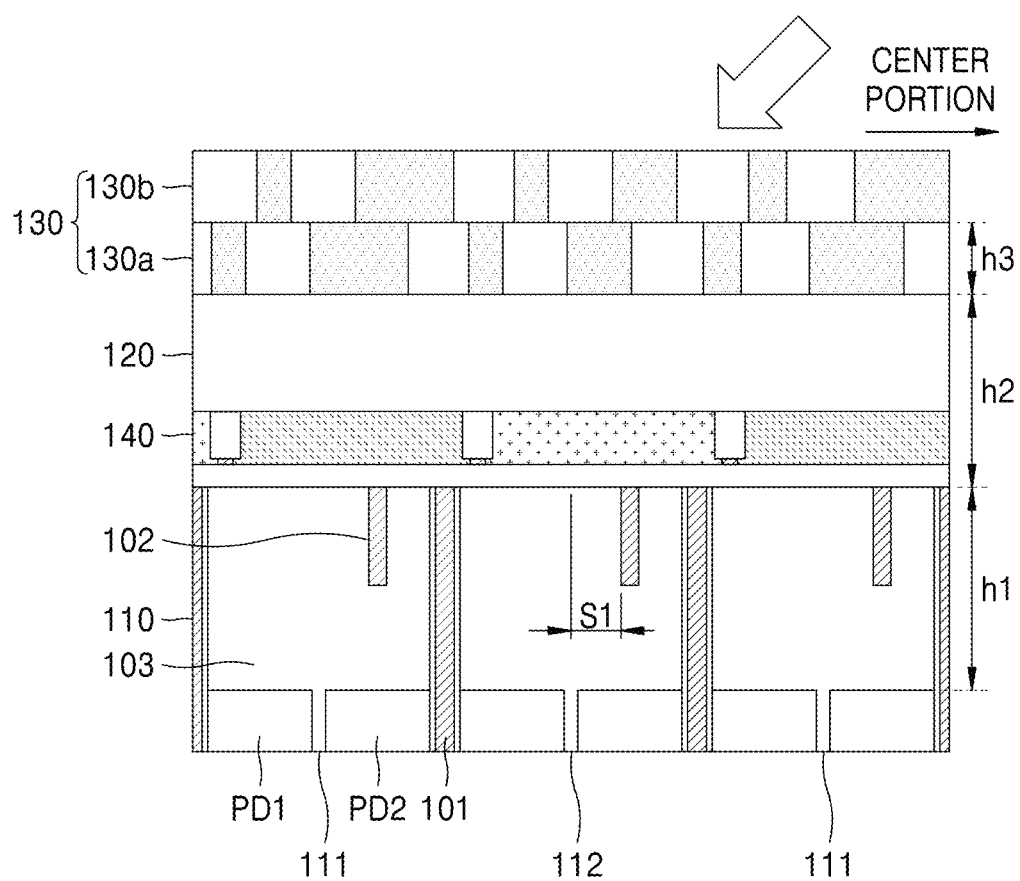
FIG. 14B is a cross-sectional view showing an exemplary structure of a pixel array at an edge portion of an image sensor.

FIG. 14A is a cross-sectional view showing an exemplary structure of a pixel array at a center portion of an image sensor, and FIG. 14B is a cross-sectional view showing an exemplary structure of a pixel array at an edge portion of an image sensor.

Referring to FIG. 14A, at the center portion of the image sensor 1000, the light is perpendicularly incident on a surface of the pixel array 1100 at a CRA of 0°. In this case, the cell isolation layer 102 may be located at a center of each pixel. For example, in the first pixel 111 located at the center portion of the image sensor 1000, the center portion of the pixel array 1100, or the center portion of the sensor substrate 110, the cell isolation layer 102 may be located to pass through the center of the first pixel 111, and in the second pixel 112 located at the center of the image sensor 1000, the center of the pixel array 1100, or the center of the sensor substrate 110, the cell isolation layer 102 may be located to pass through the center of the second pixel 112.

Referring to FIG. 14B, at the edge portion of the image sensor 1000, the light may be obliquely incident on the surface of the pixel array 1100 at the CRA that is greater than 0°. In this case, in each pixel located at the edge portion of the image sensor 1000, an edge portion of the pixel array 1100, or an edge portion of the sensor substrate 110, the cell isolation layer 102 may be shifted toward the center portion of the image sensor 1000, the center portion of the pixel array 1100, or the center portion of the sensor substrate 110.

In order to improve a color separating efficiency and a color purity, the color filter array 140 and the color separating lens array 130 may be also shifted in the same direction as the cell isolation layer 102. Also, when the color separating lens array 130 has a dual-layered structure, the color separating lens array at the upper portion may be further shifted than the color separating lens array at the lower portion. For example, when the color separating lens array 130 includes a first color separating lens array 130a and a second color separating lens array 130b on the first color separating lens array 130a, the second color separating lens array 130b may be further shifted toward the center portion of the image sensor 1000, the center portion of the pixel array 1100, or the center portion of the sensor substrate 110 than the first color separating lens array 130a.

When a thickness of the light transferring layer 103 of the sensor substrate 110 is h1, a shifted distance S1 of the cell isolation layer 102 may be expressed by Equation 2 below.

$$S1 = h1 \times \tan(\sin^{-1}(n_{si}^{-1} \times \sin \theta))$$ [Equation 2]

Here, δ denotes a CRA of incident light, and $n_{si}$ denotes a refractive index of the light transferring layer 103.

Also, a shifted distance S2 of the first color separating lens array 130a may be expressed by Equation 3 below.

$$S2 = S1 + (h2 + h3/2) \times \tan(\sin^{-1}(n_{int}^{-1} \times \sin \theta))$$ [Equation 3]

Here, h2 denotes a thickness of the color filter array 140 and the spacer layer 120, $n_{int}$ denotes an average refractive index of the color filter array 140 and the spacer layer 120, and h3 denotes a thickness of the first color separating lens array 130a. When the color filter array 140 is omitted, h2 denotes a thickness of the spacer layer 120 and $n_{int}$ denotes a refractive index of the spacer layer 120.

Also, a shifted distance S3 of the second color separating lens array 130b may be expressed by Equation 4 below.

$$S3 = S1 + S2 + h3/2 \times \tan(\sin^{-1}(n_{oxide}^{-1} \times \sin \theta))$$ [Equation 4]

Here, $n_{oxide}$ denotes a refractive index of a dielectric material surrounding the nanoposts in the first color separating lens array 130a.

In each of the pixels in the sensor substrate 110, the cell isolation layer 102 is shifted, but a location, a size, and a shape of the pixel are maintained. Also, locations, sizes, and shapes of the plurality of photodiodes PD1 and PD2 arranged in the pixels may be also maintained.

Figure 15:
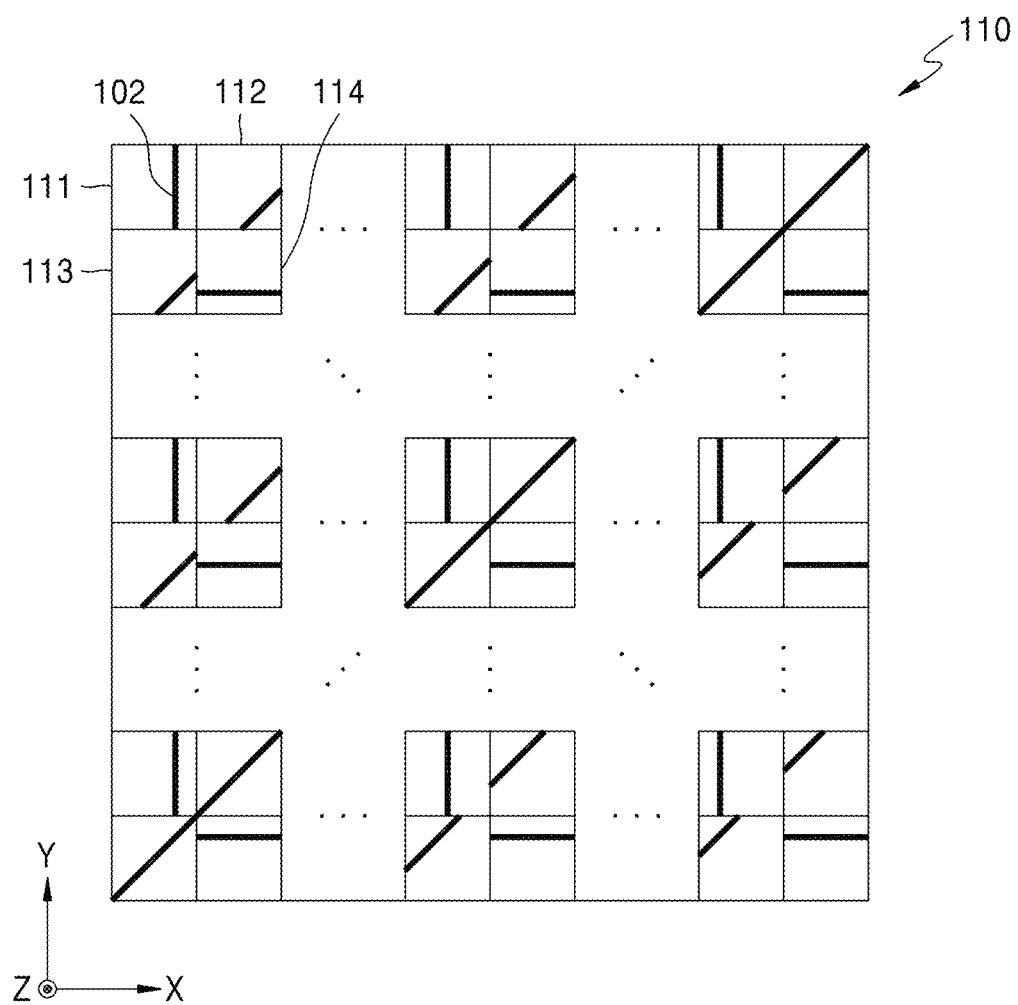
FIG. 15 is a plan view showing an example of a shift of a cell isolation layer in a pixel array having a dual-cell structure.

FIG. 15 is a plan view showing an example of a shift of a cell isolation layer in a pixel array having a dual-cell structure. Referring to FIG. 15, the cell isolation layer 102 of the first pixel 111 extends in the second direction (Y direction), the cell isolation layers 102 in the second and third pixels 112 and 113 extend in a first diagonal direction, and the cell isolation layer 102 in the fourth pixel 114 extends in the first direction (X direction). According to an example embodiment, as illustrated in FIG. 15, the cell isolation layer 102 of the first pixel 111, the cell isolation layer 102 in the second pixel 112, the cell isolation layer 102 in the third pixels 113, and the cell isolation layer 102 in the fourth pixel 114 extend in a straight manner. At the center of the sensor substrate 110, each of the cell isolation layers 102 in the first to fourth pixels 111, 112, 113, and 114 may be located to pass through the center of corresponding first to fourth pixels 111, 112, 113, and 114.

Also, in the first pixel 111 located at a periphery portion of the sensor substrate 110 in the first direction, the cell isolation layer 102 may be shifted toward the center of the sensor substrate 110 in the first direction, and in the fourth pixel 114 located at a periphery portion of the sensor substrate 110, the cell isolation layer 102 may be shifted toward the center of the sensor substrate 110 in the second direction. In addition, in the second and third pixels 112 and 113 that are located at the periphery portion of the sensor substrate 110 in a second diagonal direction intersecting with the first diagonal direction, the cell isolation layer 102 may be shifted toward the center of the sensor substrate 110 in the second diagonal direction. However, in the second and third pixels 112 and 113 that are located at the periphery portion of the sensor substrate 110 in the first diagonal direction, the cell isolation layer 102 may not be shifted.

Figure 16:
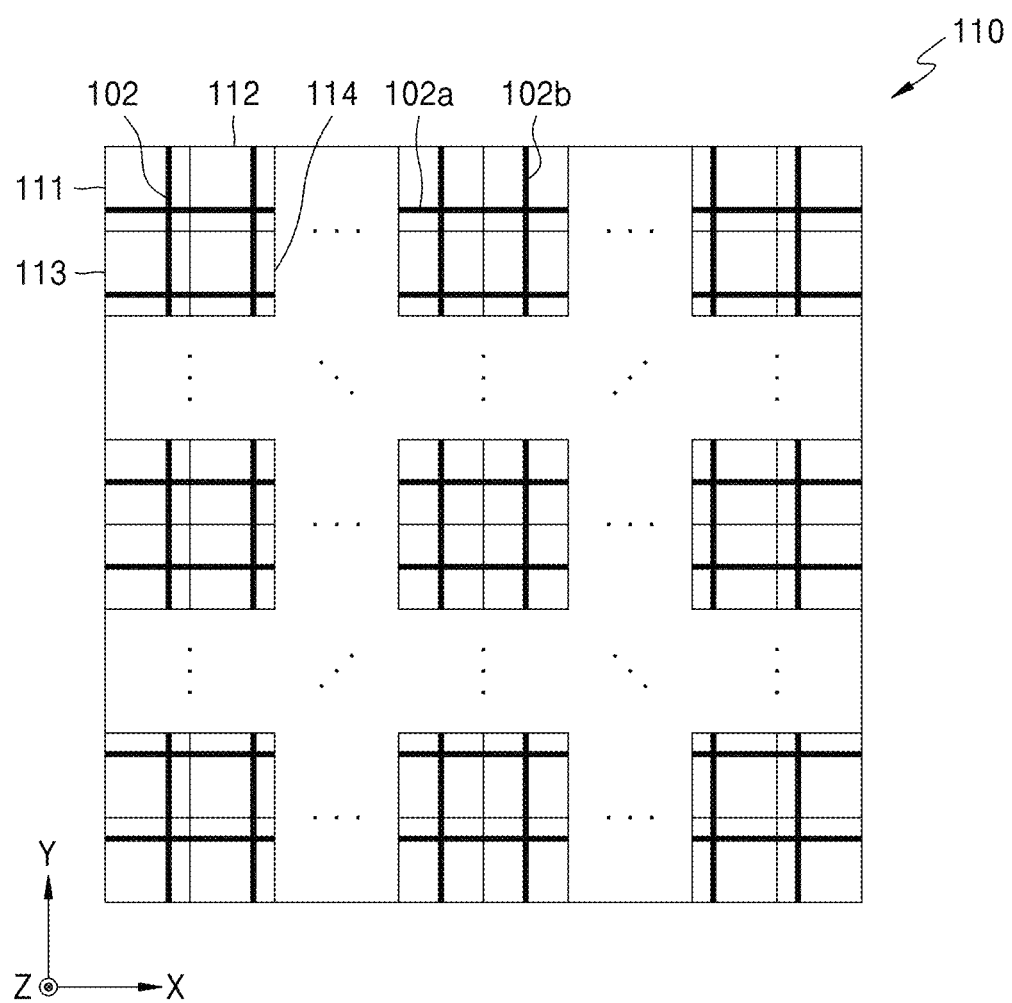
FIG. 16 is a plan view showing an example of a shift of a cell isolation layer in a pixel array having a tetra-cell structure.

FIG. 16 is a plan view showing an example of a shift of a cell isolation layer in a pixel array having a tetra-cell structure. Referring to FIG. 16, in the pixel array 1100 having the tetra-cell structure, the cell isolation layer 102 may include a first direction isolation layer 102a that extends straightly in the first direction and a second direction isolation layer 102b that extends straightly in the second direction and intersects with the first direction isolation layer 102a. At the center portion of the sensor substrate 110, the first direction isolation layer 102a and the second direction isolation layer 102b are arranged to pass through the center of each pixel. In other words, in each of the pixels located at the center portion of the sensor substrate 110, a cross point between the first direction isolation layer 102a and the second direction isolation layer 102b is located at the center of each pixel.

In each of the pixels located on the periphery portion of the sensor substrate 110 in the first direction, the second direction isolation layer 102b is shifted toward the center of the sensor substrate 110 in the first direction, and in each of the pixels located on the periphery portion of the sensor substrate 110 in the second direction, the first direction isolation layer 102a may be shifted toward the center of the sensor substrate 110 in the second direction. In other words, in each of the pixels located on the periphery portion of the sensor substrate 110 in the first direction, a cross point between the first direction isolation layer 102a and the second direction isolation layer 102b may be shifted toward the center of the sensor substrate 110 in the first direction, and in each of the pixels located on the periphery portion of the sensor substrate 110 in the second direction, a cross point between the first direction isolation layer 102a and the second direction isolation layer 102b may be shifted toward the center of the sensor substrate 110 in the second direction.

Figure 17A:
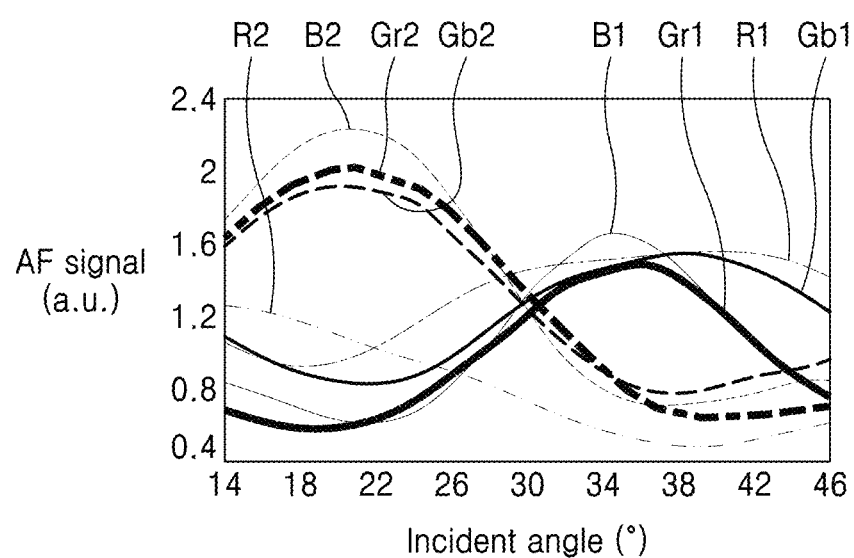
FIGS. 17A and 17B are graphs showing examples of changes in an intensity of an auto-focusing signal and a contrast ratio of the auto-focusing signal according to an incident angle of light in a comparative example in which a cell isolation layer is not shifted.
Figure 17B:
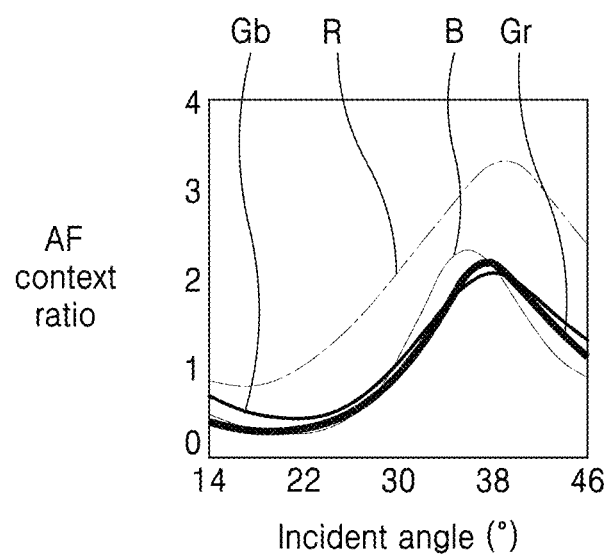

FIGS. 17A and 17B are graphs showing examples of changes in the intensity of the auto-focusing signal and the contrast ratio of the auto-focusing signal according to an incident angle of light in a comparative example in which the cell isolation layer is not shifted. In FIGS. 17A and 17B, a directivity of the color separating lens array 130 is not considered, and the CRA of the incident light is assumed to be about 30°. In FIG. 17A, graphs indicated as Gb1 and Gb2 denote two focusing signals of the first pixel 111, graphs indicated as B1 and B2 denote two focusing signals of the second pixel 112, graphs indicated as R1 and R2 are two focusing signals of the third pixel 113, and graphs indicated as Gr1 and Gr2 denote two focusing signals of the fourth pixel 114. In FIG. 17B, a graph indicated as Gb denotes a contrast ratio of the auto-focusing signal of the first pixel 111, a graph indicated as B denotes a contrast ratio of the auto-focusing signal of the second pixel 112, a graph indicated as R denotes a contrast ratio of the auto-focusing signal of the third pixel 113, and a graph indicated as Gr denotes a contrast ratio of the auto-focusing signal of the fourth pixel 114. In addition, an angle shown on the horizontal axis of FIGS. 17A and 17B shows an incident angle of the incident light. Referring to FIGS. 17A and 17B, in the comparative example, two focusing signals of each pixel do not show sufficient symmetry with respect to the CRA, that is, 30°.

Figure 18A:
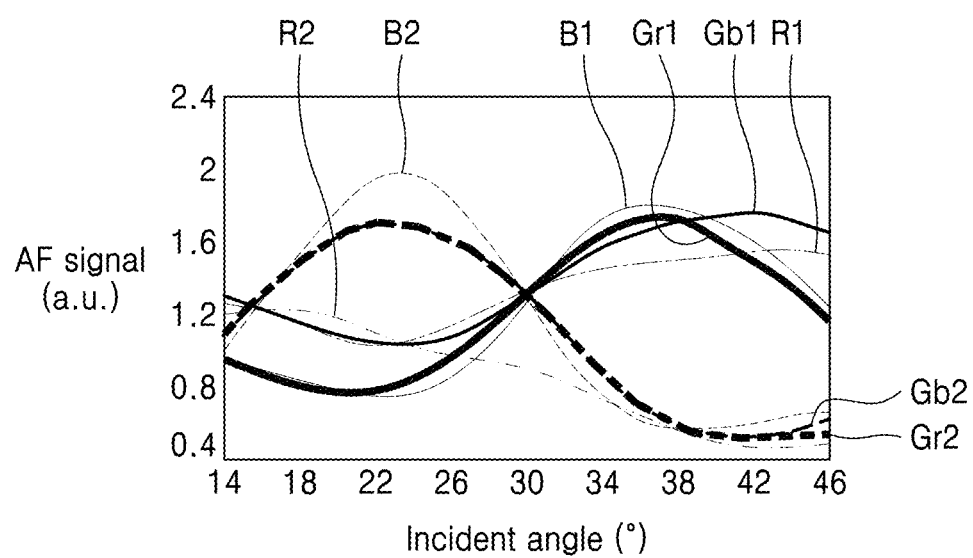
FIGS. 18A and 18B are graphs showing examples of changes in an intensity of an auto-focusing signal and a contrast ratio of the auto-focusing signal according to an incident angle of light in an embodiment in which a cell isolation layer is shifted.
Figure 18B:
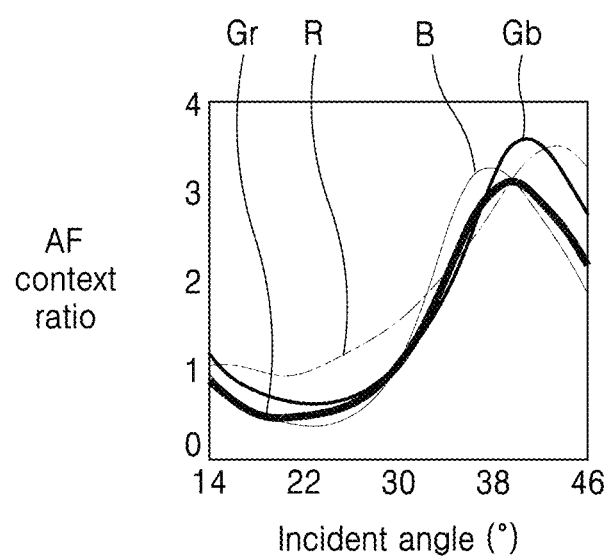

FIGS. 18A and 18B are graphs showing examples of changes in the intensity of the auto-focusing signal and the contrast ratio of the auto-focusing signal according to an incident angle of light in an example embodiment in which the cell isolation layer is shifted. In FIGS. 18A and 18B, the directivity of the first and fourth pixels 111 and 114 is considered, and the cell isolation layer 102 is shifted by 4 nm/CRA (°) in consideration of the CRA of 30°. Referring to FIGS. 18A and 18B, the symmetry with respect to the CRA, e.g., 30°, is recovered to a certain degree. Also, the contrast ratio of the auto-focusing signal is also increased.

According to the image sensor 1000 including the pixel array 1100 described above, light loss due to a colorfilter, e.g., an organic color filter, rarely occurs, and thus, a sufficient amount of light may be provided to the pixels even when the pixels become smaller. Therefore, an ultra-high resolution, ultra-small, and highly sensitive image sensor having hundreds of millions of pixels or more may be manufactured. Such an ultra-high resolution, ultra-small, and highly sensitive image sensor may be employed in various high-performance optical devices or high-performance electronic apparatuses. The electronic apparatuses may include, for example, smartphones, mobile phones, cell phones, personal digital assistants (PDAs), laptop computers, personal computers (PCs), a variety of portable devices, electronic apparatuses, surveillance cameras, medical camera, automobiles, Internet of Things (IoT) devices, other mobile or non-mobile computing devices and are not limited thereto.

The electronic apparatuses may further include, in addition to the image sensor 1000, a processor for controlling the image sensor, for example, an application processor (AP), and may control a plurality of hardware or software elements and may perform various data processes and operations by driving an operation system or application programs via the processor. The processor may further include a graphic processing unit (GPU) and/or an image signal processor. When an image signal processor is included in the processor, an image (or video) obtained by the image sensor may be stored and/or output by using the processor. In addition, the processor receives two photosensitive signals from opposite edges spaced apart from each other in each pixel of the image sensor, and generates the auto-focusing signal based on a difference between the two photosensitive signals.

Figure 19:
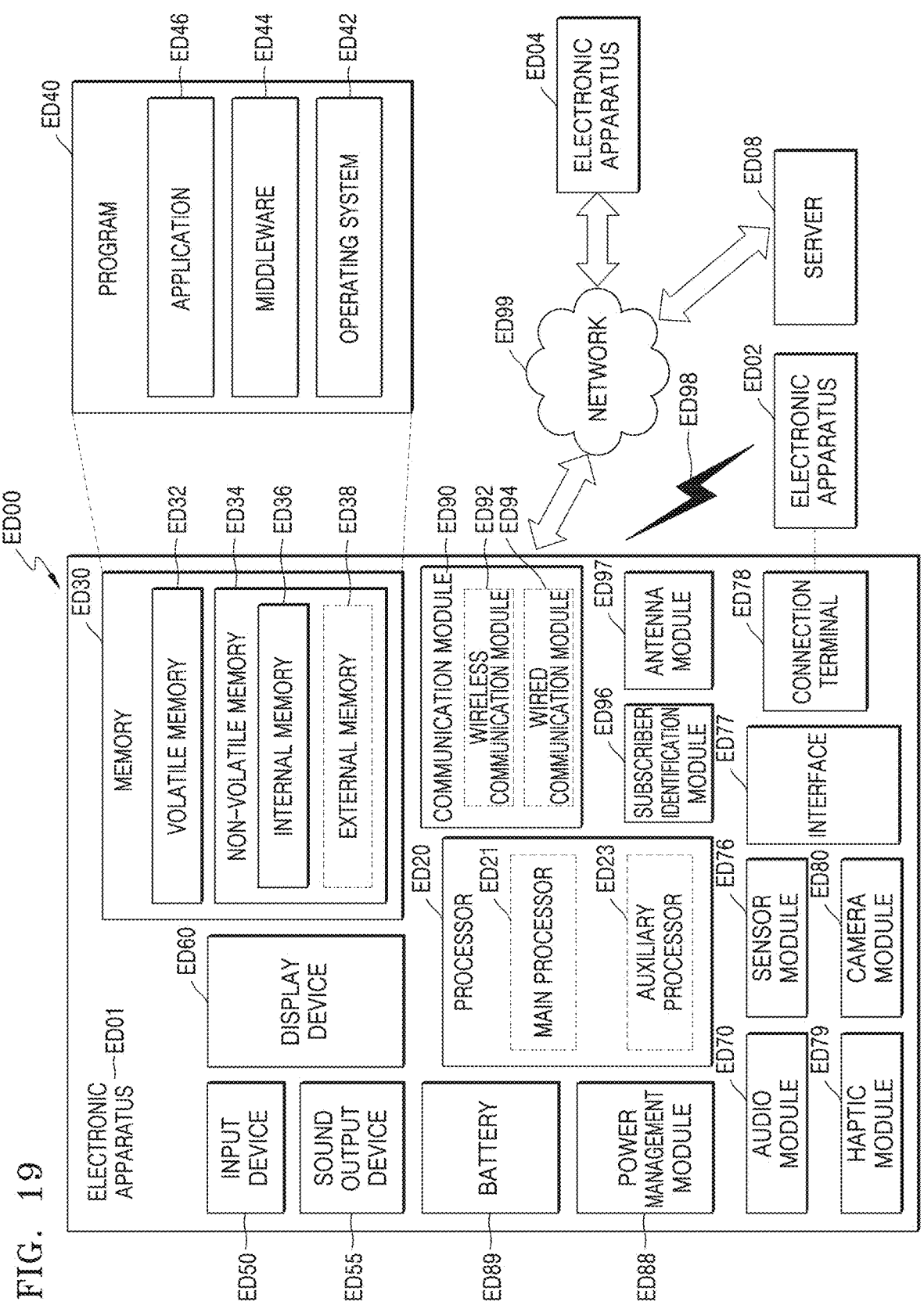
FIG. 19 is a block diagram of an electronic device including an image sensor according to one or more embodiments.

FIG. 19 is a block diagram showing an example of an electronic apparatus ED01 including the image sensor 1000. Referring to FIG. 19, in a network environment ED00, the electronic apparatus ED01 may communicate with another electronic apparatus ED02 via a first network ED98 (short-range wireless communication network, etc.), or may communicate with another electronic apparatus ED04 and/or a server ED08 via a second network ED99 (long-range wireless communication network, etc.) The electronic apparatus ED01 may communicate with the electronic apparatus ED04 via the server ED08. The electronic apparatus ED01 may include a processor ED20, a memory ED30, an input device ED50, a sound output device ED55, a display device ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. In the electronic apparatus ED01, some (display device ED60, etc.) of the elements may be omitted or another element may be added. Some of the elements may be configured as one integrated circuit. For example, the sensor module ED76 may be embedded and implemented in the display device ED60. For example, sensor module ED76 may include a fingerprint sensor, an iris sensor, an illuminance sensor, etc. and the display device may include a display, etc.

The processor ED20 may control one or more elements (hardware, software elements, etc.) of the electronic apparatus ED01 connected to the processor ED20 by executing software (program ED40, etc.), and may perform various data processes or operations. As a part of the data processing or operations, the processor ED20 may load a command and/or data received from another element (sensor module ED76, communication module ED90, etc.) to a volatile memory ED32, may process the command and/or data stored in the volatile memory ED32, and may store result data in a non-volatile memory ED34. The processor ED20 may include a main processor ED21 (central processing unit, application processor, etc.) and an auxiliary processor ED23 (graphic processing unit, image signal processor, sensor hub processor, communication processor, etc.) that may be operated independently from or along with the main processor ED21. The auxiliary processor ED23 may use less power than that of the main processor ED21, and may perform specified functions.

The auxiliary processor ED23, on behalf of the main processor ED21 while the main processor ED21 is in an inactive state (sleep state) or along with the main processor ED21 while the main processor ED21 is in an active state (application executed state), may control functions and/or states related to some (display device ED60, sensor module ED76, communication module ED90, etc.) of the elements in the electronic apparatus ED01. The auxiliary processor ED23 (image signal processor, communication processor, etc.) may be implemented as a part of another element (camera module ED80, communication module ED90, etc.) that is functionally related thereto.

The memory ED30 may store various data required by the elements (processor ED20, sensor module ED76, etc.) of the electronic apparatus ED01. The data may include, for example, input data and/or output data about software (program ED40, etc.) and commands related thereto. The memory ED30 may include the volatile memory ED32 and/or the non-volatile memory ED34. The non-volatile memory ED34 may include an internal memory ED36 fixedly installed in the electronic apparatus ED01, and an external memory ED38 that is detachable.

The program ED40 may be stored as software in the memory ED30, and may include an operation system ED42, middleware ED44, and/or an application ED46.

The input device ED50 may receive commands and/or data to be used in the elements (processor ED20, etc.) of the electronic apparatus ED01, from outside (user, etc.) of the electronic apparatus ED01. The input device ED50 may include a microphone, a mouse, a keyboard, and/or a digital pen (stylus pen).

The sound output device ED55 may output a sound signal to outside of the electronic apparatus ED01. The sound output device ED55 may include a speaker and/or a receiver. The speaker may be used for a general purpose such as multimedia reproduction or record play, and the receiver may be used to receive a call. The receiver may be coupled as a part of the speaker or may be implemented as an independent device.

The display device ED60 may provide visual information to outside of the electronic apparatus ED01. The display device ED60 may include a display, a hologram device, or a projector, and a control circuit for controlling the corresponding device. The display device ED60 may include a touch circuitry set to sense a touch, and/or a sensor circuit (pressure sensor, etc.) that is set to measure a strength of a force generated by the touch.

The audio module ED70 may convert sound into an electrical signal or vice versa. The audio module ED 70 may acquire sound through the input device ED50, or may output sound via the sound output device ED55 and/or a speaker and/or a headphone of another electronic apparatus (electronic apparatus ED02, etc.) connected directly or wirelessly to the electronic apparatus ED01.

The sensor module ED76 may sense an operating state (power, temperature, etc.) of the electronic apparatus ED01, or an outer environmental state (user state, etc.), and may generate an electrical signal and/or data value corresponding to the sensed state. The sensor module ED76 may include a gesture sensor, a gyro-sensor, a pressure sensor, a magnetic sensor, an acceleration sensor, a grip sensor, a proximity sensor, a color sensor, an infrared (IR) ray sensor, a vivo sensor, a temperature sensor, a humidity sensor, and/or an illuminance sensor.

The interface ED77 may support one or more designated protocols that may be used in order for the electronic apparatus ED01 to be directly or wirelessly connected to another electronic apparatus (electronic apparatus ED02, etc.) The interface ED77 may include a high-definition multimedia interface (HDMI), a universal serial bus (USB) interface, an SD card interface, and/or an audio interface.

The connection terminal ED78 may include a connector by which the electronic apparatus ED01 may be physically connected to another electronic apparatus (electronic apparatus ED02, etc.). The connection terminal ED78 may include an HDMI connector, a USB connector, an SD card connector, and/or an audio connector (headphone connector, etc.).

The haptic module ED79 may convert the electrical signal into a mechanical stimulation (vibration, motion, etc.) or an electric stimulation that the user may sense through a tactile or motion sensation. The haptic module ED79 may include a motor, a piezoelectric device, and/or an electric stimulus device.

The camera module ED80 may capture a still image and a video. The camera module ED80 may include a lens assembly including one or more lenses, the image sensor 1000 of FIG. 1, image signal processors, and/or flashes. The lens assembly included in the camera module ED80 may collect light emitted from an object that is an object to be captured.

The power management module ED88 may manage the power supplied to the electronic apparatus ED01. The power management module ED88 may be implemented as a part of a power management integrated circuit (PMIC).

The battery ED89 may supply electric power to components of the electronic apparatus ED01. The battery ED89 may include a primary battery that is not rechargeable, a secondary battery that is rechargeable, and/or a fuel cell.

The communication module ED90 may support the establishment of a direct (wired) communication channel and/or a wireless communication channel between the electronic apparatus ED01 and another electronic apparatus (electronic apparatus ED02, electronic apparatus ED04, server ED08, etc.), and execution of communication through the established communication channel. The communication module ED90 may be operated independently from the processor ED20 (application processor, etc.), and may include one or more communication processors that support the direct communication and/or the wireless communication. The communication module ED90 may include a wireless communication module ED92 (cellular communication module, a short-range wireless communication module, a global navigation satellite system (GNSS) communication module) and/or a wired communication module ED94 (local area network (LAN) communication module, a power line communication module, etc.). From among the communication modules, a corresponding communication module may communicate with another electronic apparatus via a first network ED98 (short-range communication network such as Bluetooth, WiFi direct, or infrared data association (IrDA)) or a second network ED99 (long-range communication network such as a cellular network, Internet, or computer network (LAN, WAN, etc.)). Such above various kinds of communication modules may be integrated as one element (single chip, etc.) or may be implemented as a plurality of elements (a plurality of chips) separately from one another. The wireless communication module ED92 may identify and authenticate the electronic apparatus ED01 in a communication network such as the first network ED98 and/or the second network ED99 by using subscriber information (international mobile subscriber identifier (IMSI), etc.) stored in the subscriber identification module ED96.

The antenna module ED97 may transmit or receive the signal and/or power to/from outside (another electronic apparatus, etc.). An antenna may include a radiator formed as a conductive pattern formed on a substrate (PCB, etc.). The antenna module ED97 may include one or more antennas. When the antenna module ED97 includes a plurality of antennas, from among the plurality of antennas, an antenna that is suitable for the communication type used in the communication network such as the first network ED98 and/or the second network ED99 may be selected by the communication module ED90. The signal and/or the power may be transmitted between the communication module ED90 and another electronic apparatus via the selected antenna. Another component (RFIC, etc.) other than the antenna may be included as a part of the antenna module ED97.

Some of the elements may be connected to one another via the communication method among the peripheral devices (bus, general purpose input and output (GPIO), serial peripheral interface (SPI), mobile industry processor interface (MIPI), etc.) and may exchange signals (commands, data, etc.).

The command or data may be transmitted or received between the electronic apparatus ED01 and the external electronic apparatus ED04 via the server ED08 connected to the second network ED99. Other electronic apparatuses ED02 and ED04 may be the devices that are the same as or different kinds from the electronic apparatus ED01. All or some of the operations executed in the electronic apparatus ED01 may be executed in one or more devices among the other electronic apparatuses ED02, ED04, and ED08. For example, when the electronic apparatus ED01 has to perform a certain function or service, the electronic apparatus ED01 may request one or more other electronic apparatuses to perform some or entire function or service, instead of executing the function or service by itself. One or more electronic apparatuses receiving the request execute an additional function or service related to the request and may transfer a result of the execution to the electronic apparatus ED01. To do this, for example, a cloud computing, a distributed computing, or a client-server computing technique may be used.

Figure 20:
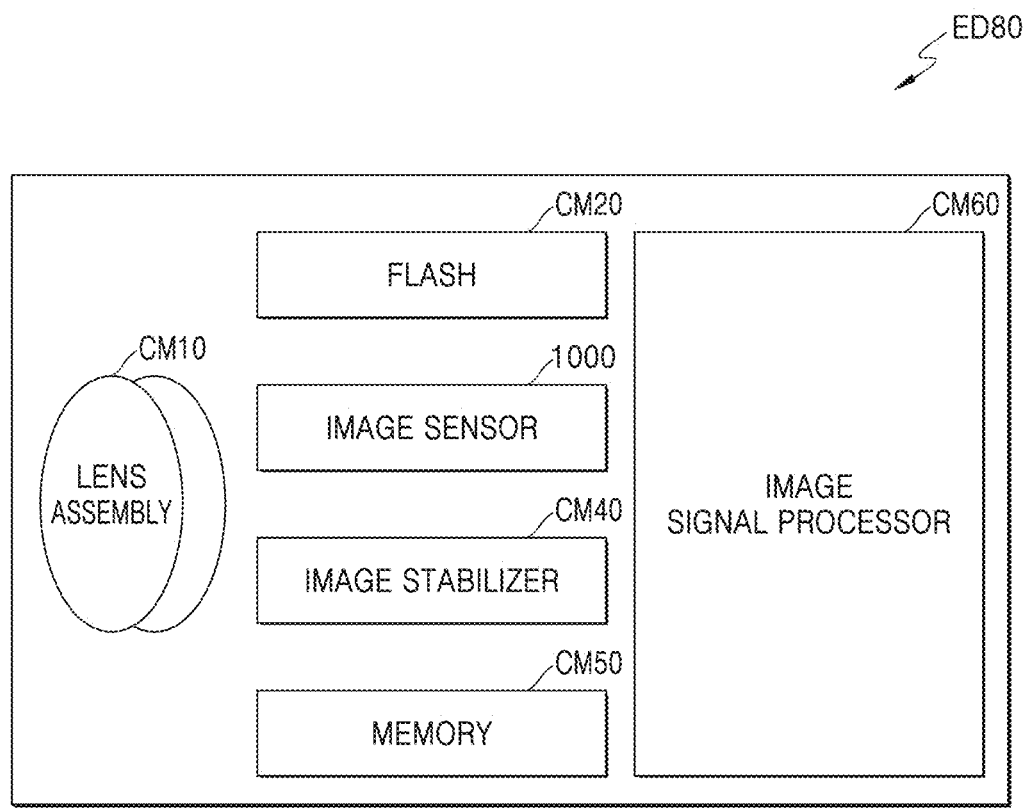
FIG. 20 is a block diagram of a camera module in FIG. 19.

FIG. 20 is a block diagram showing the camera module ED80 of FIG. 19. Referring to FIG. 20, the camera module ED80 may include a lens assembly CM10, a flash CM20, an image sensor 1000 (the image sensor 1000 of FIG. 1), an image stabilizer CM40, a memory CM50 (buffer memory, etc.), and/or an image signal processor CM60. The lens assembly CM10 may collect light emitted from an object, that is, an object to be captured. The camera module ED80 may include a plurality of lens assemblies CM10, and in this case, the camera module ED80 may include a dual camera module, a 360-degree camera, or a spherical camera. Some of the plurality of lens assemblies CM10 may have the same lens properties (viewing angle, focal distance, auto-focus, F number, optical zoom, etc.) or different lens properties. The lens assembly CM10 may include a wide-angle lens or a telephoto lens.

The flash CM20 may emit light that is used to strengthen the light emitted or reflected from the object. The flash CM20 may include one or more light-emitting diodes (red-green-blue (RGB) LED, white LED, infrared LED, ultraviolet LED, etc.), and/or a Xenon lamp. The image sensor 1000 may be the image sensor described above with reference to FIG. 1, and converts the light emitted or reflected from the object and transferred through the lens assembly CM10 into an electrical signal to obtain an image corresponding to the object. The image sensor 1000 may include one or more selected sensors from among image sensors having different properties such as an RGB sensor, a black-and-white (BW) sensor, an IR sensor, and a UV sensor. Each of the sensors included in the image sensor 1000 may be implemented as a charge coupled device (CCD) sensor and/or a complementary metal oxide semiconductor (CMOS) sensor.

The image stabilizer CM40, in response to a motion of the camera module ED80 or the electronic apparatus ED01 including the camera module ED80, moves one or more lenses included in the lens assembly CM10 or the image sensor 1000 in a certain direction or controls the operating characteristics of the image sensor 1000 (adjusting of a read-out timing, etc.) in order to compensate for a negative influence of the motion. The image stabilizer CM40 may sense the movement of the camera module ED80 or the electronic apparatus ED01 by using a gyro sensor (not shown) or an acceleration sensor (not shown) arranged in or out of the camera module ED80. The image stabilizer CM40 may be implemented as an optical type.

The memory CM50 may store some or entire data of the image obtained through the image sensor 1000 for next image processing operation. For example, when a plurality of images are obtained at a high speed, obtained original data (Bayer-patterned data, high resolution data, etc.) is stored in the memory CM50, and a low resolution image is only displayed. Then, original data of a selected image (user selection, etc.) may be transferred to the image signal processor CM60. The memory CM50 may be integrated with the memory ED30 of the electronic apparatus ED01, or may include an additional memory that is operated independently.

The image signal processor CM60 may perform image treatment on the image obtained through the image sensor 1000 or the image data stored in the memory CM50. The image treatments may include a depth map generation, a three-dimensional modeling, a panorama generation, extraction of features, an image combination, and/or an image compensation (noise reduction, resolution adjustment, brightness adjustment, blurring, sharpening, softening, etc.). The image signal processor CM60 may perform controlling (exposure time control, read-out timing control, etc.) of the elements (image sensor 1000, etc.) included in the camera module ED80. The image processed by the image signal processor CM60 may be stored again in the memory CM50 for additional process, or may be provided to an external element of the camera module ED80 (e.g., the memory ED30, the display device ED60, the electronic apparatus ED02, the electronic apparatus ED04, the server ED08, etc.). The image signal processor CM60 may be integrated with the processor ED20, or may be configured as an additional processor that is independently operated from the processor ED20. When the image signal processor CM60 is configured as an additional processor separately from the processor ED20, the image processed by the image signal processor CM60 undergoes through an additional image treatment by the processor ED20 and then may be displayed on the display device ED60.

Also, the image signal processor CM60 may receive two focusing signals independently from each of the pixels in the image sensor 1000, and may generate an auto-focusing signal from a difference between the two focusing signals in the phase-detection auto-focusing method. The image signal processor CM60 may control the lens assembly CM10 so that the focus of the lens assembly CM10 may be accurately formed on the surface of the image sensor 1000 based on the auto-focusing signal.

The electronic apparatus ED01 may include a plurality of camera modules ED80 having different properties or functions. In this case, one of the plurality of camera modules ED80 may include a wide-angle camera and another camera module ED80 may include a telephoto camera. Similarly, one of the plurality of camera modules ED80 may include a front camera and another camera module ED80 may include a rear camera.

Figure 21:
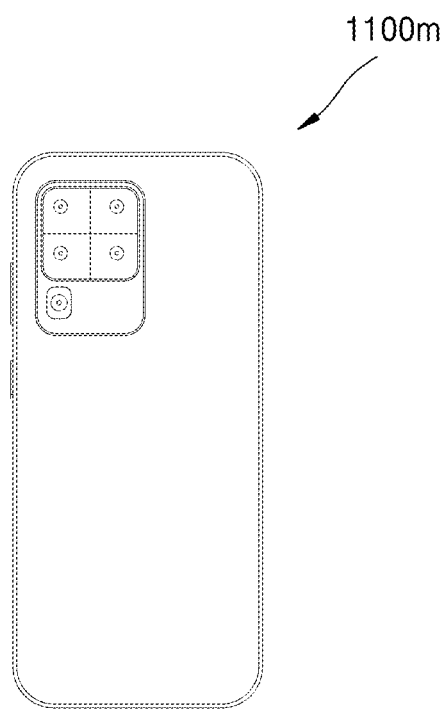
FIGS. 21 to 30 are diagrams showing various examples of an electronic apparatus including an image sensor according to one or more embodiments.
Figure 22:
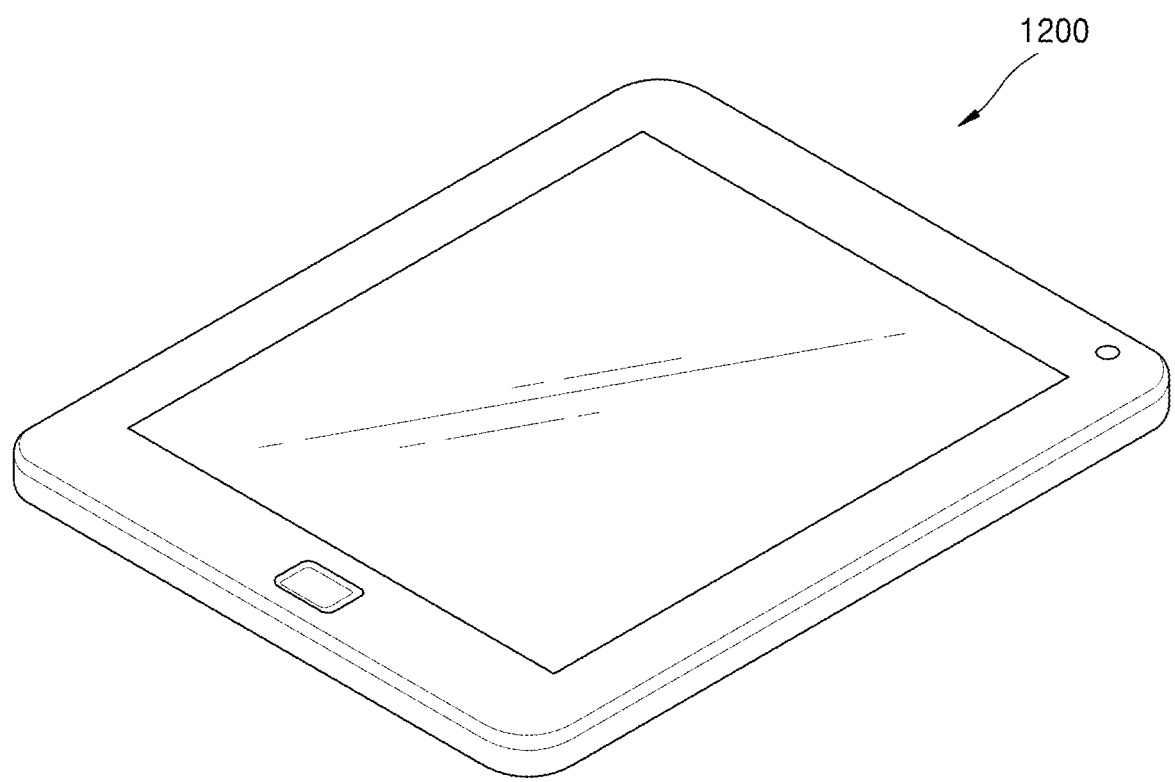
Figure 23:
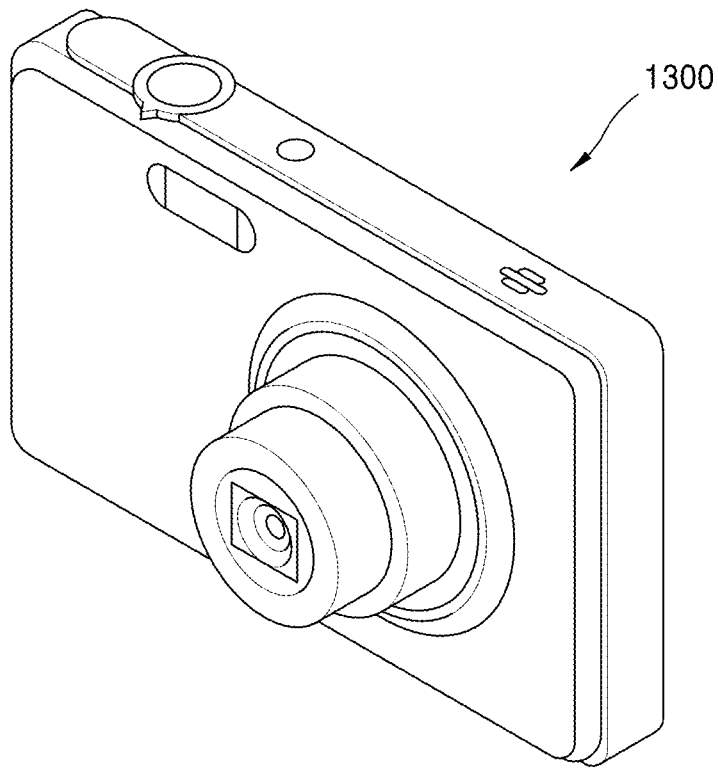
Figure 24:
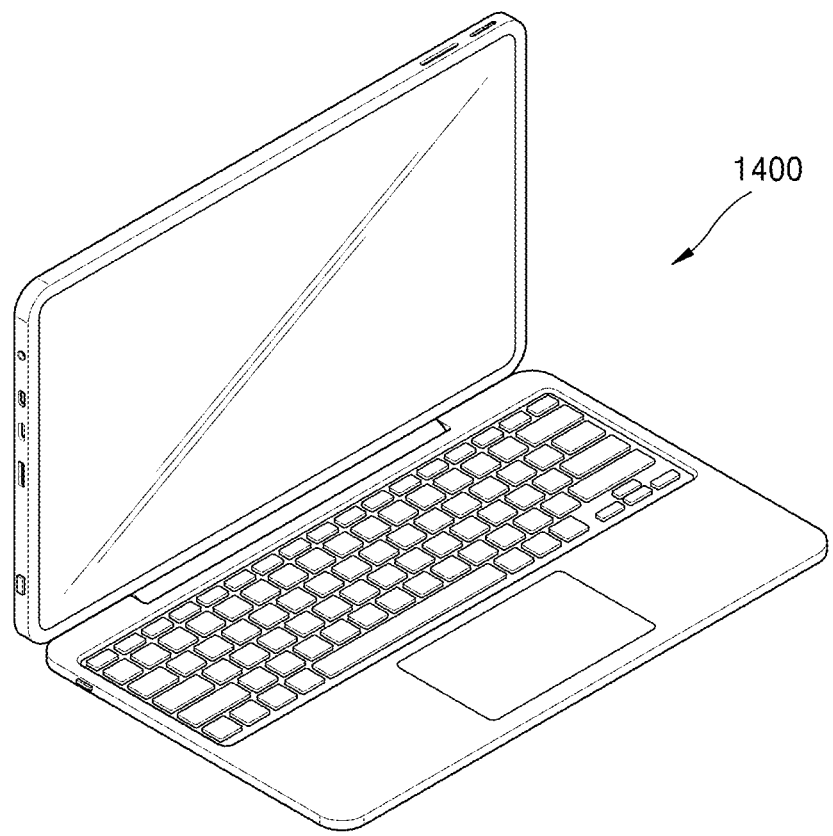
Figure 25:
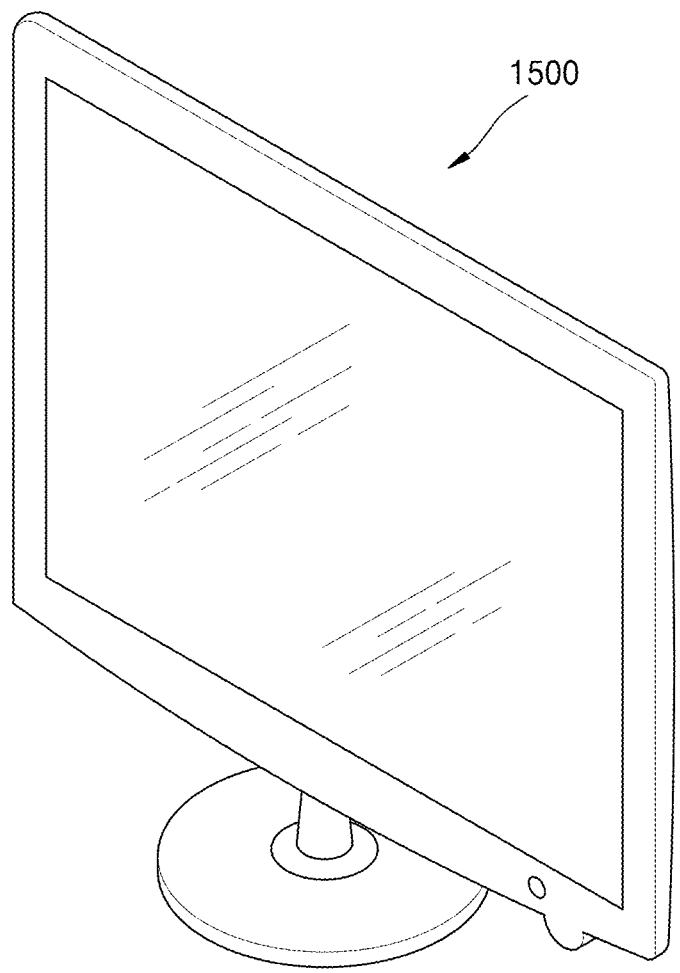

According to example embodiments, the image sensor 1000 may be applied to a mobile phone or a smartphone 1100*m* shown in FIG. 21, a tablet or a smart tablet 1200 shown in FIG. 22, a digital camera or a camcorder 1300 shown in FIG. 23, a laptop computer 1400 shown in FIG. 24, or a television or a smart television 1500 shown in FIG. 25. For example, the smartphone 1100*m*, the smart tablet 1200, the camera or the camcorder 1300, the laptop computer 1400, the television or the smart television 1500 may include a plurality of high-resolution cameras each including a high-resolution image sensor. According to an example embodiment, depth information of objects in an image may be extracted, out focusing of the image may be adjusted, or objects in the image may be automatically identified by using the high-resolution cameras.

Figure 26:
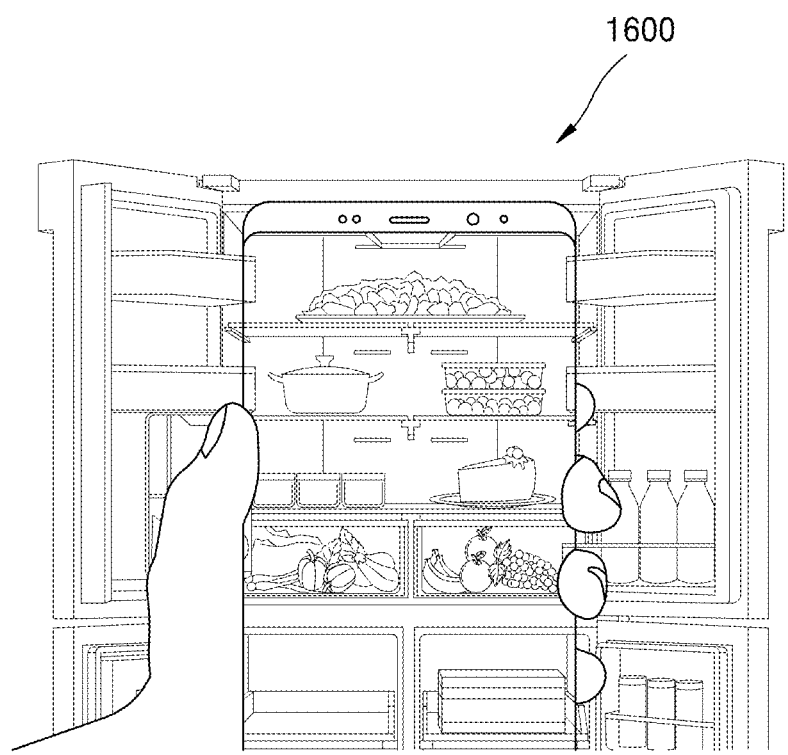
Figure 27:
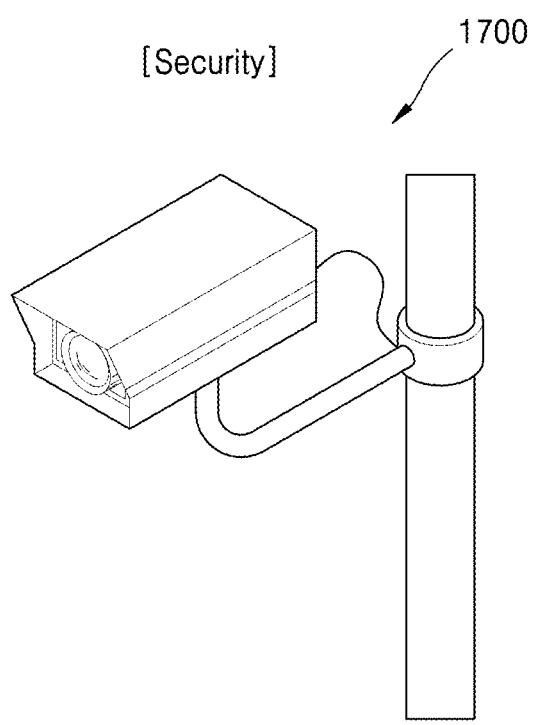
Figure 28:
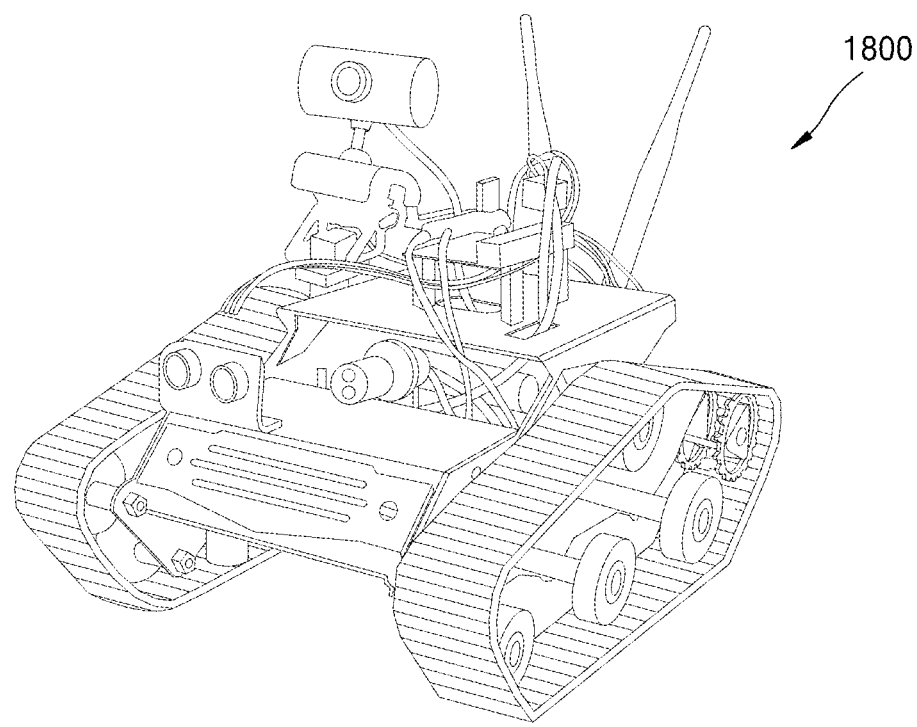
Figure 29:
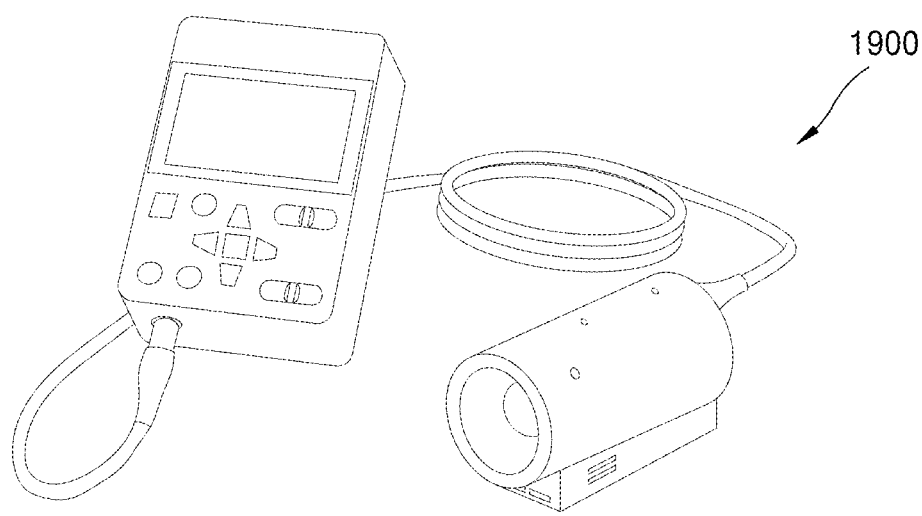

Also, according to example embodiments, the image sensor 1000 may be applied to a smart refrigerator 1600 shown in FIG. 26, a surveillance (or security) camera 1700 shown in FIG. 27, a robot 1800 shown in FIG. 28, a medical camera 1900 shown in FIG. 29, etc. For example, the smart refrigerator 1600 may automatically recognize food in the refrigerator by using the image sensor, and may notify the user of an existence of a certain kind of food, kinds of food put into or taken out, etc. through a smartphone. Also, the surveillance camera 1700 may provide an ultra-high-resolution image and may allow the user to recognize an object or a person in the image even in dark environment by using high sensitivity. The robot 1900 may be input to a disaster or industrial site that a person may not directly access, to provide the user with high-resolution images. The medical camera 1900 may provide high-resolution images for diagnosis or surgery, and may dynamically adjust a field of view.

Figure 30:
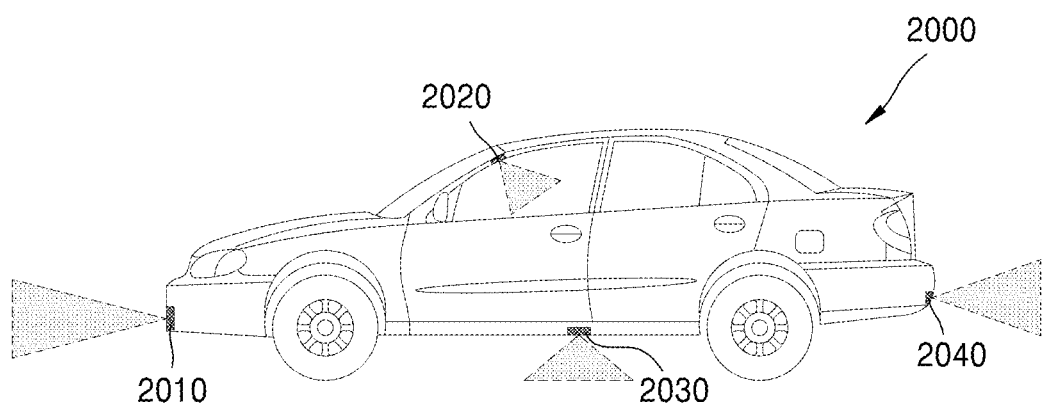

Also, according to example embodiments, the image sensor 1000 may be applied to a vehicle 2000 as shown in FIG. 30. The vehicle 2000 may include a plurality of vehicle cameras 2010, 2020, 2030, and 2040 at various locations. Each of the vehicle cameras 2010, 2020, 2030, and 2040 may include the image sensor. The vehicle 2000 may provide a driver with various information about the interior of the vehicle 2000 or the periphery of the vehicle 2000 by using the plurality of vehicle cameras 2010, 2020, 2030, and 2040, and may provide the driver with the information necessary for the autonomous travel by automatically recognizing an object or a person in the image.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An image sensor comprising:
a sensor substrate including a plurality of first pixels configured to sense light of a first wavelength, a plurality of second pixels configured to sense light of a second wavelength that is different from the first wavelength, a plurality of third pixels configured to sense light of a third wavelength that is different from the first wavelength and the second wavelength, and a plurality of fourth pixels configured to sense the light of the first wavelength; and
a color separating lens array configured to:
condense the light of the first wavelength onto each of the first pixel and each of the fourth pixels by changing a phase of the light of the first wavelength,
condense the light of the second wavelength onto each of the second pixels by changing a phase of the light of the second wavelength, and
condense the light of the third wavelength onto each of the third pixels by changing a phase of the light of the third wavelength,
wherein each of the first pixels includes a first focusing signal region configured to generate a first focusing signal and a second focusing signal region configured to generate a second focusing signal, wherein the first focusing signal region and the second focusing signal region independently generate the first focusing signal and the second focusing signal, and the first focusing signal region and the second focusing signal region are arranged to be adjacent to each other in the first pixel in a first direction, and
each of the fourth pixels includes a third focusing signal region configured to generate a third focusing signal and a fourth focusing signal region configured to generate a fourth focusing signal, wherein the third focusing signal region and the fourth focusing signal region independently generate the third focusing signal and the fourth focusing signal, and the third focusing signal region and the fourth focusing signal region are arranged to be adjacent to each other in the fourth pixel in a second direction that is different from the first direction.

2. The image sensor of claim 1, wherein the sensor substrate includes a plurality of unit patterns, and in each of the unit patterns, the first pixels and the fourth pixels are arranged in a first diagonal direction and the second pixels and the third pixels are arranged in a second diagonal direction that is different from the first diagonal direction.

3. The image sensor of claim 1, wherein each of the first pixels includes a first photosensitive cell and a second photosensitive cell that are configured to independently sense light, and the first photosensitive cell and the second photosensitive cell are arranged to divide each of the first pixels into two in the second direction, and
wherein the first focusing signal of the first focusing signal region is an output from the first photosensitive cell and the second focusing signal of the second focusing signal region is an output from the second photosensitive cell.

4. The image sensor of claim 3, wherein each of the fourth pixels includes a third photosensitive cell and a fourth photosensitive cell that are configured to independently sense light, and the third photosensitive cell and the fourth photosensitive cell are arranged to divide each of the fourth pixels into two in the first direction, and
wherein the third focusing signal of the third focusing signal region is an output from the third photosensitive cell and the fourth focusing signal of the fourth focusing signal region is an output from the fourth photosensitive cell.

5. The image sensor of claim 1, wherein each of the first pixels includes a first photosensitive cell, a second photosensitive cell, a third photosensitive cell, and a fourth photosensitive cell that are configured to independently sense light, and the first photosensitive cell, the second photosensitive cell, the third photosensitive cell and fourth photosensitive cell are respectively arranged in quadrants into which the first pixel is divided in a 2×2 array, and
wherein the first focusing signal of the first focusing signal region is a sum of an output from the first photosensitive cell and an output from the third photosensitive cell, and wherein the second focusing signal of the second focusing signal region is a sum of an output from the second photosensitive cell and an output from the fourth photosensitive cell.

6. The image sensor of claim 5, wherein each of the fourth pixels includes a fifth photosensitive cell, a sixth photosensitive cell, a seventh photosensitive cell, and an eighth photosensitive cell that are configured to independently sense light, and the fifth photosensitive cell, the sixth photosensitive cell, the seventh photosensitive cell and the eighth photosensitive cell are respectively arranged in quadrants into which the fourth pixel is divided in a 2×2 array, and wherein the third focusing signal of the third focusing signal region is a sum of an output from the fifth photosensitive cell and an output from the sixth photosensitive cell, and the fourth focusing signal of the fourth focusing signal region is a sum of an output from the seventh photosensitive cell and an output from the eighth photosensitive cell.

7. The image sensor of claim 1, wherein the sensor substrate further includes a pixel isolation layer that separates separating the first pixels, the second pixels, the third pixels, and the fourth pixels from each other, and
wherein each of the first pixels further includes a first cell isolation layer that separates the first focusing signal region and the second focusing signal region from each other, and each of the fourth pixels further includes a second cell isolation layer that separates the third focusing signal region and the fourth focusing signal region from each other.

8. The image sensor of claim 7, wherein the first cell isolation layer extends in the first pixel in the second direction and the second cell isolation layer extends in the fourth pixel in the first direction.

9. The image sensor of claim 8, wherein, in the first pixels and the fourth pixels located on a center portion of the sensor substrate, the first cell isolation layer is located to pass through a center of the first pixel and the second cell isolation layer is located to pass through a center of the fourth pixel.

10. The image sensor of claim 9, wherein, in a first pixel, among the first pixels, located at a periphery portion of the sensor substrate in the first direction, the first cell isolation layer is shifted in the first direction toward the center portion of the sensor substrate, and in a fourth pixel, among the fourth pixels, located at the periphery portion of the sensor substrate in the second direction, the second cell isolation layer is shifted in the second direction toward the center portion of the sensor substrate.

11. The image sensor of claim 7, wherein each of the first isolation layer and the second cell isolation layer includes a first direction isolation layer extending in the first direction, and a second direction isolation layer extending in the second direction and intersecting with the first direction isolation layer.

12. The image sensor of claim 11, wherein, in the first pixels and the fourth pixels located at the center portion of the sensor substrate, a cross point between the first direction isolation layer and the second direction isolation layer is located at the center of the first pixel or the fourth pixel.

13. The image sensor of claim 12, wherein, in the first pixels and the fourth pixels located at the periphery portion of the sensor substrate in the first direction, a first cross point between the first direction isolation layer and the second direction isolation layer is shifted in the first direction toward the center portion of the sensor substrate, and in the first pixels and the fourth pixels located on a periphery portion of the sensor substrate in the second direction, a second cross point between the first direction isolation layer and the second direction isolation layer is shifted in the second direction toward the center portion of the sensor substrate.

14. The image sensor of claim 7, wherein a height of the first isolation layer and the second cell isolation layer is less than a height of the pixel isolation layer.

15. The image sensor of claim 14, wherein the height of the first and second cell isolation layers is about ¼ to about ½ of the height of the pixel isolation layer.

16. The image sensor of claim 1, wherein each of the second pixels includes a fifth focusing signal region configured to generate fifth focusing signal and a sixth focusing signal region configured to generate sixth focusing signal, wherein the fifth focusing signal region and the sixth focusing signal region independently generate the fifth focusing signal and the sixth focusing signal, and the fifth focusing signal region and the sixth focusing signal region are arranged to be adjacent to each other in a first diagonal direction, and
each of the third pixels includes a seventh focusing signal region configured to generate seventh focusing signal and an eighth focusing signal region configured to generate eighth focusing signal, wherein the seventh focusing signal region and the eighth focusing signal region independently generate the seventh focusing signal and the eighth focusing signal, and the seventh focusing signal region and the eighth focusing signal region are arranged to be adjacent to each other in the first diagonal direction.

17. The image sensor of claim 16, wherein each of the second pixels includes a first photosensitive cell and a second photosensitive cell that are configured to independently sense light, and the first and second photosensitive cells are arranged to divide each of the second pixels into two in the first diagonal direction, and
wherein the fifth focusing signal of the fifth focusing signal region is an output from the first photosensitive cell and the sixth focusing signal of the sixth focusing signal region is an output from the second photosensitive cell.

18. The image sensor of claim 17, wherein each of the third pixels includes a third photosensitive cell and a fourth photosensitive cell that are configured to independently sense light, and the third and fourth photosensitive cells are arranged to divide each of the third pixels into two in the first diagonal direction, and
wherein the seventh focusing signal of the seventh focusing signal region is an output from the third photosensitive cell and the eighth focusing signal of the eighth focusing signal region is an output from the fourth photosensitive cell.

19. The image sensor of claim 16, wherein each of the second pixels includes a first photosensitive cell, a second photosensitive cell, a third photosensitive cell, and a fourth photosensitive cell that are configured to independently sense light, and the first photosensitive cell, the second photosensitive cell, the third photosensitive cell, and the fourth photosensitive cell are respectively arranged in quadrants into which the second pixel is divided in a 2×2 array, and
wherein the fifth focusing signal of the fifth focusing signal region is an output from the second photosensitive cell and the sixth focusing signal of the sixth focusing signal region is an output from the third photosensitive cell, or the fifth focusing signal of the fifth focusing signal region is an output from the first photosensitive cell and the sixth focusing signal of the sixth focusing signal region is an output from the fourth photosensitive cell.

20. The image sensor of claim 19, wherein each of the third pixels includes a fifth photosensitive cell, a sixth photosensitive cell, a seventh photosensitive cell, and an eighth photosensitive cell that are configured to independently sense light, and the fifth photosensitive cell, the sixth photosensitive cell, the seventh photosensitive cell, and the eighth photosensitive cell are respectively arranged in quadrants into which the third pixel is divided in a 2×2 array, and
wherein the seventh focusing signal of the seventh focusing signal region is an output from the sixth photosensitive cell and the eighth focusing signal of the eighth focusing signal region is an output from the seventh photosensitive cell, or the seventh focusing signal of the seventh focusing signal region is an output from the fifth photosensitive cell and the eighth focusing signal of the eighth focusing signal region is an output from the eighth photosensitive cell.

21. The image sensor of claim 16, wherein the sensor substrate further includes a pixel isolation layer that separates the first pixels, the second pixels, the third pixels and the fourth pixels from each other, and
each of the second pixels further includes a third cell isolation layer that separates the fifth focusing signal region and the sixth focusing signal region from each other, and each of the third pixels further includes a fourth cell isolation layer for separating the seventh focusing signal region and the eighth focusing signal region from each other.

22. The image sensor of claim 21, wherein each of the third cell isolation layer and fourth cell isolation layer extend in the first diagonal direction.

23. The image sensor of claim 22, wherein, in the second pixels and the third pixels located on a center portion of the sensor substrate, the third cell isolation layer is located to pass through a center of the second pixel and the fourth cell isolation layer is located to pass through a center of the third pixel.

24. The image sensor of claim 23, wherein, in the second pixels and the third pixels located on the periphery portion of the sensor substrate in a second diagonal direction intersecting with the first diagonal direction, the third cell isolation layer and the fourth cell isolation layer are shifted in the second diagonal direction toward the center portion of the sensor substrate.

25. An electronic apparatus comprising:
an image sensor configured to convert an optical image into an electrical signal;
a processor configured to control operations of the image sensor and to store and output a signal generated by the image sensor; and
a lens assembly for providing light from an object to the image sensor,
wherein the image sensor comprises:
a sensor substrate including a plurality of first pixels configured to sense light of a first wavelength, a plurality of second pixels configured to sense light of a second wavelength that is different from the first wavelength, a plurality of third pixels configured to sense light of a third wavelength that is different from the first wavelength and the second wavelength, and a plurality of fourth pixels configured to sense the light of the first wavelength; and
a color separating lens array configured to:
condense the light of the first wavelength onto each of the first pixel and each of the fourth pixels by changing a phase of the light of the first wavelength,
condense the light of the second wavelength onto each of the second pixels by changing a phase of the light of the second wavelength, and
condense the light of the third wavelength onto each of the third pixels by changing a phase of the light of the third wavelength, wherein each of the first pixels includes a first focusing signal region configured to generate a first focusing signal and a second focusing signal region configured to generate a second focusing signal, wherein the first focusing signal region and the second focusing signal region independently generate the first focusing signal and the second focusing signal, and the first focusing signal region and the second focusing signal region are arranged to be adjacent to each other in the first pixel in a first direction, and
each of the fourth pixels includes a third focusing signal region configured to generate a third focusing signal and a fourth focusing signal region configured to generate a fourth focusing signal, wherein the third focusing signal region and the fourth focusing signal region independently generate the third focusing signal and the fourth focusing signal, and the third focusing signal region and the fourth focusing signal region are arranged to be adjacent to each other in the fourth pixel in a second direction that is different from the first direction.

26. An image sensor comprising:
a sensor substrate including a plurality of first pixels configured to sense light of a first wavelength, a plurality of second pixels configured to sense light of a second wavelength that is different from the first wavelength, a plurality of third pixels configured to sense light of a third wavelength that is different from the first wavelength and the second wavelength, and a plurality of fourth pixels configured to sense the light of the first wavelength; and
a color separating lens array configured to:
direct the light of the first wavelength onto each of the first pixel and each of the fourth pixels by changing a phase of the light of the first wavelength,
direct the light of the second wavelength onto each of the second pixels by changing a phase of the light of the second wavelength, and
direct the light of the third wavelength onto each of the third pixels by changing a phase of the light of the third wavelength,
wherein at least one of the first pixels, the second pixels, the third pixels or the fourth pixels comprises a first focusing signal region configured to generate a first focusing signal and a second focusing signal region configured to generate a second focusing signal.

27. The image sensor according to claim 26, wherein the first focusing signal and the second focusing signal region configured to generate the first focusing signal and the second focusing signal independently of each other.

28. The image sensor according to claim 26, wherein, in the first pixels the first focusing signal region and the second focusing signal region are arranged adjacent to each other in a first direction, and
in the fourth pixels the first focusing signal region and the second focusing signal region are arranged adjacent to each other in a second direction different from the first direction.

29. The image sensor according to claim 28, wherein,
in the second pixels or the third pixels, the first focusing signal region and the second focusing signal region are arranged adjacent to each other in a third direction different from the first direction and the second direction.

30. The image sensor according to claim 28, wherein, the first direction is perpendicular to the second direction.

31. An image sensor comprising:
a sensor substrate including a plurality of first pixels configured to sense light of a first wavelength, a plurality of second pixels configured to sense light of a second wavelength that is different from the first wavelength, a plurality of third pixels configured to sense light of a third wavelength that is different from the first wavelength and the second wavelength, and a plurality of fourth pixels configured to sense the light of the first wavelength; and
a color separating lens array including a plurality of first pixel corresponding regions corresponding to the plurality of first pixels, a plurality of second pixel corresponding regions corresponding to the plurality of second pixels, a plurality of third pixel regions corresponding to the plurality of third pixels, and a plurality of fourth pixel corresponding regions corresponding to the plurality of fourth pixels,
wherein the plurality of first pixel corresponding regions and the plurality of fourth pixel regions include a plurality of nanoposts, an arrangement of the plurality of nanoposts in the plurality of first pixel corresponding regions being rotated by 90° with respect to an arrangement of the plurality of nanoposts in the plurality of fourth pixel corresponding regions,
each of the first pixels includes a first focusing signal region and a second focusing signal region that generate focusing signals independently from each other, and the first focusing signal region and the second focusing signal region are arranged to be adjacent to each other in a first direction in the first pixel, and
each of the fourth pixels includes a third focusing signal region and a fourth focusing signal region that generate focusing signals independently from each other, and the third focusing signal region and the fourth focusing signal region are arranged to be adjacent to each other in a second direction that is perpendicular to the first direction in the fourth pixel.

* * * * *